(12) United States Patent
Cullinan et al.

(10) Patent No.: US 10,722,947 B2
(45) Date of Patent: Jul. 28, 2020

(54) MICRO-SELECTIVE SINTERING LASER SYSTEMS AND METHODS THEREOF

(71) Applicant: Board of Regents, The University of Texas System, Austin, TX (US)

(72) Inventors: Michael A. Cullinan, Austin, TX (US); Nilabh Kumar Roy, Austin, TX (US); Anil Yuksel, Austin, TX (US); Chee Seng Foong, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 564 days.

(21) Appl. No.: 15/475,794

(22) Filed: Mar. 31, 2017

(65) Prior Publication Data

US 2018/0065186 A1    Mar. 8, 2018

Related U.S. Application Data

(60) Provisional application No. 62/316,644, filed on Apr. 1, 2016, provisional application No. 62/316,666, filed
(Continued)

(51) Int. Cl.
*B22F 7/02* (2006.01)
*B22F 3/105* (2006.01)
(Continued)

(52) U.S. Cl.
CPC .............. *B22F 7/02* (2013.01); *B22F 3/1055* (2013.01); *B23K 1/0008* (2013.01); *B33Y 10/00* (2014.12);
(Continued)

(58) Field of Classification Search
CPC ........ B22F 7/02; B22F 3/1055; B22F 1/0044; B22F 2003/1056; B22F 2003/1059;
(Continued)

(56) References Cited

U.S. PATENT DOCUMENTS

| | | | |
|---|---|---|---|
| 4,863,538 A | * | 9/1989 | Deckard ................ B33Y 10/00 264/497 |
| 4,938,816 A | | 7/1990 | Beaman et al. |

(Continued)

OTHER PUBLICATIONS

DLP5500 OLP 0.55 XGA Series 450 DMD, Texas Instruments, 2015, from IDS (Year: 2015).*
(Continued)

*Primary Examiner* — Jessee R Roe
*Assistant Examiner* — Rebecca Janssen
(74) *Attorney, Agent, or Firm* — Meunier Carlin & Curfman LLC

(57) ABSTRACT

A microscale selective laser sintering (μ-SLS) that improves the minimum feature-size resolution of metal additively manufactured parts by up to two orders of magnitude, while still maintaining the throughput of traditional additive manufacturing processes. The microscale selective laser sintering includes, in some embodiments, ultra-fast lasers, a micromirror based optical system, nanoscale powders, and a precision spreader mechanism. The micro-SLS system is capable of achieving build rates of at least 1 $cm^3$/hr while achieving a feature-size resolution of approximately 1 μm. In some embodiments, the exemplified systems and methods facilitate a direct write, microscale selective laser sintering μ-SLS system that is configured to write 3D metal structures having features sizes down to approximately 1 μm scale on rigid or flexible substrates. The exemplified systems and methods may operate on a variety of material including, for example, polymers, dielectrics, semiconductors, and metals.

31 Claims, 40 Drawing Sheets

Related U.S. Application Data on Apr. 1, 2016, provisional application No. 62/454,456, filed on Feb. 3, 2017.

(51) Int. Cl.

| | |
|---|---|
| *B33Y 10/00* | (2015.01) |
| *B33Y 30/00* | (2015.01) |
| *B33Y 80/00* | (2015.01) |
| *B33Y 50/02* | (2015.01) |
| *B33Y 70/00* | (2020.01) |
| *G06F 30/23* | (2020.01) |
| *B23K 1/00* | (2006.01) |
| *H01L 21/48* | (2006.01) |
| *H01L 21/56* | (2006.01) |
| *H01L 21/67* | (2006.01) |
| *H01L 23/31* | (2006.01) |
| *H01L 23/498* | (2006.01) |
| *H01L 23/00* | (2006.01) |
| *B23K 101/36* | (2006.01) |
| *B22F 1/00* | (2006.01) |
| *H01L 21/683* | (2006.01) |
| *H01L 23/544* | (2006.01) |

(52) U.S. Cl.
CPC ............... *B33Y 30/00* (2014.12); *B33Y 50/02* (2014.12); *B33Y 70/00* (2014.12); *B33Y 80/00* (2014.12); *G06F 30/23* (2020.01); *H01L 21/4853* (2013.01); *H01L 21/4857* (2013.01); *H01L 21/563* (2013.01); *H01L 21/565* (2013.01); *H01L 21/67115* (2013.01); *H01L 23/3135* (2013.01); *H01L 23/4985* (2013.01); *H01L 24/81* (2013.01); *H01L 24/83* (2013.01); *H01L 24/92* (2013.01); *B22F 1/0044* (2013.01); *B22F 2003/1056* (2013.01); *B22F 2003/1057* (2013.01); *B22F 2003/1059* (2013.01); *B22F 2999/00* (2013.01); *B23K 2101/36* (2018.08); *H01L 21/67144* (2013.01); *H01L 21/6838* (2013.01); *H01L 23/544* (2013.01); *H01L 24/75* (2013.01); *H01L 2223/54426* (2013.01); *H01L 2224/7501* (2013.01); *H01L 2224/75101* (2013.01); *H01L 2224/75261* (2013.01); *H01L 2224/75901* (2013.01); *H01L 2224/81007* (2013.01); *H01L 2224/81054* (2013.01); *H01L 2224/81132* (2013.01); *H01L 2224/81192* (2013.01); *H01L 2224/81224* (2013.01); *H01L 2224/81815* (2013.01); *H01L 2224/81908* (2013.01); *H01L 2224/83007* (2013.01); *H01L 2224/83054* (2013.01); *H01L 2224/83132* (2013.01); *H01L 2224/83224* (2013.01); *H01L 2224/83908* (2013.01); *H01L 2224/83939* (2013.01); *H01L 2224/9211* (2013.01); *Y02P 10/295* (2015.11)

(58) Field of Classification Search
CPC ......... B22F 2003/1057; B22F 2999/00; B33Y 30/00; B33Y 80/00; B33Y 10/00; B33Y 50/02; B33Y 70/00; B23K 1/0008; B23K 2101/36; H01L 21/4853; H01L 21/4857; H01L 21/563; H01L 21/565; H01L 21/67115; H01L 23/3135; H01L 23/4985; H01L 24/81; H01L 24/83; H01L 24/92; H01L 21/67144; H01L 21/6838; H01L 23/544; H01L 24/75; H01L 2223/54426; H01L 2224/7501; H01L 2224/75101; H01L 2224/75261; H01L 2224/75901; H01L 2224/81007; H01L 2224/81054; H01L 2224/81132; H01L 2224/81192; H01L 2224/81224; H01L 2224/81815; H01L 2224/81908; H01L 2224/83007; H01L 2224/83054; H01L 2224/83132; H01L 2224/83224; H01L 2224/83908; H01L 2224/83939; H01L 2224/9211; G06F 17/5018; Y02P 10/29–295; B29C 64/00–295

See application file for complete search history.

(56) References Cited

U.S. PATENT DOCUMENTS

| | | | |
|---|---|---|---|
| 7,079,915 B2 | 7/2006 | Huang et al. | |
| 7,158,849 B2 | 1/2007 | Huang et al. | |
| 7,785,093 B2 | 8/2010 | Holmboe et al. | |
| 8,845,316 B2 | 9/2014 | Schillen et al. | |
| 8,996,155 B2 | 3/2015 | Hiller et al. | |
| 9,067,359 B2 | 6/2015 | Rohner et al. | |
| 2007/0178232 A1* | 8/2007 | Kodas | H05K 3/046 427/180 |
| 2008/0167831 A1* | 7/2008 | Pouet | G01B 9/02083 702/97 |
| 2010/0159398 A1* | 6/2010 | Rock | G03F 7/095 430/322 |
| 2013/0258636 A1* | 10/2013 | Rettke | H01L 25/0753 362/84 |
| 2017/0218228 A1* | 8/2017 | Jose | C09D 11/03 |
| 2018/0244034 A1* | 8/2018 | Sutcliffe | B33Y 10/00 |

OTHER PUBLICATIONS

Jordan, S. C. et al., Design Considerations for Micro- and Nanopositioning: Leveraging the Latest for Biophysical Applications, 10 Current Pharmaceutical Biotechnology, 515-521 (2009) (Year: 2009).*
DLP5500 DLP 0.55 XGA Series 450 DMD, Texas Instruments, 2015, 46 pages.
Talon-532-20, Spectra Physics, 2015, 5 pages.
DLi CEL5500 Compact Embeddable Light Engine, Digital Light Innovations, Austin, TX, 2015.
U-780 Datasheet, PILine XY Stage System with Controller and Joystick, 2016, 6 pages.
Dave, et al., "Deagglomeration and Mixing of Nanoparticles", NSF Nanoscale Science and Engineering Grantees Conference, 2006, 4-6.
Ebert, et al., "Process assembly for μm-scale SLS, reaction sintering, and CVD", Fourth International Symposium on laser Precision Microfabrication. 2003. International Society for Optics and Photonics. 2003, 6 pages.
Exner, et al., "Selective laser micro sintering with a novel process", Fourth International Symposium on Laser Precision Microfabrication. 2003. International Society for Optics and Photonics. SPIE 5063, 7 pages.
Frazier, "Metal additive manufacturing: A review", J. Mater. Eng. Perform. 2014, 1917-1928.
Gibson, et al., "Material properties and fabrication parameters in selective laser sintering process", Rapid Prototyping Journal 3(4), 1997, 129-136.
Gu, et al., "Ultra-strong architected Cu meso-lattices", Extrem. Mech. Lett. 2, 2015, 7-14.
Jang, "Sintering of inkjet printed copper nanoparticles for flexible electronics", Scripta Materialia, 62(5), 2010, 258-261.
Kim, et al., "Intense pulsed light sintering of copper nanoink for printed electronics", Applied Physics A 97(4), 2009, 791-798.
Kumar, et al., "Simulations and Modeling of Unequal Sized Particles Sintering", University of Utah, 2011, 175 pages.
Moon, et al., "Thermal behavior of silver nanoparticles for low-temperature interconnect applications", J. Electron. Mater. 34(2), 2005, 168-175.
Olakanmi, et al., "A review on selective laser sintering/melting (SLS/SLM) of aluminum alloy powders: Processing, microstructure, and properties", Prog. Mater. Sci. 74, 2015, 401-477.

(56) References Cited

OTHER PUBLICATIONS

Regenfuss, et al., "Microparts by a novel modification of selective laser sintering", 2003, 7 pages.

Roy, et al., "μ-SLS of Metals: Design of the powder spreader, powder bed actuators and optics for the system", Solid Freeform Fabrication Conference, 2015, 134-155.

Roy, et al., "μ-SLS of Metals: Physical and thermal characterization of Cu-nanopowders", Solid Freeform Fabrication Conference, 2015, 772-788.

Streek, et al., "Laser micro sintering—a quality leap through improvement of powder packing", in The Proceedings of the 19th Annual SFF Symposium, 2008, 12 pages.

Theodorakos, et al., "elective laser sintering of Ag nanoparticles ink for applications in flexible electronics", Applied Surface Science 336, 2015, 157-162.

Yuan, et al., "Thermal Conductivity Measurments of Polyamide 12", Lab. Free. Fabr. 1, 2011, 427-437.

Zenou, et al., "Laser sintering of copper nanoparticles", Journal of Physics D: Applied Physics, 47(2), 2014, p. 025501.

Sun, et al., "van der Waals interaction-tuned heat transfer in nanostructures", Nanoscale, 2013, 5, 128-133.

Ivanova, et al., "Additive manufacturing (AM) and nanotechnology: promises and challenges". Rapid Prototyping Journal, 2013, 19(5): 353-364.

Samitsu, A study of silicon-wafer surface evaluation using atomic force microscopy, Nanotechnology 4, 1993, 236-241.

Mo, et al., "Friction laws at the nanoscale". Nature, 457, 2009, 1116-1119.

Sun, "Interaction forces between a spherical nanoparticle and a flat surface", Phys. Chem. Chem. Phys., 2014,16, 5846-5854.

Li, et al., "London-van der Waals adhesiveness of rough particles," Powder Technology 161, 2006, 248-255.

Katainen, et al., "Adhesion as an Interplay Between Particle Size and Surface Roughness", Journal of Colloid and Interface Science 304, 2006, 524-529.

Ma, et al., "Effect of particle size distribution on sintering of agglomerate-free submicron alumina powder compacts". J Eur Ceram Soc. 2002, 22(13):2197-2208.

Garg, et al., "Documentation of open-source MFIX-DEM software for gas-solids flows", 2012, 40 pages.

Hertz Uber die beruhrung fester elastischer korper, (on the contact of elastic solids). J reine und angewandte Mathematik 1882; 94:156-71.

Leonardo, et al., "Granular flow down an inclined plane: Bagnold scaling and rheology", Phys. Rev. E 64, 2001,051302.

Zhang, et al., "Multilayer Laser Sintering of HAp/Ti Nanoparticles Onto Metallic Implants", Proceedings of the ASME 2009 International Manufacturing Science and Engineering Conference MSEC2009, Oct. 4-7, 2009, West Lafayette, Indiana, USA, Paper No. MSEC2009-84089, pp. 787-798; 13 pages.

Zhang, et al., Nanoscale Size Dependence on Metallic Nanoparticles: Case Study of Titanium Nanoparticles on Pulsed Laser Sintering of Hydroxyapatite/Titanium Nanoparticles, Proceedings of the ASME 2011 International Manufacturing Science and Engineering Conference MSEC2011 Jun. 13-17, 2011, Corvallis, Oregon, USA. ACS Appl. Mater. Interfaces, 2011, 3 (2), pp. 339-350.

An, et al., "Selective Sintering of Metal Nanoparticle Ink for Maskless Fabrication of an Electrode Micropattern Using a Spatially Modulated Laser Beam by a Digital Micromirror Device", ACS Appl. Mater. Interfaces, 2014, 6 (4), pp. 2786-2790.

Castro, et al., Surface Plasmon Resonance of a Few Particles Linear Arrays, Journal of Electromagnetic Analysis and Applications, 2011, 3, 458-464.

Wunscher, et al., "Simulation and prediction of the thermal sintering behavior for a silver nanoparticle ink based on experimental input", J. Mater. Chem. C, 2014, 2, 6342.

Le Harzic, et al., "Comparison of heat-affected zones due to nanosecond and femtosecond laser pulses using transmission electronic microscopy" Appl. Phys. Lett. 80, 2002, 3886-3888.

Kähler, et al., "Pick-and-place silver sintering die attach of small-area chips," IEEE Trans. Components, Packag. Manuf. Technol., vol. 2, No. 2, pp. 199-207, 2012.

Zhang, et al., "Autonomous robotic pick-and-place of microobjects," IEEE Trans. Robot. vol. 26, No. 1, pp. 200-207,2010.

\* cited by examiner

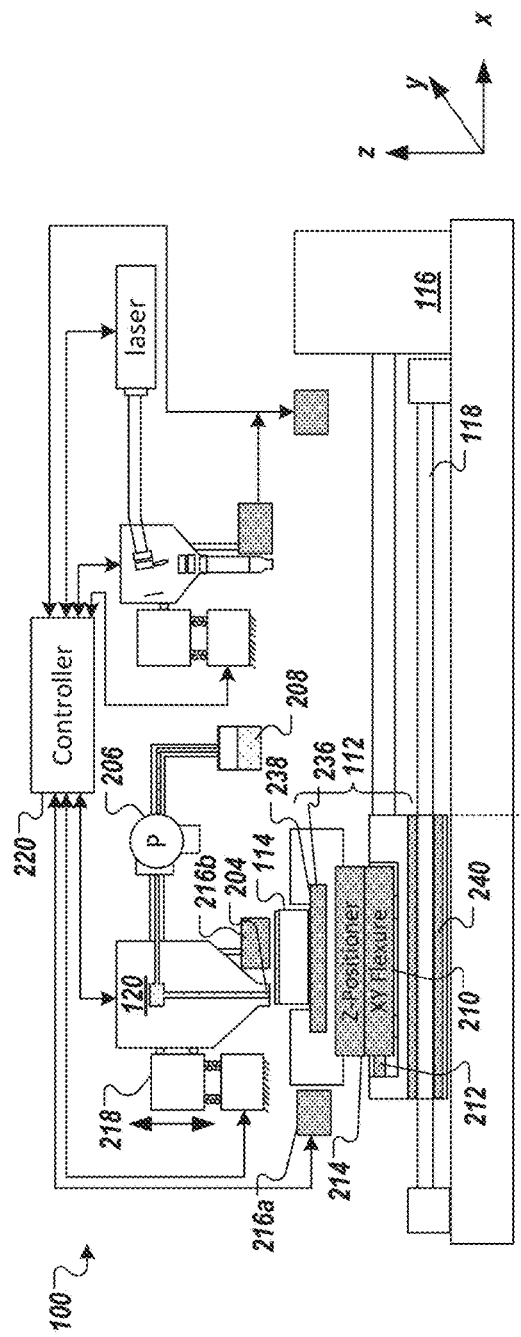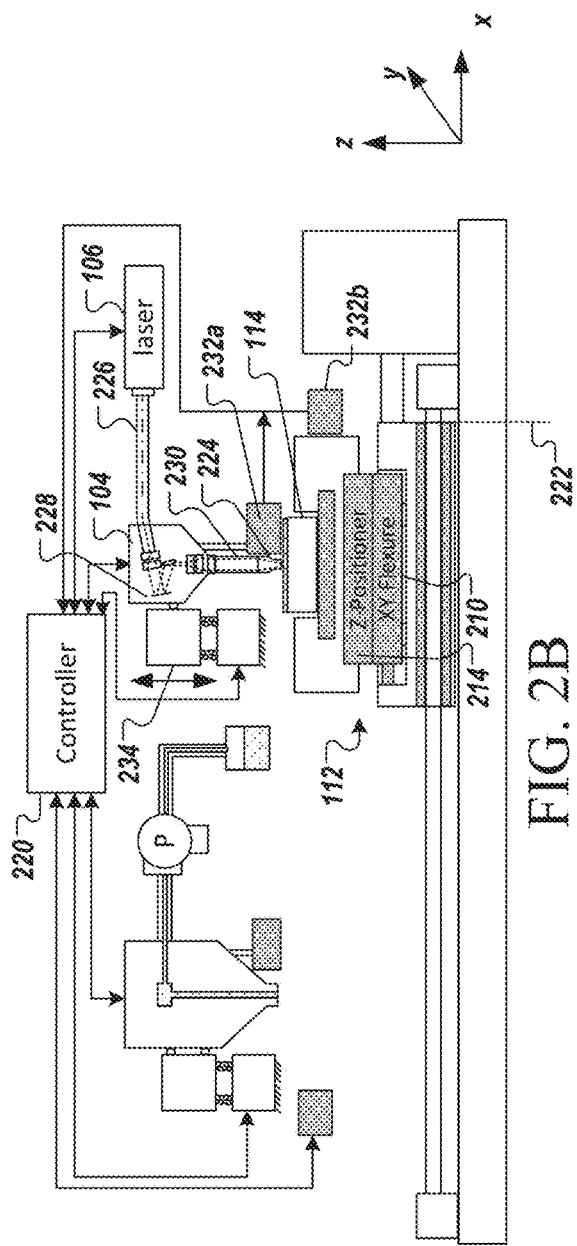
FIG. 2A
FIG. 2B

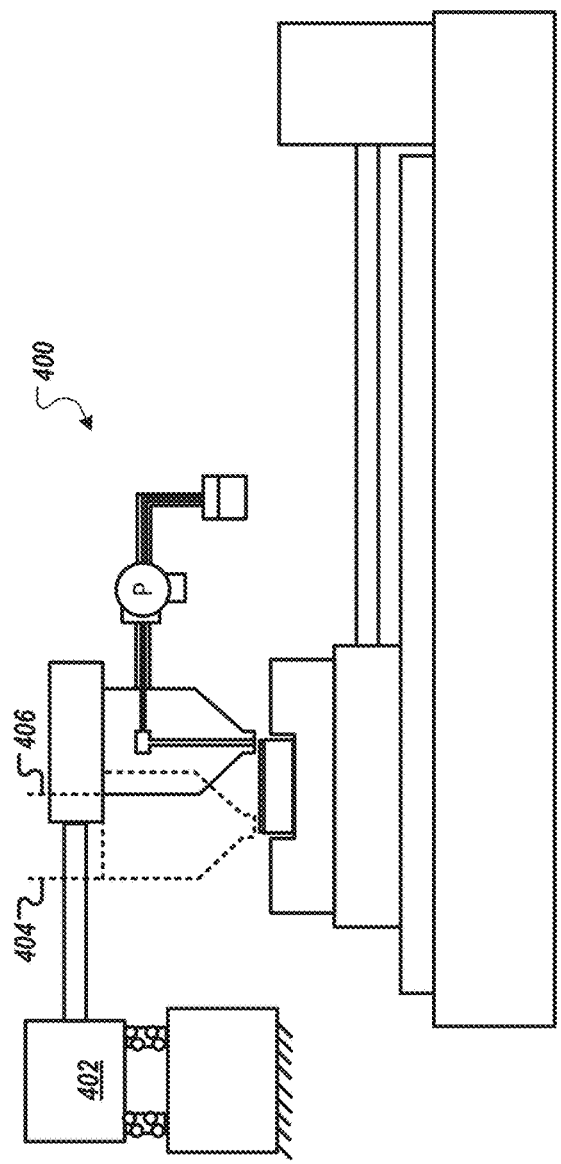
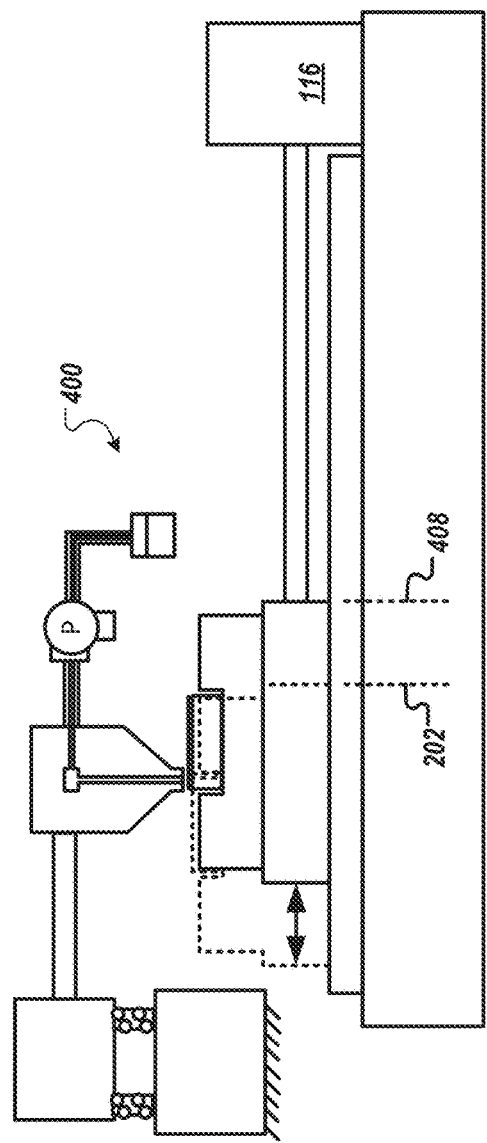
FIG. 4A
FIG. 4B

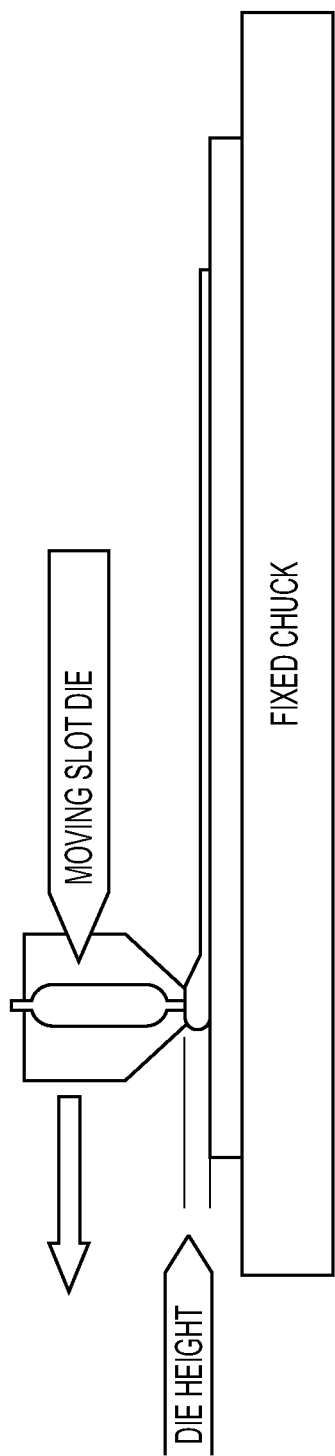
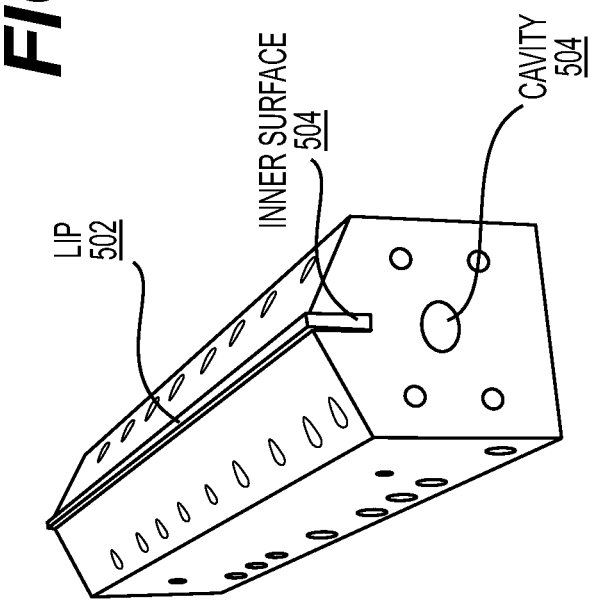
FIG. 5A
FIG. 5B
FIG. 5C

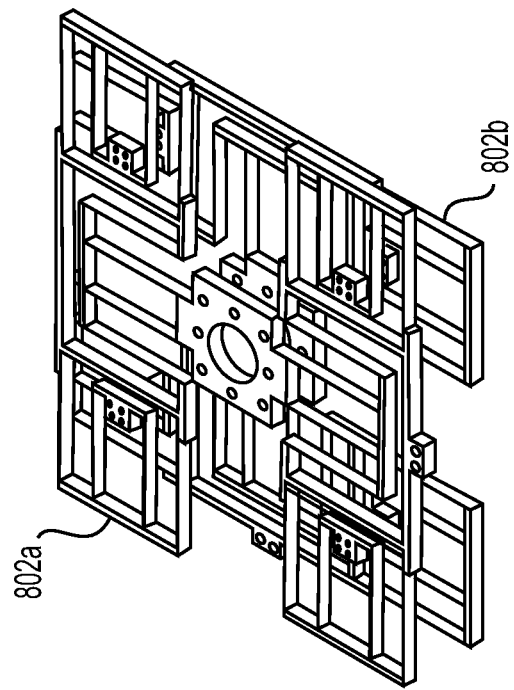
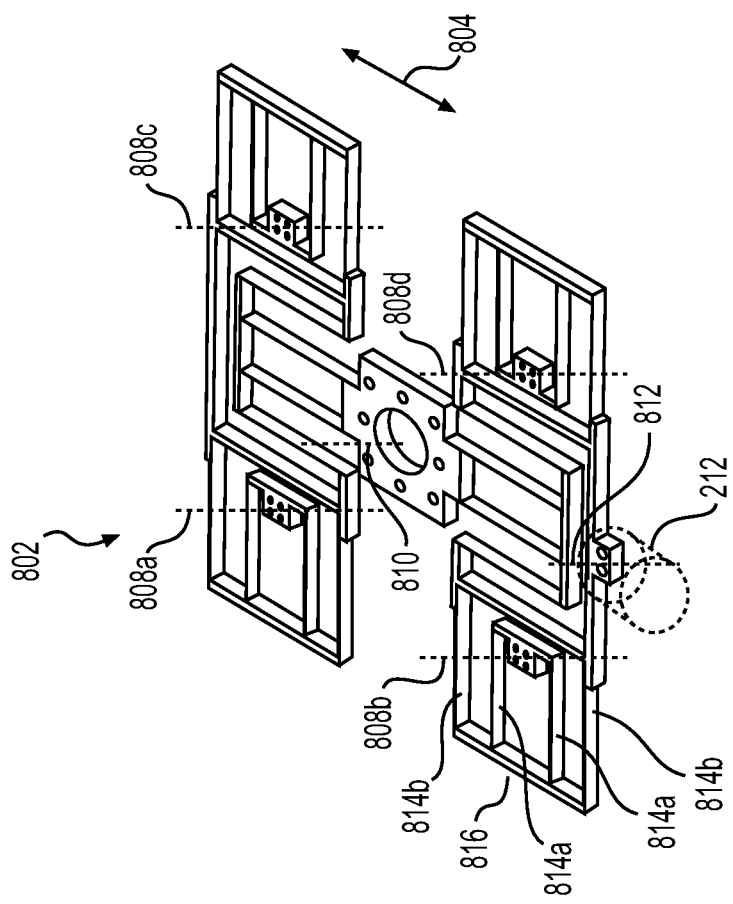
FIG. 8B
FIG. 8A

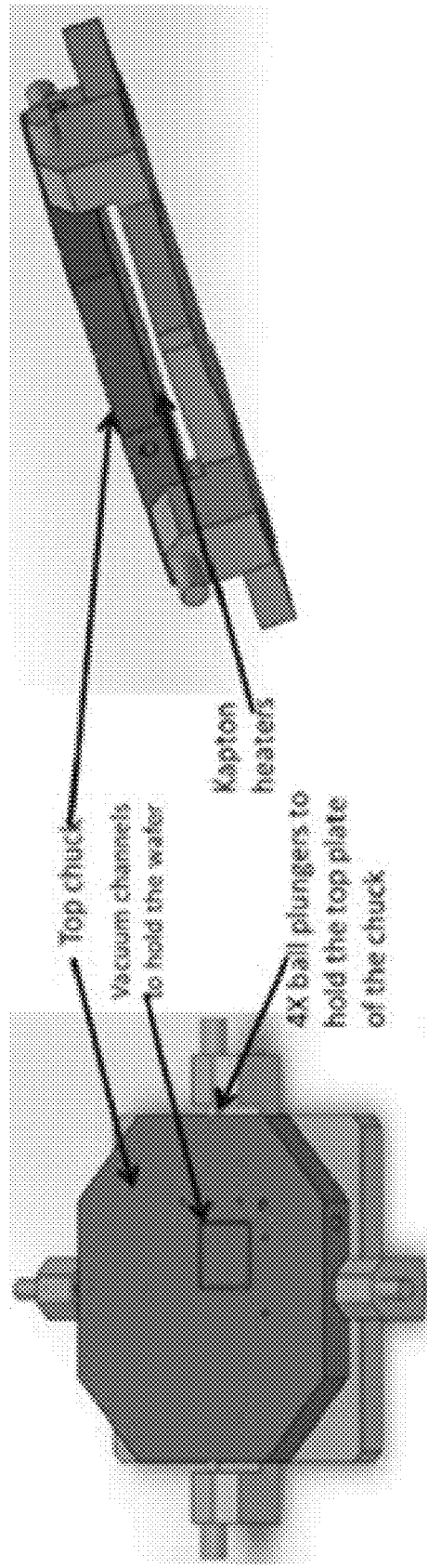

MICRO-SELECTIVE SINTERING LASER SYSTEMS AND METHODS THEREOF

RELATED APPLICATIONS

This application claims priority to, and the benefit of, U.S. Provisional Appl. No. 62/316,644, filed Apr. 1, 2016, title "Micro-Selective Sintering Laser System and Method Thereof"; U.S. Provisional Appl. No. 62/316,666, filed Apr. 1, 2016, title "Modeling of Nanoparticle Agglomeration and Powder Bed Formation in Microscale Laster Sintering Systems"; and U.S. Provisional Appl. No. 62/454,456, filed Feb. 3, 2017, title "Micro-selective Sintering Laser on Flexible Substrates and With Multi-Material Capabilities," each of which is incorporated by reference herein in its entirety.

BACKGROUND

Micro- and nano-scale additive manufacturing methods in metals, plastics, and ceramics have many applications in the aerospace, medical device, and electronics industries. For example, the fabrication of additively-manufactured parts with micron-scale resolutions makes possible the production of cellular materials with controlled microstructures. Such materials can exhibit very high strength-to-weight ratios, which is critical for a number of applications in the aerospace industry. Similarly, the medical industry could benefit from the additive manufacturing of metal parts with controlled microstructures, since this process could be used to fabricate custom implants with enhanced surface structures to either promote or prevent the adhesion of cells to the implant in specific areas. Similarly, controlled microstructures may be used in a number of microelectronic packaging applications.

Selective laser micro-sintering (or micro-selective laser sintering "μ-SLS" or "micro-SLS") is an additive manufacturing technology that uses a high power laser to manufacture a three-dimensional component (e.g., a part), under condition of vacuum or reduced shield gas pressure, in a layer-by-layer fashion from a powder (e.g., plastic, metal, polymer, ceramic, composite materials, etc.). That is, powders are spread onto a powder bed and a laser beam is scanned across the powder bed to sinter together the powders at the scanned locations; a new layer of powder is then spread onto the bed over the sintered layer and the process is repeated to build a three-dimensional part.

One class of commercially available metal additive manufacturing tools has feature-size resolutions up to 100 μm (micrometers). In many applications, e.g., microelectronic packaging, among others, these feature-size resolutions are too coarse to precisely control microstructures of parts desired to be produced. Existing research-based systems for metal additive manufacturing may fabricate finer resolutions features, but have low through-put that are not yet viable for commercial use.

To manufacture parts with smaller feature-sizes, manufacturing via smaller particles, at the nanoscale, such as with nanoparticles are employed. Because of their size, agglomeration of nanoparticles (e.g., nanoparticle powder) can form, which can lead to the formation of defects in the final produced part. In addition to agglomeration, at the sub-micron (μm) level, the interaction between nanoparticles (e.g., nanoparticle powder) under high power laser heating raises additional near-field thermal issues such as thermal diffusivity, effective absorptivity, and extinction coefficients as compared to larger scales processes.

Flexible electronics may include the integration of a diverse set of high quality, silicon-based electrical components including CMOS integrated circuit (IC) chips (i.e. microprocessors, memory, etc.), radio frequency (RF) devices, power management subsystems, passive components, biochips, sensors, actuators, and microelectromechanical systems (MEMS) onto a single flexible substrate. The integration of such complex devices onto flexible substrates of requires high input/output (I/O) pin counts of these devices that can carry the high quality analog signals required by many of these components.

Currently there are several methods available for the direct write of microscale features. One type of methods (e.g., Vat photo-polymerization) generally operates only using polymeric materials. Another type of method (e.g., material jetting) is commonly used in the fabrication of 2D printed electronic structures.

Therefore, what are needed are devices, systems and methods that overcome challenges in the present art, some of which are described above.

SUMMARY

The present disclosure provides an exemplified microscale selective laser sintering (μ-SLS or micro-SLS) systems and methods that facilitate improved minimum feature-size resolution of metal additively manufactured parts by up to two orders of magnitude as compared to conventional additive manufacturing processes, while beneficially maintaining the throughput similar to those of such conventional processes. In some embodiments, the micro-SLS system is capable of providing build rates of approximately 1 $cm^3$/hr with feature-size resolutions up to approximately 1 μm. The micro-SLS system comprises a high-throughput optical system having one or more micro-mirror arrays to direct pulses of high-power ultra-fast electromagnetic beams (i.e., of a laser) to sinter nanoparticles arranged in a uniform thickness layer that is applied, as nanoparticle colloidal solution (e.g., nanoparticle ink having nanoparticles mixed or finely suspended in, e.g., a solvent), by a slot-die coater. In some embodiments, a high-precision actuation system displaces a build stage, situated on a X-Y-Z nano-positioners, between an optical stage that selectively sinters a top nanoparticle layer and applicator stage that applies subsequent nanoparticle layers over the sintered layer, to iterative build a 3D part.

In addition, exemplified molecular scale models, are disclosed, that have been developed for the micro-SLS to quantify and certify the micro-SLS build process. To this end, operating parameters of subsystems of the micro-SLS system can be derived for the fabrication of a part with a high degree of reliability and uniformity such that post-fabrication testing of the part is not required. In modeling the micro-SLS process, the exemplified micro-SLS modeling process beneficially accounts for the wave nature of light (rather than relying on the ray tracing models commonly used to model the SLS process) using a finite element model to model the scatter of incident light by solving Maxwell equations at each node (i.e., particle). In addition, heat transfer in the micro-SLS process is modelled based on the understanding that heat transfer is dominated by near-field radiation due to the diffraction of the light off the nanoparticles in the powder bed and the ultrafast lasers that are used in the micro-SLS system (rather than by conduction and far-field radiation as conventionally used in macroscale SLS systems). In addition, to accurately model the agglomeration of nanoparticles in the powder bed, the particles are simulated with adjustments to the strength of the van der Waals interactions between the particles in the simulations. The exemplified model facilitates prediction of the quality of a part produced using any given processing conditions, thus, facilitating the production of parts that are "born certified" and do not need to be tested post fabrication.

The present disclosure further provides an exemplified systems and methods that facilitate a direct write, microscale selective laser sintering μ-SLS system that is configured to write 3D metal structures having features sizes down to approximately 1 μm scale on rigid or flexible substrates. The exemplified systems and methods may operate on a variety of material including, for example, polymers, dielectrics, semiconductors, and metals.

In some embodiments, the exemplified systems and methods facilitate fabrication of a fully three-dimensional, multilayer interconnect structures on flexible substrates with sub-10-μm resolutions that are, for example, compatible with current flip chip assembly procedures (e.g., that meets high I/O pin counts of available IC devices) and that have conductivities greater than 30% of bulk copper (e.g., that meets high analog-signal carrying quality).

In some embodiments, the exemplified systems and methods includes material deposition and removal functionality and metrology sub-system that provides process control, tool functionality, reduced tool run costs, and extensive testing of the tool within the semiconductor manufacturing/packaging environment that qualifies the exemplified systems and methods for manufacturing readiness level of 6 or more.

In some embodiments, the exemplified systems and methods provides optimized slot die coating, dielectric curing, and laser sintering/ablation processing.

In some embodiments, the exemplified systems and methods provides laser height gauges, optical/thermal imaging of substrate during sintering, and flow sensors/controllers for a slot die coating system that beneficially provide reliability/repeatability.

In some embodiments, the exemplified systems and methods provides a spray washer (pressurized solvent through a nozzle) and nanoparticle recycling (vacuum suction) system for nanoparticle ink recovery.

In some embodiments, the exemplified systems and methods provide in-situ metrology of process and open loop process control for 3D printing of interconnect structures, e.g., for high-quality flexible electronic packages.

In some embodiments, the exemplified systems and methods include metrology sub-systems that provide processing and process control capabilities at manufacturing readiness level (MRL) of 6, and above, through improved process control, increased tool functionality, reduced tool run costs. In some embodiments, the exemplified systems and methods may be used in semiconductor manufacturing and packaging application.

In some embodiments, the exemplified systems and methods provide the integration of selective encapsulation technology into the packaging process e.g., for high-quality flexible electronic packages.

In some embodiments, the exemplified systems and methods provide write speeds (e.g., fabrication speed) of up to 600 mm$^2$/s and build rates of up to 2 cm$^3$ per hour which makes the μ-SLS process competitive with larger scale additive manufacturing processes and current multi-layer interconnect processing methods for rigid substrates, e.g., for high-quality flexible electronic packages.

In some embodiments, the exemplified systems and methods provide overlay accuracy of about 5 nm, or less, within layer and about 10 nm, or less, between layer overlay accuracy, e.g., for high-quality flexible electronic packages.

In some embodiments, the exemplified systems and methods provides ability to achieve +/−5 μm flip chip alignment accuracy, e.g., for high-quality flexible electronic packages.

In some embodiments, the exemplified systems and methods provide a nanoparticle removal, recovery, and recycling technology, e.g., for high-quality flexible electronic packages.

In an aspect, a system is disclosed for additively producing a three-dimensional workpiece (e.g., having a metallic, plastic, ceramic structure or a combination or composite thereof). The system includes a porous vacuum chuck configured to rigidly fixture a flexible substrate onto which a plurality of sintered layers are successively producible, in a layer-by-layer manner, to form the three-dimensional workpiece (e.g. a multi-layer interconnect on a flexible substrate comprising layers of 3D metal structures embedded among dielectric layers).

In some embodiments, the system includes a multi-slot die coating assembly comprising two or more slot die coating head, including a first slot die coating head configured to dispense a solvent having nanoparticles suspended therein onto a fabrication surface on the flexible substrate, and on other sintered layers thereon, such that the nanoparticles settle, upon drying of the solvent, to form a uniform thickness thereof; and a spray washing station comprising: one or more nozzles through which pressurized solvent is dispensed so as to remove un-sintered ink from the three-dimensional workpiece; and a nanoparticle recycling sub-system configured to provide vacuum suction for nanoparticle ink recovery.

In some embodiments, the two or more slot die coating head includes a second slot die coating head configured to dispense a dielectric material (e.g., polyimide, silicon nitride, silicon carbide, silicon dioxide (silica), and etc.) to the fabrication surface on the flexible substrate, and on the other sintered layers thereon, to form the three-dimensional workpiece (e.g., wherein the system comprises a lens assembly configured to focus each of the plurality of selectively directed electromagnetic radiation beams to a respective focus points, the lens assembly being located at a position between the first slot die coating head and the second slot die coating head).

In some embodiments, the second slot die coating head comprises an energy source (e.g., IR lamp, UV lamp, and etc.) configured to cure the dispensed dielectric material.

In some embodiments, the multi-slot die coating assembly includes an instrument (e.g., a laser height gauge) configured to interrogate the fabrication layer (e.g., dielectric or nanoparticle) and measure one or more thicknesses and one or more uniformity parameter associated with the fabrication layer (e.g., during the deposition process).

In some embodiments, the system includes an image capture apparatus (e.g., a charged coupled device) configured to capture a first spectrum of an electromagnetic radiation observable at, or near, a region on the fabrication layer (e.g., the sintering or sintered spot); and an infrared sensor (e.g., a thermal camera system) configured to capture a second spectrum of the electromagnetic radiation observable at the region; and a beam splitter (dichroic mirror) located between i) the image capture apparatus and infrared sensor and ii) a focusing lens of the system such that the image capture apparatus and the infrared sensor contemporaneously capture (e.g., simultaneously and contemporaneously capture) a spatial resolution and a temperature profile of the region (e.g., for real time process control).

In some embodiments, the multi-slot die coating assembly comprises a first set of one or more flow sensors associated with the first slot die coating head and a second set of one or more flow sensors associated with the second slot die coating header, (e.g., wherein at least one of the first set of one or more flow sensors is located (e.g., in line) between the first slot die coating head and a nanoparticle ink/solvent reservoir) (e.g., wherein at least one of the second set of one or more flow sensors is located (e.g., in line) between the second slot die coating head and a dielectric material reservoir) (e.g., wherein the first set of one or more flow sensors is operatively coupled to a dispensing controller of the first slot die coating head) (e.g., wherein the second set of one or more flow sensors is operatively coupled to a dispensing controller of the second slot die coating head) (e.g., wherein the dispensing controller regulates flow of the first slot die coating head and flow of the second slot die coating head) (e.g., wherein a first dispensing controller regulates flow of the first slot die coating head and wherein a second dispensing controller regulates flow of the second slot die coating head).

In some embodiments, the system includes an actuated assembly (e.g., a pick-and-place system) (e.g., configured to actuate a chip onto a surface of the three-dimensional workpiece or onto a region of the flexible substrate coupled to the three-dimensional workpiece) (e.g., wherein the system comprises a linear guide system configured to move, at least, between a first position associated with the actuated assembly and a second position associated with the multi-slot die coating assembly.

In some embodiments, the system includes an interferometry-based feedback control system (e.g., for voice coils and flexures in the nanopositioner and for a linear servo motor and air bearings in a linear guide system).

In some embodiments, the system includes an electromagnetic radiation source (e.g., a nanosecond laser) configured to coherently emit an electromagnetic radiation beam (e.g., in nanosecond pulses); a lens assembly having a plurality of micro-mirrors, collectively, forming a matrixed mirror array (e.g., that spans a maximum cross-sectional profile of the three-dimensional workpiece), each micro-mirror being configured to selectively direct the emitted electromagnetic radiation beam to a focus point on a sintering plane comprising a layer of particles (e.g., powder metal nanoparticles) to form the plurality of sintered layers; and a slot die coater, the slot die coater being configured to dispense a solvent having nanoparticles suspended therein (e.g., nanoparticle ink) onto a fabrication surface on the flexible substrate such that the nanoparticles settle, upon drying of the solvent, to form a uniform thickness thereof.

In some embodiments, the system includes a build stage (e.g., a two-axis nano-positioning system to position the three-dimensional workpiece during the additive production process); and a positioning system configured to movably position the build stage i) to a first position proximal to the electromagnetic radiation beam generated by the electromagnetic radiation source and the lens assembly and ii) to a second position proximal to the slot die coater.

In another aspect, a method is disclosed of additively fabricating a three-dimensional electronic interconnect on a substrate (e.g., a flexible substrates). The method includes additively forming a plurality of layers on a substrate, including a first layer, wherein the first layer of the plurality of layers is formed by: (a) selectively sintering a first material (e.g., a metal or conductor) (e.g., uniformly deposited on the substrate) with a first pattern comprising traces and vias and removing the unsintered first material to form a first patterned structure in a first layer; (b) deposit a second material (e.g., a dielectric material) around the first patterned structure so as to coat the first layer; and (c) removing excess deposited second material outside the first layer; and additively forming a second layer, and subsequent layers, of the plurality of layers on the first layer, wherein the second layer, and the subsequent layers, are formed by the operation (a)-(c).

In some embodiments, the method includes additively forming a solder bump layer on a portion of the three-dimensional electronic interconnect by selectively sintering a third material with a solder bump pattern (e.g., a metal or conductor) and removing the unsintered third material to form a solder bump patterned structure over the three-dimensional electronic interconnect.

In some embodiments, the method includes placing an electric circuit die on a portion of the formed solder bump patterned structure; and causing the formed solder bump patterned structure to reflow (e.g., via heating) so as to underfill the electric circuit die thereby connecting the electric circuit die to the three-dimensional electronic interconnect.

In some embodiments, the method includes encapsulating, in whole, or in part, the electric circuit die with a fourth material to form an encapsulated electric circuit die operatively coupled to the three-dimensional electronic interconnect. In some embodiments, the encapsulation is performed by: coating (e.g., via a slot die coater) the electric circuit die with the fourth material so as to encapsulate the electric circuit die, wherein the fourth material comprises a curable epoxy; selectively expose the encapsulated electric circuit die (e.g., via UV light); and removing uncured epoxy to provide the encapsulated electric circuit die that is operatively coupled to the three-dimensional electronic interconnect.

In another aspect, a system is disclosed for additively producing a three-dimensional workpiece (e.g., having a metallic, plastic, ceramic structure or a combination or composite thereof) (e.g., on a rigid substrate or a flexible substrate). The system includes an electromagnetic radiation source (e.g., a nanosecond or femtosecond laser) configured to coherently emit an electromagnetic radiation beam (e.g., in nanosecond or femtosecond pulses); a lens assembly having a plurality of micro-mirrors, collectively, forming a matrixed mirror array, each micro-mirror being configured to selectively direct the emitted electromagnetic radiation beam to one or more focus points on a sintering plane comprising a layer of particles (e.g., powder metal nanoparticles) to form one or a plurality of sintered layers, wherein each sintered layer is successively produced, in a layer-by-layer manner, to form the three-dimensional workpiece; and a multi-slot die coating assembly comprising two or more slot die coating head, including i) a first slot die coating head configured to dispense a solvent having nanoparticles suspended therein onto a fabrication surface on the flexible substrate, and on other sintered layers thereon, such that the nanoparticles settle, upon drying of the solvent, to form a uniform thickness thereof and ii) a second slot die coating head configured to dispense a dielectric material to the fabrication surface on the flexible substrate, and on the other sintered layers thereon, to form the three-dimensional workpiece (e.g. a multi-layer interconnect on a flexible substrate comprising layers of 3D metal structures embedded among dielectric layers).

In some embodiments, the system includes a porous vacuum chuck configured to rigidly fixture a flexible substrate onto which the plurality of sintered layers are successively producible, in a layer-by-layer manner, to form the three-dimensional workpiece.

In the system or method of any of the above, the layer of particles may include a metal particle selected from the group consisting of Be, Mg, Al, Ca, Sc, Ti, V, Cr, Mn, Fe, Co, Ni, Cu, Zn, Ga, Sr, Y, Zr, Nb, Mo, Tc, Ru, Rh, Pd, Ag, Cd, In, Sn, Ba, Hf, Ta, W, Re, Os, Ir, Pt, Au, Hg, Tl, Pb, Bi, La, Ce, Pr, Nd, Pm, Sm, Eu, Gd, Tb, Dy, Ho, Er, Tm, Yb, and combinations thereof. In some embodiments, dielectric material is selected from the group consisting of polyimide, silicon nitride, silicon carbide, silicon dioxide (silica), a combination thereof, and etc.

In the system or method of any of the above, the layer of particles may include particles having an average particle size selected from the group consisting of about (e.g., within ±0.5) 8 nanometers (nm), about 9 nm, about 10 nm, about 11 nm, about 12 nm, about 13 nm, about 14 nm, about 15 nm, about 16 nm, about 17 nm, about 18 nm, about 19 nm, about 20 nm, about 21 nm, about 22 nm, about 23 nm, about 24 nm, about 25 nm, about 26 nm, about 27 nm, about 28 nm, about 30 nm, about 31 nm, about 32 nm, about 33 nm, about 34 nm, about 35 nm, about 36 nm, about 37 nm, about 38 nm, about 39 nm, about 40 nm, about 41 nm, about 42 nm, about 43 nm, about 44 nm, about 45 nm, about 46 nm, about 47 nm, about 48 nm, about 49 nm, about 50 nm, about 51 nm, about 52 nm, about 53 nm, about 54 nm, about 55 nm, about 56 nm, about 57 nm, about 58 nm, about 59 nm, about 60 nm, about 61 nm, about 62 nm, about 63 nm, about 64 nm, about 65 nm, about 66 nm, about 67 nm, about 68 nm, about 69 nm, about 70 nm, about 71 nm, about 72 nm, about 73 nm, about 74 nm, about 75 nm, about 76 nm, about 77 nm, about 78 nm, about 79 nm, about 80 nm, about 81 nm, about 82 nm, about 83 nm, about 84 nm, about 85 nm, about 86 nm, about 87 nm, about 88 nm, about 89 nm, about 90 nm, about 91 nm, about 92 nm, about 93 nm, about 94 nm, about 95 nm, about 96 nm, about 97 nm, about 98 nm, about 99 nm, and about 100 nm.

According to another aspect, a system is disclosed for additively producing a three-dimensional workpiece (e.g., having a metallic, plastic, ceramic structure or a combination or composite thereof). The system includes an electromagnetic radiation source (e.g., a nanosecond or a femtosecond laser) configured to coherently emit an electromagnetic radiation beam (e.g., in nanosecond or femtosecond pulses); and a lens assembly having a plurality of micro-mirrors, collectively, forming a matrixed mirror array, each micro-mirror being configured to selectively direct the emitted electromagnetic radiation beam to a focus point on a sintering plane comprising a layer of particles (e.g., powder metal nanoparticles) to form one or a plurality of sintered layers, wherein each sintered layer is successively produced, in a layer-by-layer manner, to form the three-dimensional workpiece.

In some embodiments, the plurality of micro-mirrors direct the plurality of emitted electromagnetic radiation beams onto an area spanning a maximum cross-sectional profile of the three-dimensional workpiece.

In some embodiments, the system includes a slot die coater, the slot die coater being configured to dispense a solvent having nanoparticles suspended therein (e.g., nanoparticle ink) onto a fabrication surface of the three-dimensional workpiece such that the nanoparticles settle, upon drying of the solvent, to form a uniform thickness thereof.

In some embodiments, the system includes a build stage (e.g., to retain the three-dimensional workpiece during the additive production process); and a positioning system configured to movably position the build stage i) to a first position proximal to the electromagnetic radiation beam generated by an optical sintering system comprising the electromagnetic radiation source and the lens assembly and ii) to a second position proximal to the slot die coater. In some embodiments, the positioning system includes a nanopositioner (e.g., a flexure-based nanopositioner), the nanopositioner being coupled to the build stage and configured to moveably position the build stage within ±100 nm of the first position. In some embodiments, the nanopositioner includes an X-axis flexure nanopositioner and a Y-axis flexure nanopositioner, each flexure nanopositioner being coupled to a voice coil that, when energized, moves to elastically deform a flexure body of the flexure nanopositioner in a respective direction.

In some embodiments, the electromagnetic radiation source is configured to emit the electromagnetic radiation beam at an energy level E, wherein $$E = \frac{\rho \pi D^2 h (C_p(T_f - T_i) + l_f)}{4\alpha A}$$

wherein f is the repetition rate, ρ is the powder density, $C_P$ is a specific heat of the nanoparticle, $l_f$ is the heat of fusion, $T_i$ is the initial temperature of the powder bed, $T_f$ is the sintering temperature, A is the absorptivity of the powder bed, D is the spot size, h is the thickness of the layer of nanoparticles, and α is the effective power retention factor of the optical elements (e.g., mirrors, tube lens, and objective)

In some embodiments, the build stage includes a heating element (e.g., a thermoelectric device, a resistive coil, etc.).

In some embodiments, the plurality of micro-mirrors have a number of movable mirror elements selected from the group consisting of between about 500,000 and about 1,000,000 elements (e.g., 786,432 elements); between about 1,000,000 and about 2,500,000 elements (e.g., 1,049,088 elements or 2,073,600 elements); between about 2,500,000 and about 10,000,000 elements (e.g., 3,686,400 elements or 8,294,400 elements); and greater than about 10,000,000 elements (e.g., 33,177,600 elements).

In some embodiments, the plurality of micro-mirrors are arranged in an array having an arrangement selected from the group consisting of 1024 by 768, 1366 by 768, 1920 by 1080, 2560 by 1440, 3840 by 2160, and 7680 by 4320.

In some embodiments, the system includes a second matrixed mirror array, the second matrixed mirror array comprising a second plurality of micro-mirrors, each configured to selectively direct the emitted electromagnetic radiation beam to a focus point on the sintering plane comprising the layer of particles. In some embodiments, the system includes a third matrixed mirror array, the third matrixed mirror array comprising a third plurality of micro-mirrors, each configured to selectively direct the emitted electromagnetic radiation beam to a focus point on the sintering plane comprising the layer of particles. In some embodiments, the system includes a fourth matrixed mirror array, the fourth matrixed mirror array comprising a fourth plurality of micro-mirrors, each configured to selectively direct the emitted electromagnetic radiation beam to a focus point on the sintering plane comprising the layer of particles.

In some embodiments, the lens assembly includes a focusing objective, the focusing objective receiving the selectively directed electromagnetic radiation beam from the matrixed mirror array and focusing the plurality of selectively directed electromagnetic radiation beams to the respective focus points on the sintering plane.

In some embodiments, the focusing objective is configured to focus each of the plurality of selectively directed electromagnetic radiation beams to the respective focus points with a spot size of about 1 µm.

In some embodiments, the assembly includes an ultra-wide-angle optics, the ultra-wide-angle optics receiving the electromagnetic radiation beam from the electromagnetic radiation source or an intermediary optic therewith (e.g., a connecting fiber optic cable), the ultra-wide-angle optics being configured to expand the electromagnetic radiation beam across each, or a substantial portion (e.g., greater than 50%), of the plurality of micro-mirrors.

In some embodiments, the system includes a low-pressure atmospheric chamber (e.g., a vacuum chamber) that encases the system; and a pump coupled to the low-pressure atmospheric chamber.

In some embodiments, the system includes one or more metrology devices coupled to the chamber, the metrology device being selected from the group consisting of a high-speed infrared camera and a near-field scanning optical microscope. In some embodiments, the system includes a laser interferometry system, the laser interferometry system being configured to produce a control signal to substantially align the build stage to the sintering plane.

In some embodiments, the system includes a controller, the controller having a processor and a memory, the memory having instructions stored thereon, wherein, when executed by the processor, cause the processor to: receive a computer-aid-design (CAD) file, the CAD file having geometric description of the tangible object; and direct generation of the three-dimensional workpiece based on the geometric description of the CAD file.

According to another aspect, a method is disclosed of additively producing a three-dimensional workpiece in a layer-by-layer basis. The method includes, for each layer of a workpiece formed from a plurality of sintered layers: producing a layer of nanoparticles powder (e.g., a uniform layer of nanoparticle powder) on a top surface of a workpiece; positioning the workpiece having the layer of nanoparticle powder placed thereon such that the layer of nanoparticle powder is substantially aligned (e.g., within less than 100 nm) to a sintering plane; and selectively sintering the layer of nanoparticles powder by directing a plurality of intermittent electromagnetic radiation beams onto the layer of nanoparticles (e.g., a Q-switched laser, a nanosecond laser, or a femtosecond laser).

In some embodiments, each of the plurality of intermittent electromagnetic radiation beams has a spot size of about 1 µm at each respective focused point on the layer of nanoparticle powder.

In some embodiments, the layer of nanoparticle powder is produced by dispensing a layer of nanoparticles ink comprising the nanoparticle powder mixed or suspended in a solvent (e.g., from a slot die coater).

In some embodiments, the method includes heating a build stage having a surface in contact with the workpiece to a temperature maintained at less than a melting temperature of one or more of the nanoparticle powders.

In some embodiments, the directed plurality of intermittent electromagnetic radiation beams having an energy level E, wherein:

$$E = \frac{\rho \pi D^2 h(C_p(T_f - T_i) + l_f)}{4 \alpha A}$$

wherein f is the repetition rate, $\rho$ is the powder density, $C_P$ is a specific heat of the nanoparticle, $l_f$ is the heat of fusion, $T_i$ is the initial temperature of the powder bed, $T_f$ is the sintering temperature, A is the absorptivity of the powder bed, D is the spot size, h is the thickness of the layer of nanoparticles, and $\alpha$ is the effective power retention factor of the optical elements (e.g., mirrors, tube lens, and objective).

In some embodiments, the intermittent electromagnetic radiation beams for a given spot is directed to the spot between about 1 millisecond and about 500 milliseconds, the intermittent electromagnetic radiation beams having a pulse rate of at least 1 KHz (e.g., up to 500 kHz).

In some embodiments, the pulse width is less than about 100 ns.

According to another aspect, a system is disclosed for additively producing a three-dimensional workpiece (e.g., having a metallic, plastic, ceramic structure or a combination or composite thereof). The system includes a slot-die coater, the slot-die coater being configured to dispense, on a working surface of a three-dimensional workpiece, a generally uniform layer of colloid comprising a solvent having nanoparticles mixed or suspended therein, wherein the solvent of the layer of colloid evaporates to produce a generally uniform layer of nanoparticles powder on the working surface of the workpiece; and a heating element having a surface proximally positionable to the workpiece, the heating element be configured to maintain a temperature at the surface below a melting temperature of one or more of the nanoparticles powder.

In some embodiments, the system includes a build stage (e.g., to retain the three-dimensional workpiece during the additive production process); and a positioning system configured to movably position the build stage i) to a first position proximal to the slot die coater and ii) to a second position proximal to an optical sintering system.

In some embodiments, the first position has a displacement of at least 1 foot from the second position (e.g., 2-3 feet).

According to another aspect, a method is disclosed for additively producing a three-dimensional workpiece in a layer-by-layer basis. The method includes, for each layer: dispensing, on a working surface of a three-dimensional workpiece, a generally uniform layer of colloid comprising a solvent having nanoparticles mixed or suspended therein, wherein the solvent of the layer of colloid evaporates to produce a generally uniform layer of nanoparticles powder on the working surface of the workpiece; and heating a surface in contact with the three-dimensional workpiece to maintain a temperature at the surface above ambient temperature and below a melting temperature of one or more of the nanoparticles powder, wherein the generally uniform layer of nanoparticles powder on the working surface of the workpiece is selectively sintered, between dispensation of layers of the colloid, to form the three-dimensional workpiece.

According to another aspect, a micro-selective sintering laser system is disclosed. The micro-selective sintering laser system includes an optical sintering stage; a nanoparticle dispensing stage; and a positioning system coupled to the optical sintering stage and the nanoparticle dispensing stage. The positioning system is configured to movably position a build stage between the optical sintering stage and the nanoparticle dispensing stage, the build stage being configured to retain a workpiece to be additively fabricated in a layer-by-layer basis by the optical sintering stage and the nanoparticle dispensing stage. The optical sintering stage includes: an electromagnetic radiation source (e.g., a nanosecond or femtosecond laser) configured to coherently (and, e.g., intermittently) emit an electromagnetic radiation beam (e.g., in nanosecond or femtosecond pulses); and a lens assembly having a plurality of micro-mirrors, collectively, forming a matrixed mirror array, each micro-mirror being configured to selectively direct the emitted electromagnetic radiation beam to a focus point on a sintering plane comprising a layer of particles (e.g., powder metal nanoparticles) to form one or a plurality of sintered layers, wherein each sintered layer is successively produced, in a layer-by-layer manner, to form the three-dimensional workpiece; and wherein the nanoparticle dispensing stage a slot-die coater, the slot die coater being configured to dispense a colloid comprising a solvent having nanoparticles mixed or suspended therein (e.g., nanoparticle ink) onto a working surface of the workpiece such that the nanoparticles settle, upon drying of the solvent, to form a uniform thickness thereof.

In the system or method of any one of the above, the layer of particles comprises a metal particle selected from the group consisting of Be, Mg, Al, Ca, Sc, Ti, V, Cr, Mn, Fe, Co, Ni, Cu, Zn, Ga, Sr, Y, Zr, Nb, Mo, Tc, Ru, Rh, Pd, Ag, Cd, In, Sn, Ba, Hf, Ta, W, Re, Os, Ir, Pt, Au, Hg, Tl, Pb, Bi, La, Ce, Pr, Nd, Pm, Sm, Eu, Gd, Tb, Dy, Ho, Er, Tm, Yb, and combinations thereof.

In the system or method of any one of the above, the layer of particles comprises particles having an average particle size selected from the group consisting of about (e.g., within ±0.5) 8 nanometers (nm), about 9 nm, about 10 nm, about 11 nm, about 12 nm, about 13 nm, about 14 nm, about 15 nm, about 16 nm, about 17 nm, about 18 nm, about 19 nm, about 20 nm, about 21 nm, about 22 nm, about 23 nm, about 24 nm, about 25 nm, about 26 nm, about 27 nm, about 28 nm, about 30 nm, about 31 nm, about 32 nm, about 33 nm, about 34 nm, about 35 nm, about 36 nm, about 37 nm, about 38 nm, about 39 nm, about 40 nm, about 41 nm, about 42 nm, about 43 nm, about 44 nm, about 45 nm, about 46 nm, about 47 nm, about 48 nm, about 49 nm, about 50 nm, about 51 nm, about 52 nm, about 53 nm, about 54 nm, about 55 nm, about 56 nm, about 57 nm, about 58 nm, about 59 nm, about 60 nm, about 61 nm, about 62 nm, about 63 nm, about 64 nm, about 65 nm, about 66 nm, about 67 nm, about 68 nm, about 69 nm, about 70 nm, about 71 nm, about 72 nm, about 73 nm, about 74 nm, about 75 nm, about 76 nm, about 77 nm, about 78 nm, about 79 nm, about 80 nm, about 81 nm, about 82 nm, about 83 nm, about 84 nm, about 85 nm, about 86 nm, about 87 nm, about 88 nm, about 89 nm, about 90 nm, about 91 nm, about 92 nm, about 93 nm, about 94 nm, about 95 nm, about 96 nm, about 97 nm, about 98 nm, about 99 nm, and about 100 nm.

BRIEF DESCRIPTION OF THE DRAWINGS

The components in the drawings are not necessarily to scale relative to each other and like reference numerals designate corresponding parts throughout the several views:

FIGS. 2A and 2B are detail diagrams of the exemplary micro-selective laser sintering system of FIG. 1 in accordance with an illustrative embodiment.

FIGS. 4A, 4B, 5A, 5B, and 5C each depicts an exemplary slot-die coater configured to dispense the nanoparticle ink or colloid.

FIGS. 8A, 8B, 8C, 8D, 8E, 8F, 8G, 8H depict diagrams of an exemplary flexure positioning system (e.g., the XY positioners) in accordance with an illustrative embodiment.

FIGS. 20A and 20B are diagrams of a heated vacuum chuck in accordance with an illustrative embodiment.

DETAILED DESCRIPTION

Figure 1:
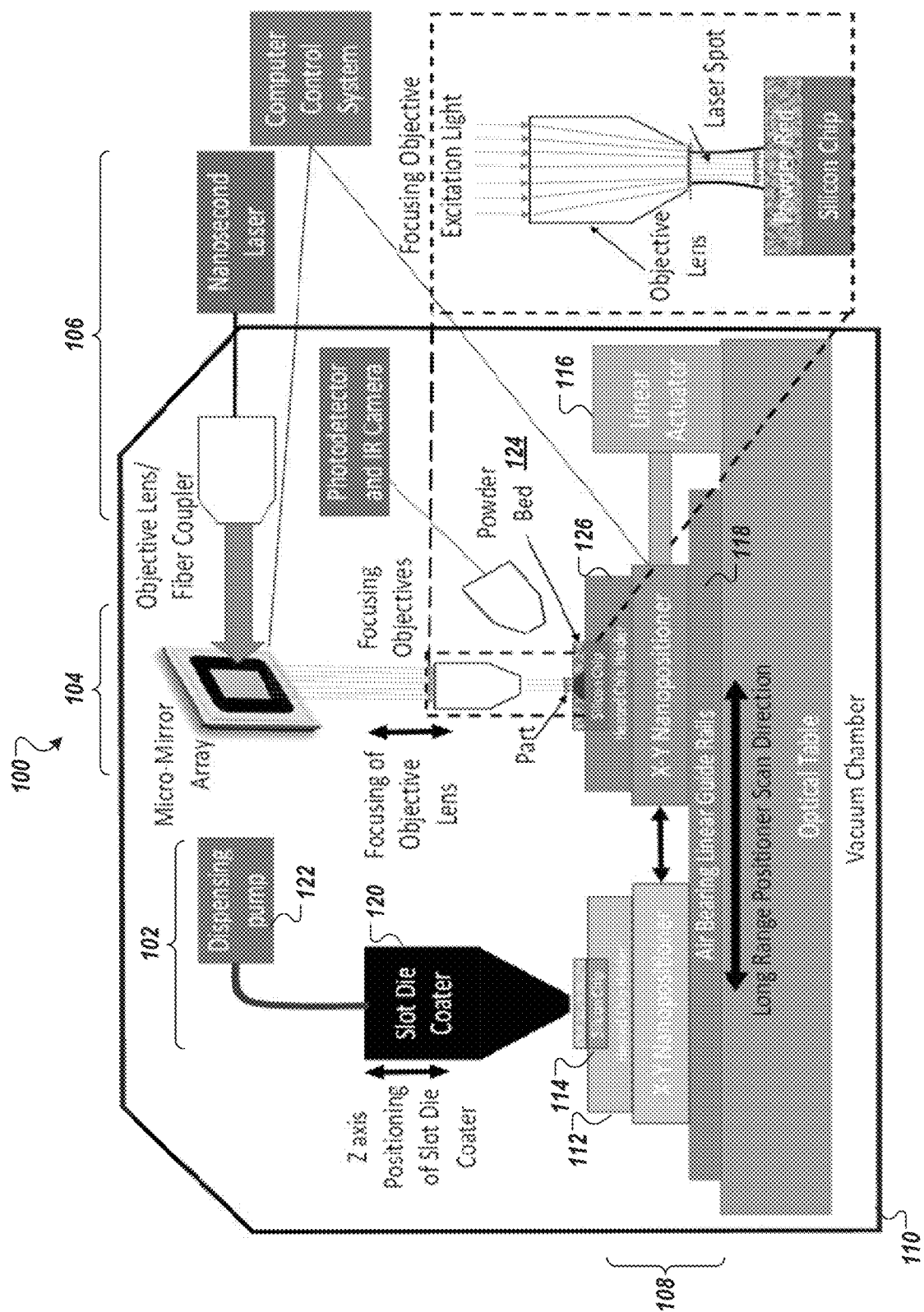
FIG. 1 is a diagram of an exemplary micro-selective laser sintering system in accordance with an illustrative embodiment.

The nanoparticle powder and nanoparticle ink described herein may be understood more readily by reference to the following detailed description of specific aspects of the disclosed subject matter and the Examples included therein.

Before the present nanoparticle powder and nanoparticle ink are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

General Definitions

In this specification and in the claims that follow, reference will be made to a number of terms, which shall be defined to have the following meanings.

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "an agent" includes mixtures of two or more such agents, reference to "the component" includes mixtures of two or more such components, and the like.

"Optional" or "optionally" means that the subsequently described event or circumstance can or cannot occur, and that the description includes instances where the event or circumstance occurs and instances where it does not.

Ranges can be expressed herein as from "about" one particular value, and/or to "about" another particular value. By "about" is meant within 5% of the value, e.g., within 4, 3, 2, or 1% of the value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

It is understood that throughout this specification the identifiers "first" and "second" are used solely to aid in distinguishing the various components and steps of the disclosed subject matter. The identifiers "first" and "second" are not intended to imply any particular order, amount, preference, or importance to the components or steps modified by these terms.

Nanoparticle Powder and Nanoparticle Ink

Disclosed herein are nanoparticle powder and nanoparticle ink. As used herein, "nanoparticle" means any structure with one or more nanosized features. A nanosized feature can be any feature with at least one dimension less than 1 μm in size. For example, a nanosized feature can comprise a nanowire, nanotube, nanoparticle, nanopore, and the like, or combinations thereof. As such, the nanoparticle powder and nanoparticle ink can comprise, for example, a nanowire, nanotube, nanoparticle, nanopore, or a combination thereof.

In some examples, a plurality of nanoparticles of the nanoparticle powder and nanoparticle ink can comprise a plurality of metal particles. The plurality of metal particles can, for example, comprise a metal selected from the group consisting of Au, Ag, Pt, Pd, Cu, Al, Sn, Pb, Ni, Zn, and combinations thereof. In some embodiments, the plurality of metal particles can comprise a metal selected from the group consisting of Be, Mg, Al, Ca, Sc, Ti, V, Cr, Mn, Fe, Co, Ni, Cu, Zn, Ga, Sr, Y, Zr, Nb, Mo, Tc, Ru, Rh, Pd, Ag, Cd, In, Sn, Ba, Hf, Ta, W, Re, Os, Ir, Pt, Au, Hg, Tl, Pb, Bi, La, Ce, Pr, Nd, Pm, Sm, Eu, Gd, Tb, Dy, Ho, Er, Tm, Yb, and combinations thereof.

The plurality of nanoparticles in the nanoparticle powder and nanoparticle ink can have an average particle size. "Average particle size," "mean particle size," and "median particle size" are used interchangeably herein, and generally refer to the statistical mean particle size of the particles in a population of particles. For example, the average particle size for a plurality of particles with a substantially spherical shape can comprise the average diameter of the plurality of particles. For a particle with a substantially spherical shape, the diameter of a particle can refer, for example, to the hydrodynamic diameter. As used herein, the hydrodynamic diameter of a particle can refer to the largest linear distance between two points on the surface of the particle. Mean particle size can be measured using methods known in the art, such as evaluation by scanning electron microscopy, transmission electron microscopy, and/or dynamic light scattering.

The plurality of nanoparticles in the nanoparticle powder and nanoparticle ink can have, for example, an average particle size of about (e.g., within ±0.5) 8 nanometers (nm), about 9 nm, about 10 nm, about 11 nm, about 12 nm, about 13 nm, about 14 nm, about 15 nm, about 16 nm, about 17 nm, about 18 nm, about 19 nm, about 20 nm, about 21 nm, about 22 nm, about 23 nm, about 24 nm, about 25 nm, about 26 nm, about 27 nm, about 28 nm, about 29 nm, about 30 nm, about 31 nm, about 32 nm, about 33 nm, about 34 nm, about 35 nm, about 36 nm, about 37 nm, about 38 nm, about 39 nm, about 40 nm, about 41 nm, about 42 nm, about 43 nm, about 44 nm, about 45 nm, about 46 nm, about 47 nm, about 48 nm, about 49 nm, about 50 nm, about 51 nm, about 52 nm, about 53 nm, about 54 nm, about 55 nm, about 56 nm, about 57 nm, about 58 nm, about 59 nm, about 60 nm, about 61 nm, about 62 nm, about 63 nm, about 64 nm, about 65 nm, about 66 nm, about 67 nm, about 68 nm, about 69 nm, about 70 nm, about 71 nm, about 72 nm, about 73 nm, about 74 nm, about 75 nm, about 76 nm, about 77 nm, about 78 nm, about 79 nm, about 80 nm, about 81 nm, about 82 nm, about 83 nm, about 84 nm, about 85 nm, about 86 nm, about 87 nm, about 88 nm, about 89 nm, about 90 nm, about 91 nm, about 92 nm, about 93 nm, about 94 nm, about 95 nm, about 96 nm, about 97 nm, about 98 nm, about 99 nm, and about 100 nm.

In some embodiments, the average particle size can be 8 nanometers (nm) or more (e.g., 9 nm or more, 10 nm or more, 11 nm or more, 12 nm or more, 13 nm or more, 14 nm or more, 15 nm or more, 16 nm or more, 17 nm or more, 18 nm or more, 19 nm or more, 20 nm or more, 21 nm or more, 22 nm or more, 23 nm or more, 24 nm or more, 25 nm or more, 26 nm or more, 27 nm or more, 28 nm or more, 29 nm or more, 30 nm or more, 31 nm or more, 32 nm or more, 33 nm or more, 34 nm or more, 35 nm or more, 36 nm or more, 37 nm or more, 38 nm or more, 39 nm or more, 40 nm or more, 45 nm or more, 50 nm or more, 55 nm or more, 60 nm or more, 65 nm or more, 70 nm or more, or 75 nm or more). In some embodiments, the plurality of nanoparticles of the nanoparticle powder and nanoparticle ink can have an average particle size of 80 nm or less (e.g., 75 nm or less, 70 nm or less, 65 nm or less, 60 nm or less, 55 nm or less, 50 nm or less, 45 nm or less, 40 nm or less, 39 nm or less, 38 nm or less, 37 nm or less, 36 nm or less, 35 nm or less, 34 nm or less, 33 nm or less, 32 nm or less, 31 nm or less, 30 nm or less, 29 nm or less, 28 nm or less, 27 nm or less, 26 nm or less, 25 nm or less, 24 nm or less, 23 nm or less, 22 nm or less, 21 nm or less, 20 nm or less, 19 nm or less, 18 nm or less, 17 nm or less, 16 nm or less, 15 nm or less, 14 nm or less, 13 nm or less, 12 nm or less, 11 nm or less, 10 nm or less, or 9 nm or less). The average particle size of the plurality of nanoparticles of the nanoparticle powder and nanoparticle ink can range from any of the minimum values described above to any of the maximum values described above. For example, the plurality of nanoparticles of the nanoparticle powder and nanoparticle ink can have an average particle size of from 8 nm to 40 nm (e.g., from 8 nm to 40 nm, from 4 nm to 80 nm, from 8 nm to 20 nm, from 20 nm to 40 nm, from 40 nm to 60 nm, from 60 nm to 80 nm, from 15 nm to 40 nm, or from 25 nm to 35 nm).

In some examples, the plurality of nanoparticles in the nanoparticle powder and nanoparticle ink can be substantially monodisperse. "Monodisperse" and "homogeneous size distribution," as used herein, and generally describe a population of particles where all of the particles are the same or nearly the same size. As used herein, a monodisperse distribution refers to particle distributions in which 80% of the distribution (e.g., 85% of the distribution, 90% of the distribution, or 95% of the distribution) lies within 25% of the median particle size (e.g., within 20% of the median particle size, within 15% of the median particle size, within 10% of the median particle size, or within 5% of the median particle size).

The plurality of nanoparticles in the nanoparticle powder and nanoparticle ink can comprise particles of any shape (e.g., a sphere, a rod, a quadrilateral, an ellipse, a triangle, a polygon, etc.). In some examples, the plurality of nanoparticles of the nanoparticle powder and nanoparticle ink can have an isotropic shape. In some examples, the plurality of nanoparticles of the nanoparticle powder and nanoparticle ink can have an anisotropic shape. In some examples, the plurality of nanoparticles of the nanoparticle powder and nanoparticle ink are substantially spherical.

Micro-Selective Laser Sintering System

To reduce the minimum feature-size resolution of metal additively-manufactured parts while still maintaining the throughput of traditional additive manufacturing processes, a microscale selective laser sintering (μ-SLS) system, in some embodiments, uses an ultrafast laser coupled with an arrayed optical system comprising micro-mirror arrays. The ultra-fast nanosecond laser (or femtosecond laser) facilitates precise control over the heat-affected zone of the micro-SLS powder bed. In some embodiments, the laser is coupled to a fiber optic lens and then directed off a micro-mirror array through a 10×, long working distance objective lens. This allows each 10.8 μm by 10.8 μm pixel in the micro-mirror array to be focused down to a spot size of approximately 1 μm.

In addition, the micro-SLS generates a layer of microscale powders using nanoparticle ink dispensed via a slot die coater. The use of the nanoparticle ink facilitates the prevention of agglomeration of the nanoparticles during the powder-spreading process. In addition, in some embodiments, a one degree-of-freedom nano-positioning system with a resolution of better than 100 nm is integrated with a slot die coating system to precisely control the thickness of the ink layer that is dispensed during the build process.

Nanoparticles facilitates build layers that are approximately 1 μm thick and are at least one order of magnitude smaller than the desired layer thickness.

FIG. 1 is a diagram of an exemplary micro-selective laser sintering system 100 in accordance with an illustrative embodiment. As shown in FIG. 1, the μ-SLS system 100 includes (1) a spreader mechanism 102 configured to generate the powder bed, (2) an optical system 104 (also referred to as an optical sintering system) configured to write features into the powder bed, (3) an ultrafast laser system 106 configured to sinter the particles (4) a positioning system 108 configured to move and position a build stage 112 between the optical system 104 and the spreader mechanism 102, and (5) a vacuum and vibration isolation 110 systems configured to reduce outside influences that could damage the part quality.

Still referring to FIG. 1, the nanopowder spreader mechanism 102, in some embodiments, includes a slot die coating system 102 (shown as "slot die coater 120" and "dispensing pump 122") configured to spread uniform layers of nanoparticle inks over a workpiece 114 (shown as "a silicon wafer 114"). Slot die coaters can be used to dispense other material (e.g., dielectric materials) over a workpiece. Non-limiting examples of dielectric material that may be used include polyimide, silicon nitride, silicon carbide, silicon dioxide (silica), and etc. A slot-die coater is a non-contact, large-area processing apparatus for the deposition of homogeneous films (e.g., wet films) with high cross-directional uniformity. In a slot die coater, the coating fluid is typically forced through a narrow slit onto a substrate that is moving relative to the coating head, e.g., with a viscosities (e.g., 1-100,000 cP, or more) and coating speeds (e.g., 1-600 m/min, or more).

Figure 17:
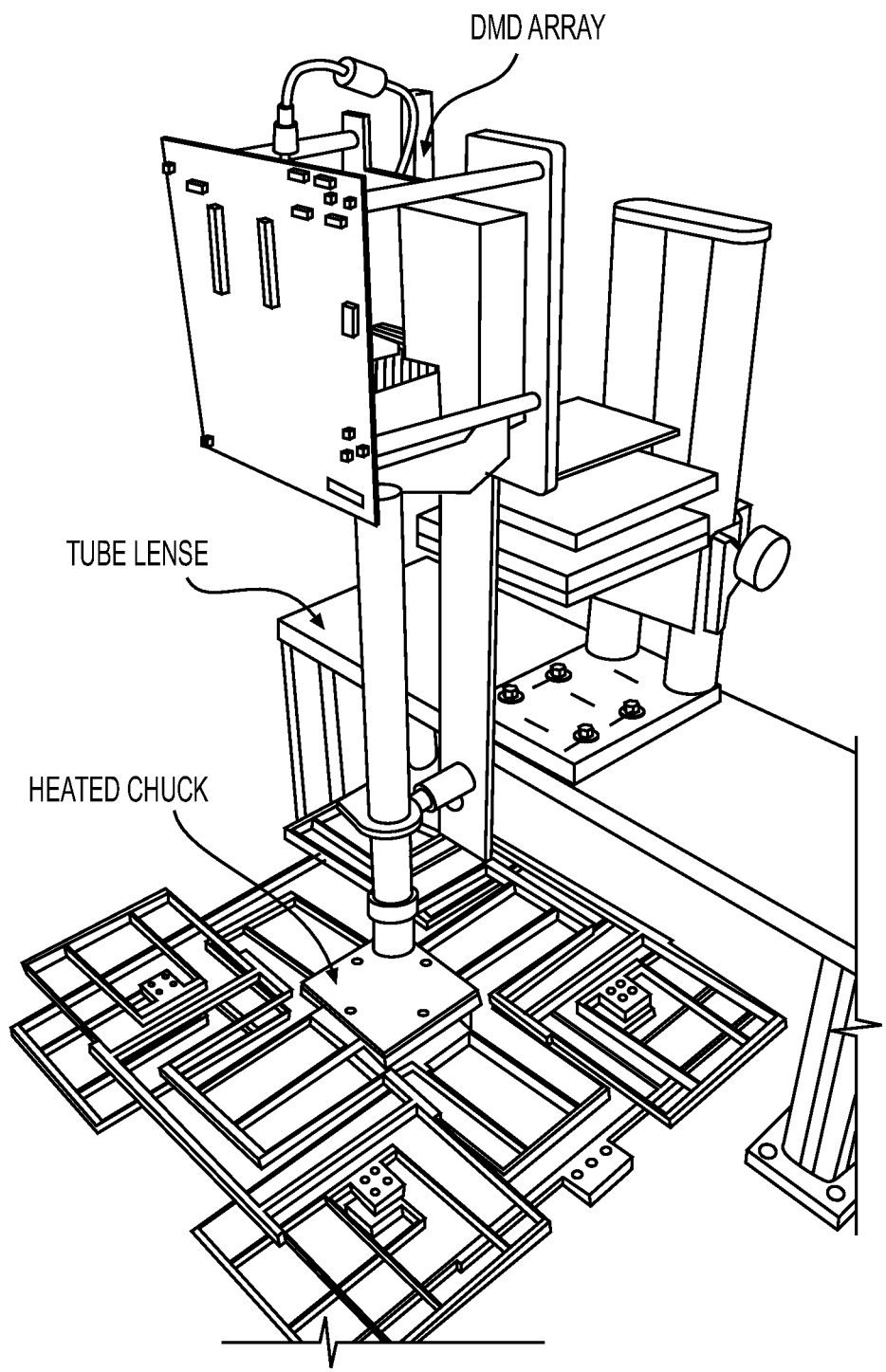
FIG. 17 is an image of a μ-SLS test bed system.

Still referring to FIG. 1, the slot die coating system 102 is configured to dispense, in some embodiments, a uniform layer of nanoparticle ink or a colloid comprising nanoparticles suspended or mixed in a solvent. Upon drying (i.e., evaporation of the solvent), the nanoparticles in the nanoparticle ink or colloid settle to form a uniform layer of nanoparticle powder (shown as "powder bed 124"). The build stage 112, which retains the workpiece 114, includes, in some embodiments, a sample holder (shown as "heated chip holder 112") configured to accelerate the drying of the nanoparticle inks or colloid to produce the powder bed 124. The positioning system 108 includes, in some embodiments, an electromagnetic linear actuator 116 configured to move the workpiece 114 (e.g., a silicon wafer, a flexible substrate, and etc.) under the slot die coater 120. The positioning system 108 further includes, in some embodiments, air bearings 118 configured to guide the motion and ensure that a smooth uniform coating is produced. The positioning system 108 positions the build stage 112 under the optical system 104 for sintering. In some embodiments, the positioning system 108 moves the build stage 112 under the optical system 104 as the nanoparticle ink is drying. In other embodiments, the positioning system 108 moves the build stage 112 under the optical system 104 after the nanoparticle ink has dried. The positioning system 108 includes, in some embodiments, a flexure-based nanopositioning system configured to precisely move and align (e.g., in less 100 nm resolution, e.g., 40 nm) the powder bed to the optical system 104 and the slot die coater 102 between each sintering operation. In some embodiments, the optical system 104 is attached to a ball screw and micro-stepper motor assembly configured to move the projection optics up to compensate, after the sintering process, for the increased height of the new layer that has been spread on the powder bed. FIG. 17 is an image of a μ-SLS test bed system that implements portions of the exemplary micro-selective laser sintering system 100.

FIG. 2, comprising FIGS. 2A and 2B, is a detail diagram of the exemplary micro-selective laser sintering system 100 of FIG. 1 in accordance with an illustrative embodiment. As shown in the FIG. 2A, the build stage 112 is positioned, via the linear actuator 116, to a first position 202 such the workpiece 114 is positioned proximal to a dispensing head 204 of the slot die coater 120. The build stage 112, in some embodiments, is operatively coupled, via air bearings 240, to one or more guide rails 118. The slot die coater 120 is configured to dispense, via a pump 206, from a tank 208, nanoparticle ink or colloid comprising solvent with nanoparticles mixed or suspended therein. The build stage 112 can be moved, along the guide rails 118, to other positions associated with the other processing in the system. The air bearings and linear servo motor ensures that little vibration is transmitted to the stage during travel to improve coating uniformity during the slot die coating operation.

The build stage 112, in some embodiments, includes a XY positioner 210 to provide fine positioning of the build stage 112 with respect to the slot die coater 120. In some embodiments, the XY positioner 210 comprises an X-axis flexure member and a Y-axis flexure member (not shown—see FIG. 8), each operatively coupled a voice coil 212. Each X-axis and Y-axis flexure member is configured to elastically bend along a respective direction (i.e., x-direction or y-direction). In other embodiments, commercially-available 2-axis positioners having less than 100 μm resolution may be used. The build stage 112, in some embodiments, includes a Z-axis nanopositioner 214. In some embodiments, the μ-SLS system 100 includes sensors 216 (shown as 216a, 216b) to provide positioning signals (e.g., feedback signals) to the XY flexure positioner 210 and Z-axis nanopositioner 214. In some embodiments, the sensors 216 are interferometry sensors. The interferometry sensors, in some embodiments, are used to register errors between each coating operation to ensure that the patterns on each coating layer are in the correct position relative to each other.

Referring still to FIG. 2A, the slot-die coater 120, in some embodiments, is operatively coupled to a Z-axis actuator 218 configured to adjust the height displacement of the slot-die coater 120 in the Z-direction. In some embodiments, the Z-axis actuator 218 is configured to adjust the height of the slot-die coater 120 to compensate for each sintered layer added to the workpiece 114. In some embodiments, the Z-axis actuator 218 is a one degree-of-freedom nanopositioning system with a resolution of better than 10 nm that is used to precisely control the thickness of the powder layer that is spread during the build process.

Referring now to FIG. 2B, the build stage 112 is positioned, via the linear actuator 116, to a second position 222 such the workpiece 114 is positioned proximal to an objective lens 224 of the optical system 104. In some embodiments, the first position 202 has a displacement that is greater than 1 foot (e.g., between 0.5 and 1 foot, between 1 and 2 feet, between 2 and 3 feet, between 3 and 4 feet, between 4 and 5 feet, between 5-6 feet, between 6 and 10 feet, and greater than 10 feet) from the second position 222.

The build stage 112, in some embodiments, includes a heating element 236 (e.g., a thermoelectric device, e.g., peltier; a resistive coil; or the like) to heat a surface 238 of the build stage 112 in operative contact, or proximal to, the workpiece 114. The heating element 236, in some embodiments, is configured to accelerate the drying (or evaporation) of the dispensed nanoparticle ink or solvent of the colloid to produce a uniform layer of nanoparticle powder. A temperature sensor (not shown) mounted to the build stage 112 or the surface 238, in some embodiments, is used to provide feedback control for the heating element 236. In some embodiments, the heat element 236 operates continuously. In addition to accelerating the drying of the dispensed nanoparticle ink or solvent of the colloid, the heat element 236 may elevate the temperature of the workpiece, at an elevate temperature as compared to ambient temperature, which may reduce thermal stress between the workpiece and the layer being sintered during the sintering process.

Referring still to FIG. 2B, the optical system 104 is configured to direct a plurality of pulse lasers to the dispensed layer of nanoparticles (i.e., the uniform layer of nanoparticle powder formed from the dried nanoparticle ink or the dried colloid of solvent and nanoparticle). The optical system 104 is operatively coupled, in some embodiments, via fiber optics 226, to an ultrafast laser 106. The optical system 104 includes one or more micro-mirror array 228, comprising an array of addressable mirror elements, to selectively direct the beam emitted from the laser 106 to the workpiece 114. In some embodiments, the optical system 104 includes a tube lens 230 to direct the reflected beam from the micro-mirror array 228 to the objective lens 224. In some embodiments, the µ-SLS system 100 includes sensors 232 (shown as 232a, 232b) to provide positioning signals (e.g., feedback signals) to the XY flexure positioner 210 and Z-axis nanopositioner 214 to align the build stage 112 to the optical system 104. The optical system 104, in some embodiments, is coupled to a Z-axis actuator 234 configured to adjust the height displacement of the optical system 104 in the Z-direction. In some embodiments, the Z-axis actuator 234 is configured to adjust the height of the optical system 104 to compensate for each nanoparticle powder layer added to the workpiece 114. In some embodiments, the Z-axis actuator 234 includes a ball screw and micro-stepper motor assembly.

The µ-SLS system 100 includes one or more controllers 220 to coordinate the operation of the slot-die coater, the optical system, and various subcomponents of the micro-SLS system.

The controller may receive a computer-aid-design (CAD) file or STL file having geometric description of the tangible object to direct generation of the three-dimensional workpiece based on the geometric description of the CAD file or STL file.

Figure 3:
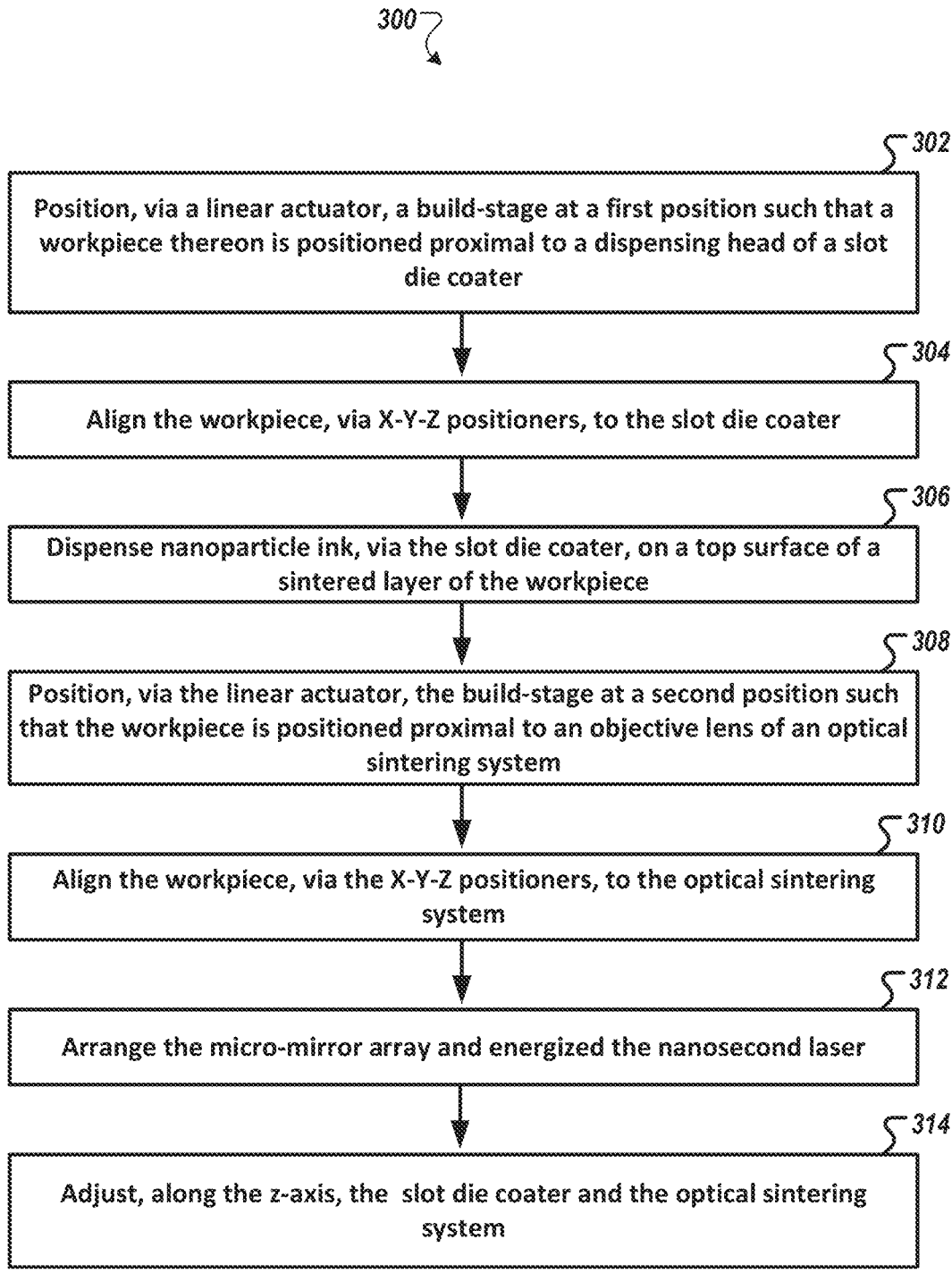
FIG. 3 depicts a diagram of a method of operating the μ-SLS system in accordance with an illustrative embodiment.

FIG. 3 depicts a diagram of a method 300 of operating the µ-SLS system 100 in accordance with an illustrative embodiment. The method 300 include, iteratively building, on a layer-by-layer basis, the workpiece (e.g., 114) by incrementally applying a uniform layer of nanoparticles via a slot-die coater (e.g., 120) on top of the workpiece and incrementally sintering, on a selective basis, over a broad area, the applied layer of nanoparticles via an optical and laser system (e.g., 104 and 106).

Specifically, the method 300, at step 302, includes positioning, via a linear actuator (e.g., 116), a build stage (e.g., 112) at a first position (e.g., 202) such that the workpiece 114 located on the build stage (e.g., 112) is positioned proximal to a dispensing head (e.g., 204) of a slot-die coater (e.g., 120).

At the first position (e.g., 202), the system 100, at step 304, may align the workpiece (e.g., 114), via an X-Y-Z positioners (e.g., 210, 214), to the head (e.g., 204) of the slot-die coater (e.g., 120).

The system 100, at step 306, may dispense a uniform layer of nanoparticle ink or colloid comprising a solvent having nanoparticles mixed or suspended therein on top of the workpiece (e.g., 114).

Slot Die Coater Sub-Assembly

FIGS. 4A and 4B each depicts an exemplary slot-die coater 120 in a slot die coater subassembly 400 configured to dispense a uniform layer of the nanoparticle ink or colloid and other fabrication material (e.g., dielectric material) onto the workpiece. In FIG. 4A, the slot-die coater 120 is configured move along the X-direction as it 120 dispense, along the Y direction, the nanoparticle ink or colloid of solvent and nanoparticles, to coat a surface on a top surface of the workpiece. The slot-die coater 120, in some embodiments, is operatively coupled to a linear actuator 402, via one or more guided linear rails. The linear actuator 402, in some embodiments, is operatively coupled to the Z-axis actuator 218. The linear actuator 402 is configured to move the slot-die coater 120 between a first position 404 and a second position 406 spanning, at least, the length of the workpiece 114.

In FIG. 4B, the linear actuator 116 is configured to move the build stage 114 across the slot-die coater 120, e.g., between the first position 202 and a third position 408, as nanoparticle ink, or colloid of solvent and nanoparticles, is dispensed therefrom. In some embodiments, the build stage 112 is moved towards the optical system 104 as the slot die coater 120 dispenses the nanoparticle ink, or colloid of solvent and nanoparticles. In some embodiments, the build stage 112 is moved in a continuous manner towards the optical system 104 as the slot die coater 120 dispenses the nanoparticle ink, or colloid of solvent and nanoparticles.

FIG. 5A is a diagram of an example operation of the slot-die coater 120. FIGS. 5B and 5C are diagrams of a slot die set. As shown in FIG. 5B, in some embodiments, the slot die coater 120 includes a lip 502, a cavity 504, and an inner surface 506. FIG. 5C shows example internal structures of the slot die coater 120 of FIG. 5B.

In some embodiments, multiple slot die coaters are used in the system 100 with each slot die coater being used to dispense different types of material or concentration material. For example, a first slot die coater may be used to dispense a first material (e.g., nanoparticle ink or colloid) and a second slot die coater may be used to dispense a second material (e.g., dielectric material). Other slot die coaters may be used to dispense a third, fourth material, and etc. or a different concentration of the first and second material.

In other embodiments, one or more slot die coaters are each coupled to multiple reservoirs having different materials. The output of the reservoirs may be selectively directed, e.g., via one or more valves, to the lip of the slot die coater. The multi-material processing technology may be used, for example, to form multilayer interconnect structures including those as discussed in relation to FIG. 18.

Referring back to FIG. 3, the system 100, at step 306, dispenses the nanoparticle ink, or colloid of solvent and nanoparticles, via the slot die coater, on a top surface of a sintered layer of the workpiece, as for example described in relation to FIG. 4 or 5.

The method 300, at step 308, includes positioning, via the linear actuator (e.g., 116), the build-stage (e.g., 112) at a second position (e.g., 222) such that the workpiece (e.g., 112) is positioned proximal to an objective lens (e.g., 224) of an optical sintering system (e.g., 104).

At the second position (e.g., 222), the system 100, at step 310, may align the workpiece (e.g., 114), via the X-Y-Z positioners (e.g., 210, 214), to the objective lens (e.g., 224) of the optical sintering system (e.g., 104).

The method 300, at step 312, includes arranging the micro-mirror array with a sintering pattern and energizing the nanosecond laser (e.g., 106).

In some embodiments, the micro-mirror array has an image buffer that has a pixel or voxel value associated with each addressable micro-mirror in the array. The image buffer may be loaded with an image or a patterned data associated with a cross-section of a 3D model file (e.g., CAD file) or STL file corresponding with a layer to be sintered. The image buffer may be loaded, via a controller of the micro-mirror array, to arrange the micro-mirror array with the sintering pattern, prior to the build stage being positioned next to the optical system 104 (e.g., when the build stage is next to the slot-die coater or when the linear actuator is moving the build stage).

Referring still to FIG. 3, the nanosecond laser 106 is then energized or directed to generate a pulse train of laser beams. The laser beam is transmitted, e.g., via a fiber optic cable (e.g., 226), to the micro-mirror array (e.g., 228), which selectively direct the laser into a plurality of laser beams corresponding to the sintering pattern arranged thereon. The laser beams maybe directed, through a tube lens (e.g., 230) to an objective lens (e.g., 224), which focused each of the plurality of laser beams to individual focus spot, at a sintering plane, over an area, on the layer of nanoparticle powder. The area may corresponds to the array topology and sintering pattern arranged on the array. A 1024*768 micro-mirror array, for example, may selectively direct up to 786,432 spots at any given time. In some embodiments, the beam has a frequency in the kilohertz range and above, as described herein. Each pulse has a pulse width, in some embodiments, that is between 1 ns and 100 ns, as described herein. The layer of nanoparticles may be subjected to the plurality of selectively-directed laser beams, e.g., for a pre-defined period of time until the temperature and near the sintered spot is elevated to a suitable temperature to cause the nanoparticles, and the layer thereof, to sinter (e.g., to form a coherent mass by heating without melting).

The method 300, at step 314, includes adjusting, along the z-axis, the slot die coater 120 and the optical sintering system 104. In some embodiments, the slot die coater 120 and the optical system 104 are individually adjusted via a Z-positioner (e.g., 218 and 234). In some embodiments, the Z-positioners (e.g., either or both 218 and 234) includes ball-screw-stepper or linear servo-air bearing positioners.

In some embodiments, the adjustment to the slot die coater 120 is performed after the nanoparticle ink, or colloid of solvent and particles, are applied and before the next layer thereof is applied.

In some embodiments, the adjustment to the optical system 104 is performed after the layer of nanoparticle has been sintered and before the new layer of nanoparticles are presented to the optical system 104.

Digital Micro-Mirror Array Optical System

Figure 6A:
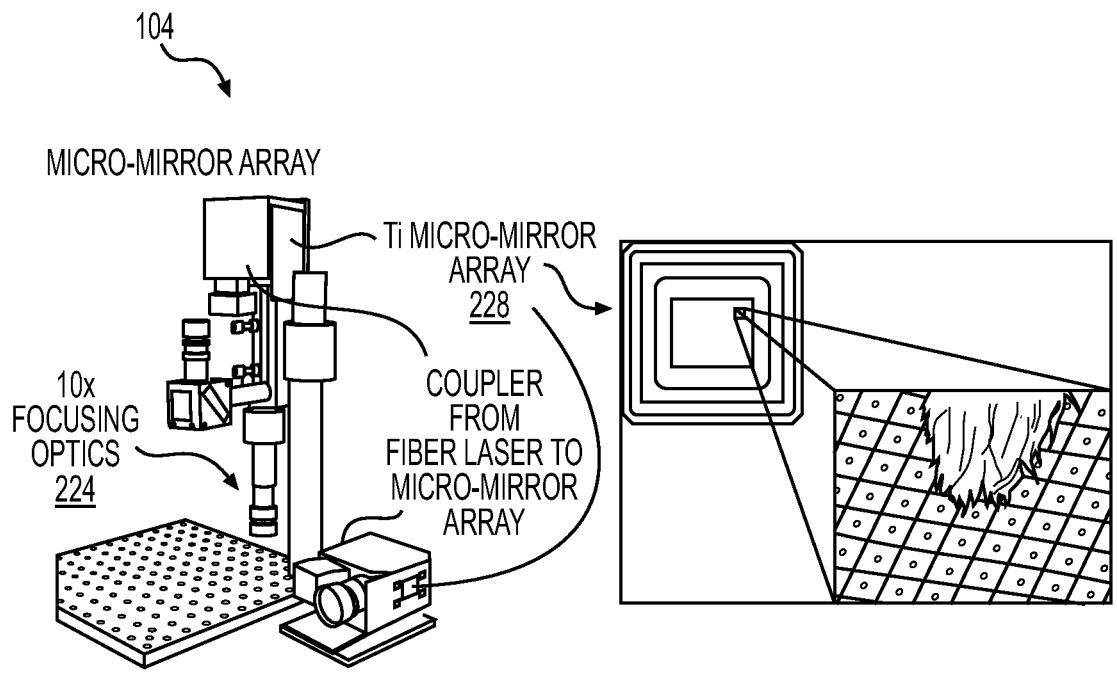
FIG. 6A is an exemplary optical system comprising a micro-mirror array, in accordance with an illustrative embodiment.

FIG. 6A is an exemplary optical system 104 comprising a micro-mirror array, in accordance with an illustrative embodiment. Specifically, FIG. 6A shows an optical system with a 10× focusing objective 224 and digital micro-mirror array 228. The micro-mirror pixels, in some embodiments, are 10 µm by 10 µm in size, though other size may be used, and are placed 800 nm apart. In conjunction with a focusing objective 224, the micro-mirror array 228 provide concurrent selective focusing of a laser beam over a large working area to provide a high throughput of the sintering process. The throughput, via the concurrent selective sintering, is 4 orders of magnitude higher than embodiments with a single beam system.

As an illustrative example, and without to be bound to a particular example, the array can have 1024 by 768 mirror elements, 1366 by 768 mirror elements, 1920 by 1080 mirror elements, 2560 by 1440 mirror elements, 3840 by 2160 mirror elements, and 7680 by 4320 mirror elements.

In some embodiments, the digital micro-mirror array 228 is implemented as a digital micro-mirror device (DMD) and is a spatial light modulator (SLM) that modulates the amplitude, direction, and/or phase of incoming light. An example of a digital micromirror device is the DLP5500 DLP® 0.5 XGA DMD manufactured by Texas Instruments (Dallas, Tex.). This digital micromirror device is optically efficient at wavelengths in the range 420-700 nm, and the chipset includes an array of 1024*768 aluminum micro-mirrors with binary pattern rates up to 5000 Hz. Another example of the digital micromirror device is the DLP6500 chipset, which has micro-mirror pixels that are 7.6 µm by 7.6 µm in size and are placed 600 nm apart.

In some embodiments, the digital micro-mirror array is integrated in a projection platform.

The DMD-based optical system is able to achieve a write speed of 600 mm²/s, which is competitive with commercial SLS systems. At this write speed, when operating with the spreader system, the µ-SLS system is able to achieve a throughput of 2 cm³/hr or more.

To operate the laser, the pulse energy to sinter a single spot size of diameter D and layer thickness, h in n pulses, via a single pulse, may be expressed as E in Equation 1.

$$E = \frac{\rho \pi D^2 h (C_p(T_f - T_i) + l_f)}{4n\alpha A} \quad \text{(Equation 1)}$$

In Equation 1, $\rho$ is the powder density, $C_P$ is the specific heat, $l_f$ is the heat of fusion, $T_i$ is the initial temperature of the powder bed, $T_f$ is the sintering temperature, R is the reflectivity of the powders, and $\alpha$ is the effective power retention factor of the optical elements (e.g., mirrors, tube lens and objective) in the setup.

And, the average power for each spot may be expressed in Equation 2, where f is the repetition rate.

$$P_{avn} = E_n * f \quad \text{(Equation 2)}$$

Table 1 illustrates an example calculation to determine sintering parameters for copper nanoparticles.

TABLE 1

| | |
|---|---|
| Specific Heat Capacity of Cu($C_p$) (J/kg-K) | 385 |
| $T_i$ (° C.) | 20 |
| $T_f$ (° C.) | 1075 |
| Heat of fusion of Cu (J/kg) | 205000 |
| Melting Point (° C.) | 1085 |
| Density of Copper ($\rho$) (kg/m³) | 8900 |
| Reflectivity (R) | 0.41 |
| Absorptivity | 0.59 |
| Diameter of the spot (D) (µm) | 1.00E−05 |
| Layer Thickness (h) (µm) | 1.00E−06 |

Table 2 illustrates power estimates for different spot sizes and number of pulses to sinter a spot.

TABLE 2

| Spot sizes (µm) | Pulse energy, $E_n$ (nJ) | | Repetition Rate of the laser (KHz) | Average Power, $P_{av_n}$ (mW) | |
|---|---|---|---|---|---|
| | n = 1 | n = 10 | | n = 1 | n = 10 |
| D = 10, h = 1 | 481 | 48.1 | 5 | 2.405 | 0.2405 |
| | | | 20 | 9.62 | 0.962 |
| | | | 100 | 48.1 | 4.81 |
| D = 1, h = 1 | 4.81 | 0.481 | 5 | 0.02405 | 0.002405 |
| | | | 20 | 0.0962 | 0.00962 |
| | | | 100 | 0.481 | 0.0481 |

To operate the laser without damaging the micro-mirrors, the average power density and the temperature of the micro-mirror array is considered. To estimate the energy required to sinter the nanoparticles is used, it is assumed that the particles sinter near (e.g., at 34° C. below) their melting point (which is 1085° F. for copper). In some embodiments, the sintering starts at between 330° C. and 450° C. for certain copper nanoparticles. The sintering temperature for the powders may depend upon a number of factors including, for example, but not limited to, density of the powders, composition, particle size, morphology and sintering time.

Figure 6B:
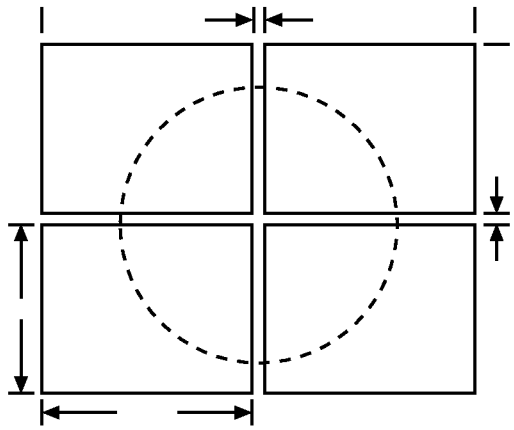
FIG. 6B is an exemplary optical system comprising multiple micro-mirror arrays, in accordance with an illustrative embodiment.

In some embodiments, multiple digital micro-mirror array 228 may be coupled together to form a larger array (e.g., as shown in FIG. 6B). In some embodiments, the larger array facilitates concurrent fabrication of three-dimensional components (e.g., MEMS or microelectronic packaging) on an 11.8-inch wafer or a 17.7-inch wafer.

Figure 7:
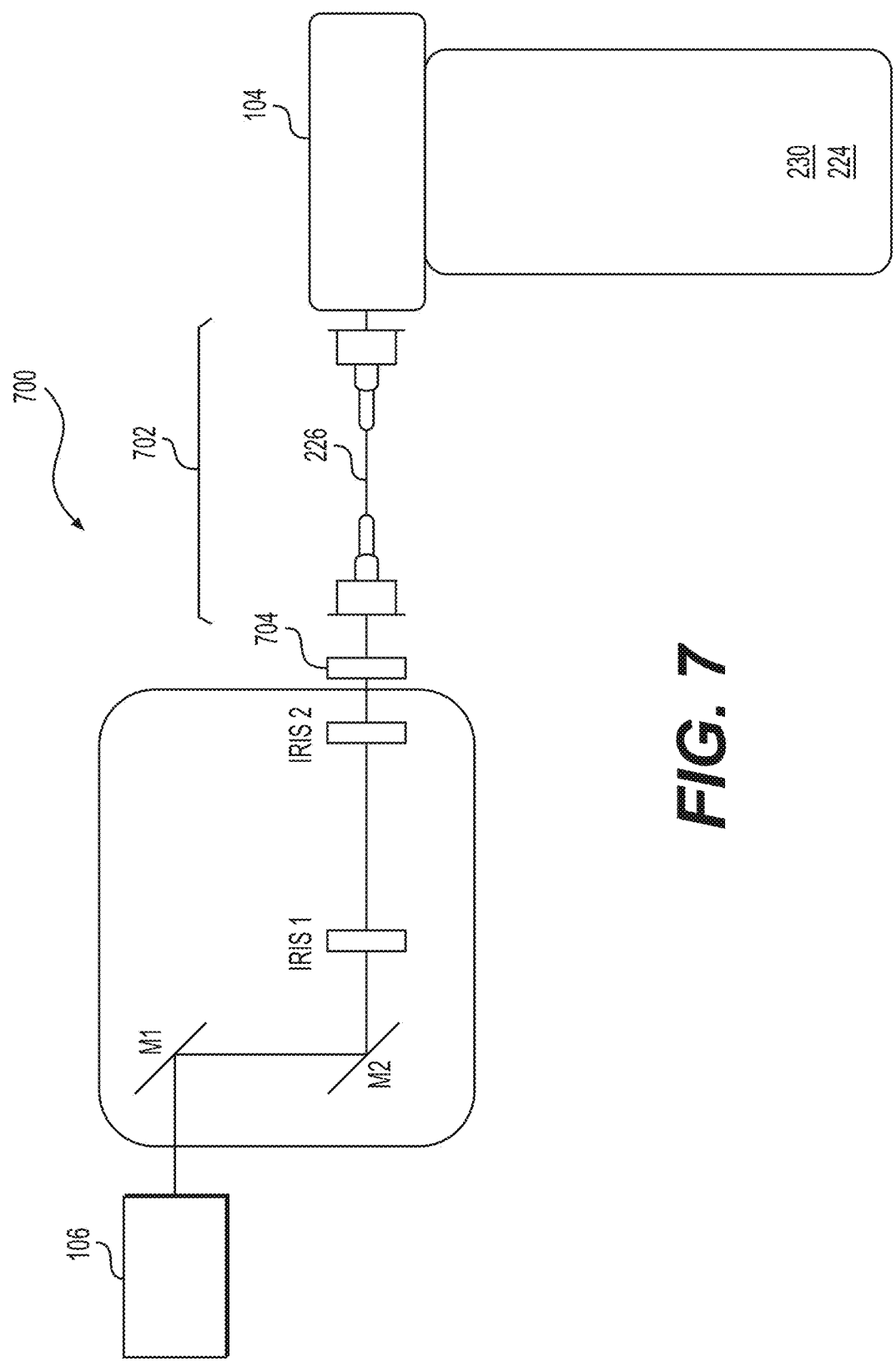
FIG. 7 shows an example schematic of the laser-fiber coupling configuration, in accordance with an illustrative embodiment.

FIG. 7 shows an example schematic of the laser-fiber coupling configuration 700, in accordance with an illustrative embodiment. As shown in FIG. 7, the laser 106 is coupled to the DMD engine 104 via a fiber coupling setup 702 with a mechanical shutter 704 to modulate the exposure time. In some embodiments, a 3-Watt, 532-nm continuous wave laser is used. In other embodiments, a 20-Watt, 532-nm nanosecond laser with a 25 ns pulse duration and 50 kHz repetition rate is used. Other lasers wavelength and power may be used, e.g., depending on the type of material and size of features that are being fabricated. For copper interconnect applications, in some embodiments, the nanosecond laser is employed in the μ-SLS system. Other mirrors and lens may be used to align the laser beam during operation.

Referring still to FIG. 7, in some embodiments, once the incident laser beam is coupled into the DMD, the beam is then expanded via a fisheye lens and directed off the DMD through a 10× infinity corrected long working distance objective lens 224. This allows each 7.6 μm by 7.6 μm pixel in the DMD to be focused down to a spot size of approximately 1 μm. For a DMD chipset with an array of 1920 by 1080 individually addressable micro-mirrors, the incident laser beam can be split into a total of 2,073,600 individual beams with a feature size of 1 μm each (e.g., with a binary pattern rate of up to 5 kHz).

Positioning System

FIGS. 8A, 8B, 8C, 8D, 8E, 8F, 8G, and 8H depict diagrams of an exemplary flexure positioning system (e.g., the XY positioners) in accordance with an illustrative embodiment. The flexure positioning system is configured to precisely move and align at resolutions less than 100 nm (e.g., 40 nm).

FIG. 8A depicts a diagram of a flexure member 802 configured to elastically deform along a pre-defined direction 804. FIG. 8B depicts a diagram of two flexure members (shown as 802*a* and 802*b*) positioned orthogonal to each other. As shown in FIG. 8A, the flexure member is operatively coupled to a voice coil 212 at a first set of mounting 812. When energized, the voice coil 212 displaces the flexure member to elastically deform. The flexure member 802*a* includes a second set of mountings 808 (shown as 808*a*, 808*b*, 808*c*, and 808*d*) to fixably attach to the build stage 112 in which one flexure member (e.g., 802*a*) is fixably attached to the ground portion of the build stage 112 (e.g., where the ground portion is near the coupling to the linear actuator and guide rail) and the second flexure member (e.g., 802*b*) is fixably attached to the top portion of the build stage 112 (e.g., where the top portion is near the coupling to the workpiece and heater element). The mountings 808 are attached to sets of flexure beam (shown as stage-1 beams 814*a*, and stage-2 beams 814*b*). The overall dimension of the flexure member is 17.4" by 17.4" (without the voice coil actuators). The length of each of the stage-1 flexure beams 814*a* is 4" (101.6 mm) and the thickness is 0.5 mm. The length of each of the stage-2 flexure beam 814*b* is 107.85 mm and the thickness is 0.5 mm. As shown, each flexure member 802 includes 8 stage-1 flexure beams, two attached to each second mountings 808; each configured as a cantilever with the external frame 816 of the flexure member. Each of the two stage-1 flexure beams are attached to two stage-2 flexure beams 814*b*. This flexure member can each produce a maximum displacement of about ±1" (a total of 2") in each X- and Y-direction with step size resolution better than a micron.

The flexure member 802*a* includes a third set of mounting(s) 810 to fixably attach to a second flexure member 802*b*.

Figure 8C:
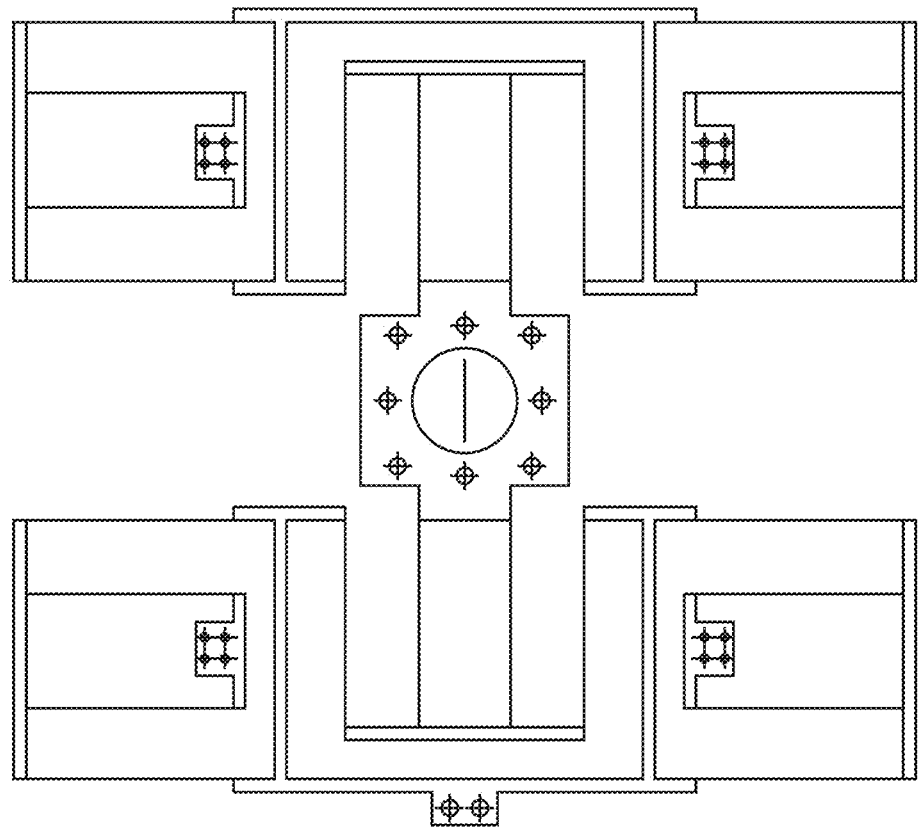

FIG. 8C depicts a diagram of the flexure member with exemplary dimensions shown.

Figure 8D:
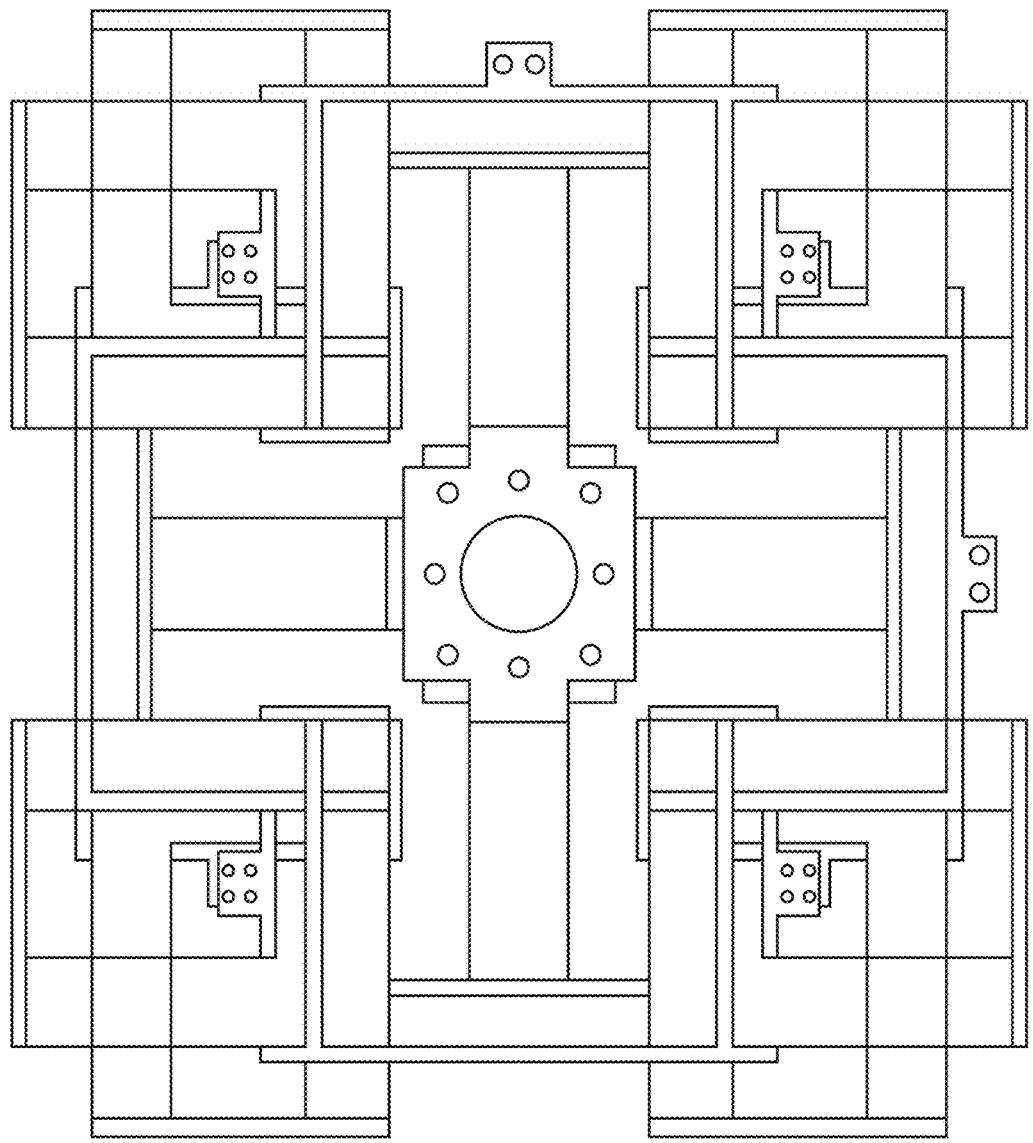

FIG. 8D depicts a top view of the flexure members of FIG. 8B. As shown in FIG. 8D, the first set of mountings 812 to the voice coil includes two holes. The second set of mountings 808 to the build stage includes 4 holes. Four bolts may be installed at each second mountings to provide dynamic stability and prevent moments from forming that may rotate the flexure member.

In some embodiments, the flexure member 802 comprises a long-range, flexure-based, XY nanopositioner configured to align a substrate to the optical sub-system and to scan the substrate under the focused DMD array (which may have a pattern area of 2 mm by 1 mm) with sub-micron accuracy and repeatability.

Figure 8E:
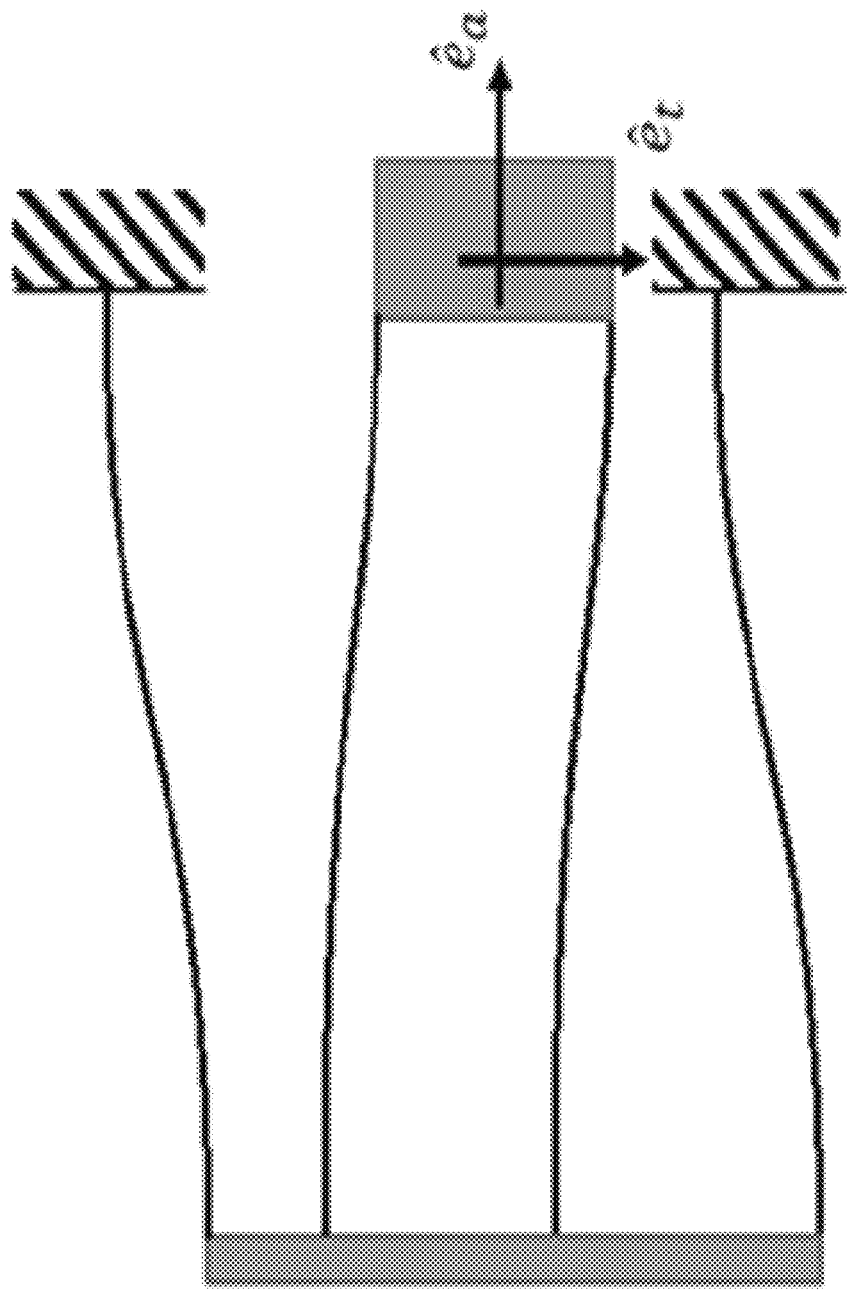

In some embodiments, a stacked double parallelogram flexure mechanisms (DPFMs) and two electromagnetic actuators are used, e.g., to provide a travel range with a resolution of ~2 nm and a repeatability of ~5 nm. Voice coil actuators (VCAs) are capable of delivering frictionless motion along with a fine resolution. The minimum flexure width is defined by the tolerances of the water jet cutter used to produce the flexures and the maximum flexure length is set by the compactness requirement for the overall μ-SLS system. FIG. 8E shows a diagram of a double parallelogram flexure mechanism (DPFM) unit.

Figure 8F:
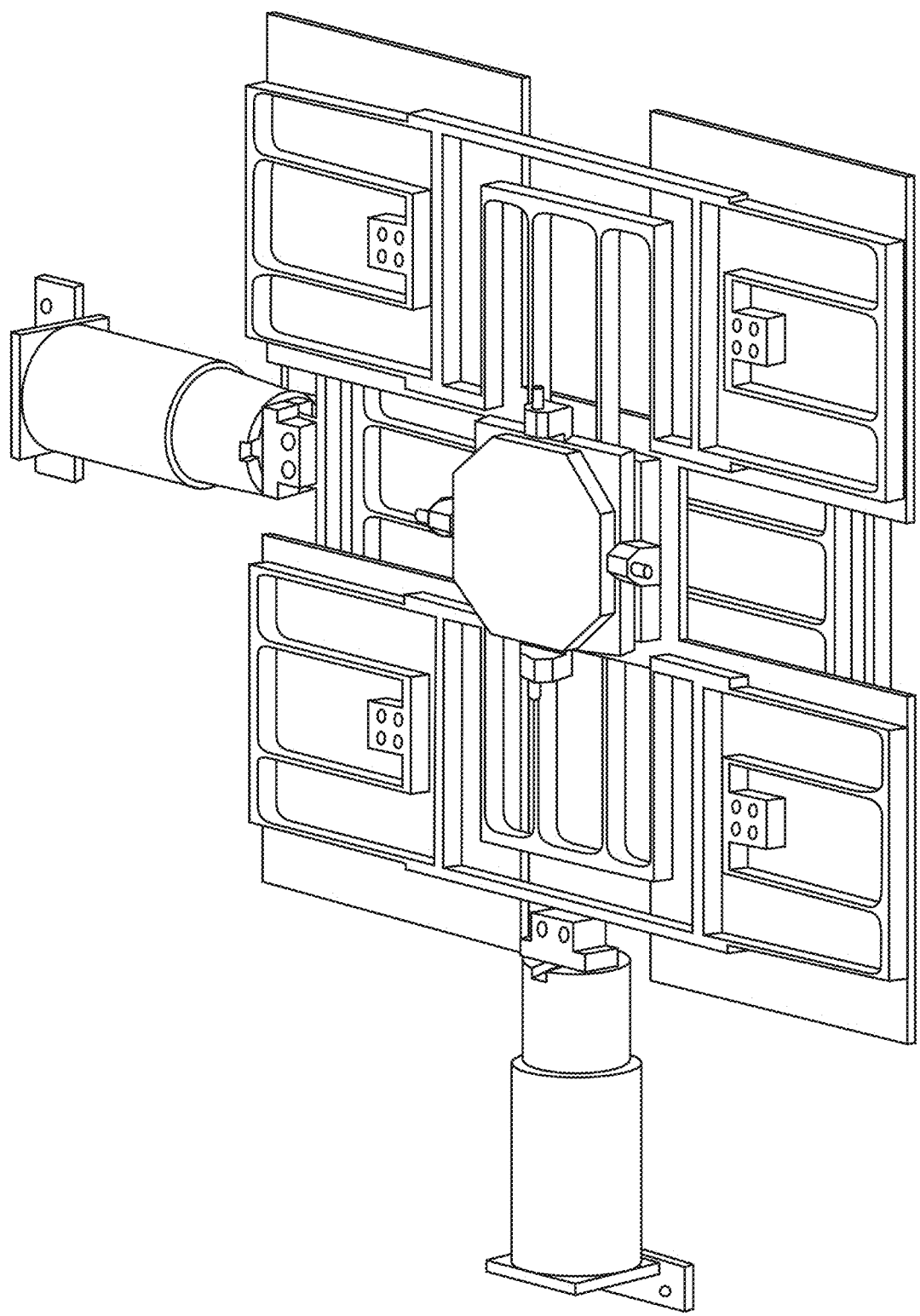

In other embodiments, twelve sets of DPFMs stacked in series and parallel are used to guide the motion of the stage in the x and y directions. FIG. 8F shows a design for the flexure stage which consists of two flexure modules. The output motion is guided by four DPFMs located at the corners of each module and orthogonal motion is allowed by the two inside DPFMs on each module. One module is mounted orthogonally on the top of the other module in order to produce a parallel-kinematic stacked structure with degrees-of-freedom in both the x and y directions. This modular design facilitates a reduction in the cost of both building and maintaining the stepper system. The stiffness of the stage can be modeled as a combination of six springs in parallel for each direction and hence, the stiffness value is given by Equation 3.

$$K_x = K_y = 6 * \frac{12*E*I}{L^3}; = \frac{6*E*b*h^3}{L^3} \qquad \text{(Equation 3)}$$

Figure 8G:
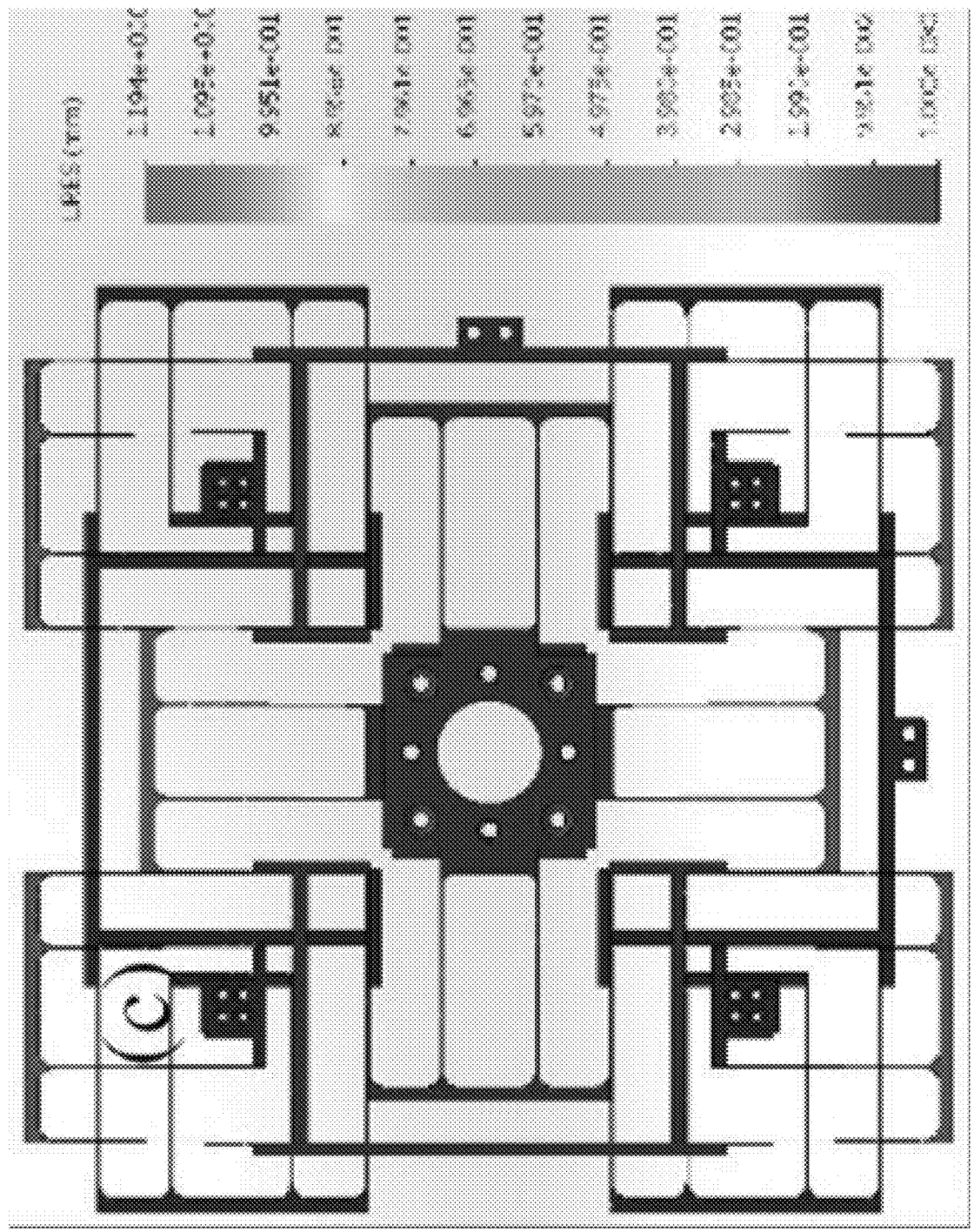

FIG. 8G shows a static FEA simulation of the design of FIG. 8E with an input of $F_x=1N$. The overall stiffness of the flexures in the stepper system was measured to be ~840 N/m which is sufficient to ensure good position control during stepping.

Figure 8H:
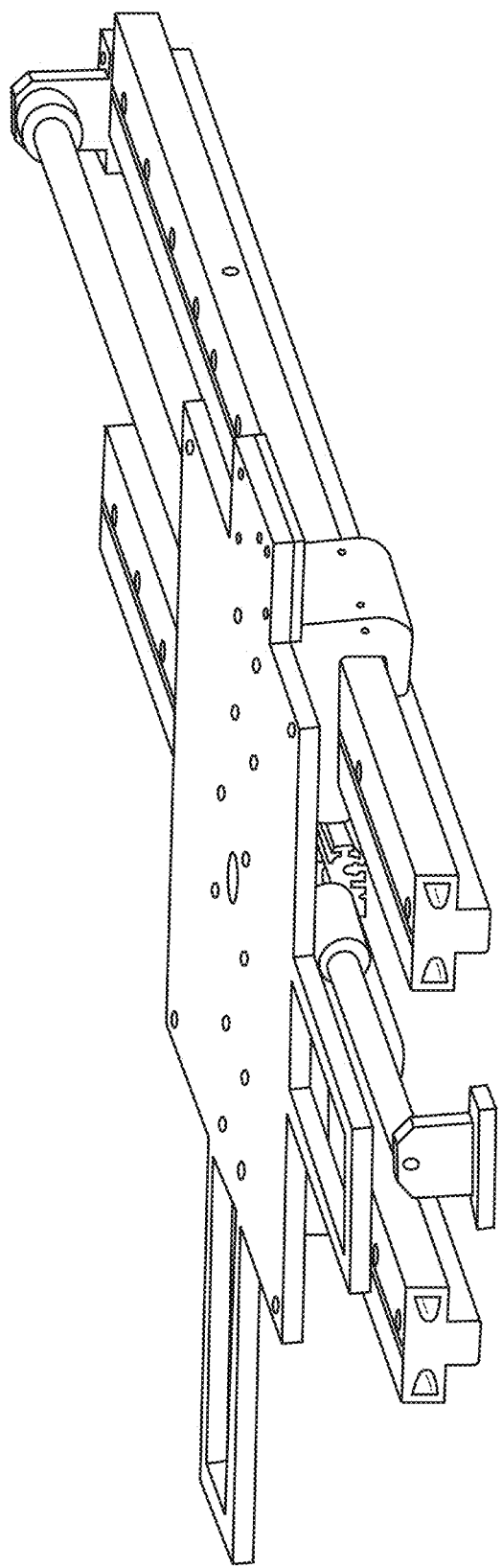

FIG. 8H shows the XY nanopositioning stage on an air bearing sub-assembly. The Global travel between the sintering station and the slot die coating station is facilitated, in some embodiments, using a set of air bearing linear guide rails and a direct-drive linear servo motor. The setup, in some embodiments, is also used to scan the vacuum chuck under the slot die coating system during the coating operation. Air bearings have very low friction and minimal hysteresis which helps to ensure that vacuum chuck can be repeatability moved between the slot die coating system and the optical system. The motion of the global travel system is measured, in some embodiments, using a set of interferometry probes with sub-nanometer resolution. Because of the low friction and high resolution of the position measurement, the global travel system is capable, in some embodiments, of achieving sub-10 nm repeatability. Without wishing to be bound to a particular theory, registration errors between each coating operation needs to be minimized in order ensure that the patterns on each coating layer are in the correct position relative to each other. The use of air bearings and a linear servo motor also helps to ensure that little vibration is transmitted to the stage during travel which is a factor in determining the coating uniformity during the slot die coating operation.

Exemplary Micro-SLS Test Rig

FIGS. 9A, 9B, 9C, 9D, 9E, and 9F depict exemplary components of the micro-SLS system.

Figure 9A:
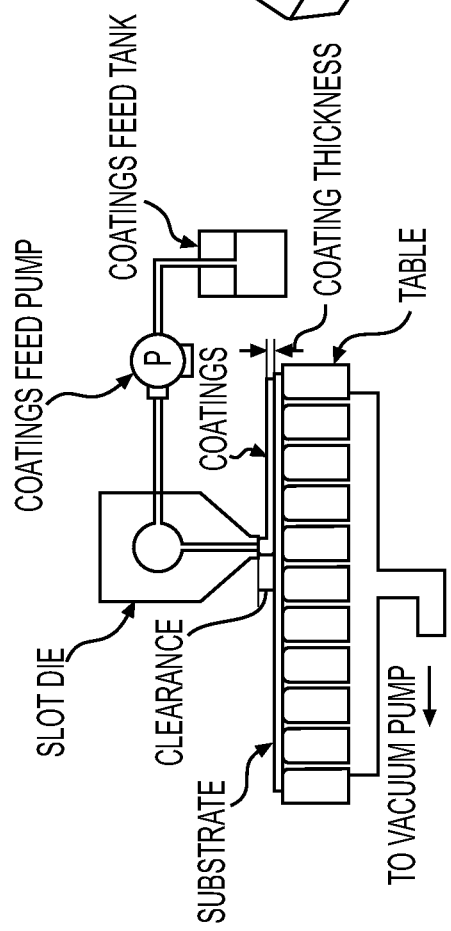
FIGS. 9A, 9B, 9C, 9D, 9E, and 9F depict exemplary components of the micro-SLS system.

FIG. 9A illustrates an example slot die coater as discussed, for example, in relation to FIGS. 4A and 4B. In slot die coating, the coating fluid is forced through a narrow slit down onto a substrate that is moving relative to the coating head. In slot die coating, the coating fluid is forced through a narrow slit down onto a substrate that is moving relative to the coating head. The wet film thickness is controlled by the flow rate, coating width, and speed. The resulting dry layer thickness, d, for a given ink can be expressed with Equation 4.

$$d = f * \frac{c}{v * w * \rho} \quad \text{(Equation 4)}$$

where f is the flow rate, v is the coating speed, w the coating width, c is the concentration of the solids in the ink, and ρ the density of the material in the final film.

The slot die coating system, in some embodiments, is configured to coat multiple nanoparticle layers on top of each other without disturbing the layer below the current coating layer. The slot die coating system, in some embodiments, is configured to coat organic or inorganic liquids on flexible or rigid substrates with excellent coating uniformity (typically ±3% or better). The slot die coating system, in some embodiments, is configured to deposit nanoparticle layer thicknesses of anywhere between 20 nm and 150 μm depending on the coating conditions. In some embodiments, the slot die coating system is configured to coat a wide range of process materials with varying viscosities which may be important for the multi-materials processing functionality. In some embodiments, the slot die coating system has a high efficiency with over 95% material utilization and is easily adapted for roll-to-roll processing (e.g., in large scale assembly of FHE devices).

Figure 9B:
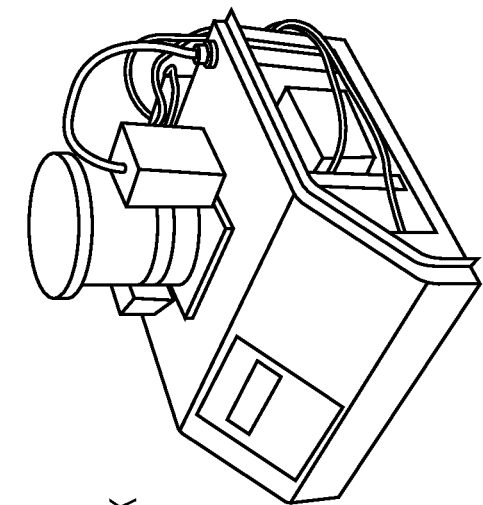

FIG. 9B illustrates an example vacuum system. To reduce or prevent oxidation, low vacuum may be used. In some embodiments, the time to reach a pressure of 10-5 mbar is about 15 minutes.

Figure 9F:
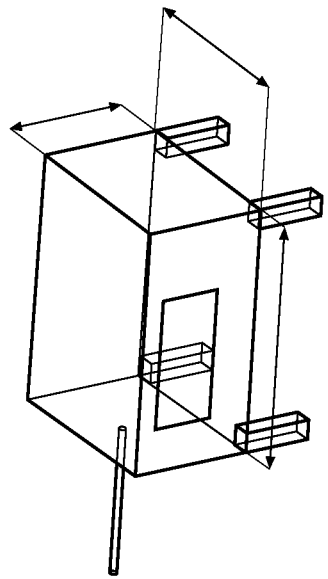
Figure 9E:
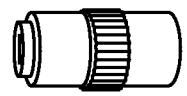
Figure 9D:
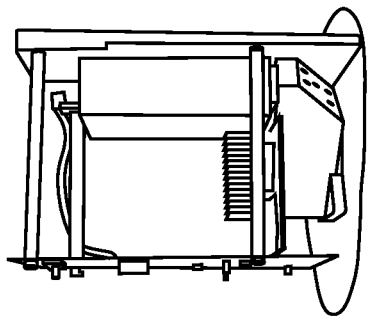
Figure 9C:
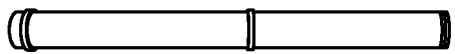

FIGS. 9C, 9D, and 9E illustrate example optical components of the optical systems. In FIG. 9E, an example objective lens is shown. The objective lens is a 10× infinity corrected long WD objective lens. In FIG. 9C, a micromirror array assembly that may be used as the optical system is shown. In FIG. 9D, a tube lens is shown that may be used to connect the micro-mirror array assembly to the objective lens. FIG. 9F depicts a diagram of an environment chamber for housing the micro-SLS system.

Sintering Experiment

Figure 10:
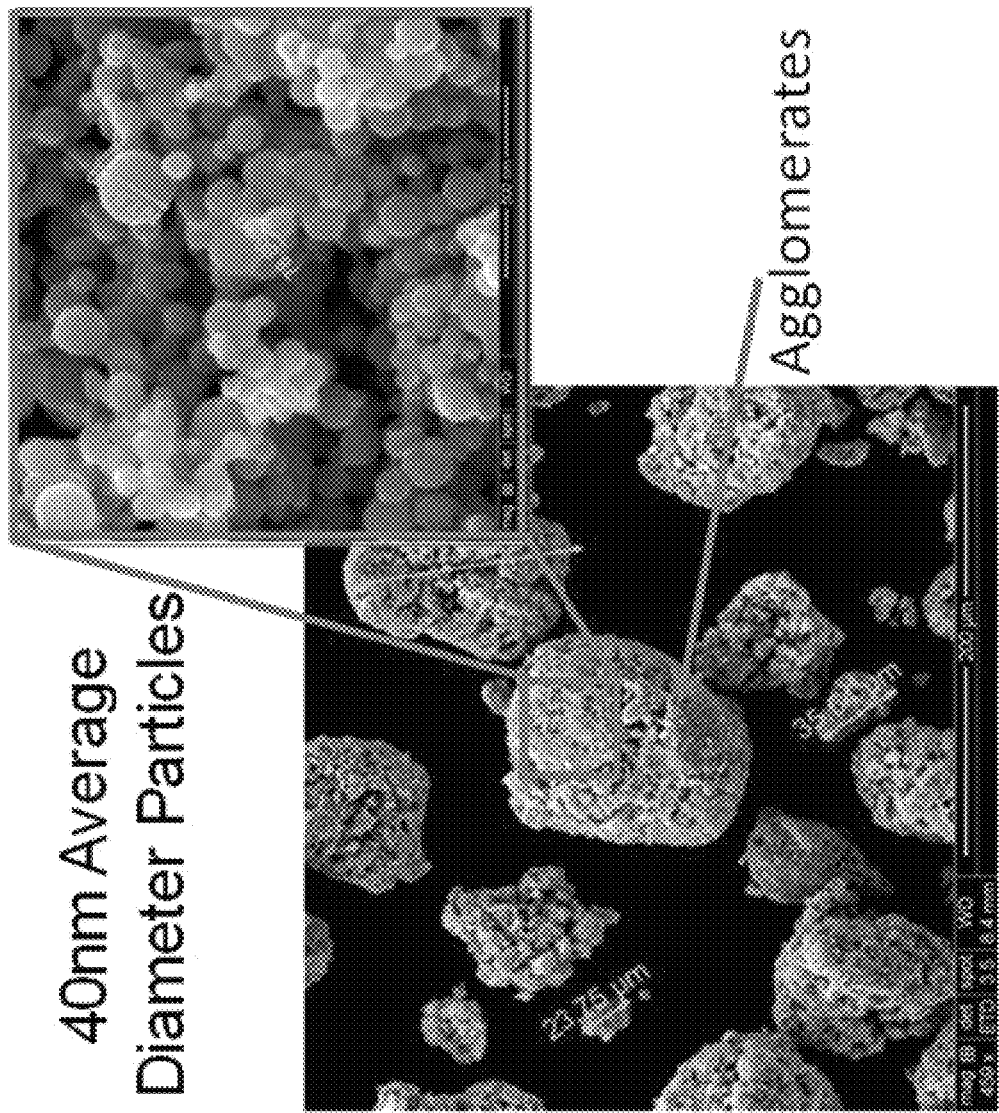
FIG. 10 depicts an image of agglomerated particles in powder bed.

Initial tests performed to spread dry powders resulted in large agglomerates of the nanoparticles forming in the powder bed, as shown in FIG. 10. Without wishing to be bound to a particular theory, these large agglomerates form due to the high van der Waals interactions present between nanoparticles. To reduce the van der Waals interactions and thereby reduce or eliminate the agglomeration problem, the dry nanopowders are replaced with nanoparticle inks. Solvents in the nanoparticle inks help to reduce van der Waals interactions during the spreading process and allow for a smooth, uniform layer of nanoparticles to be spread onto the build surface, as shown in FIG. 11.

Figure 11:
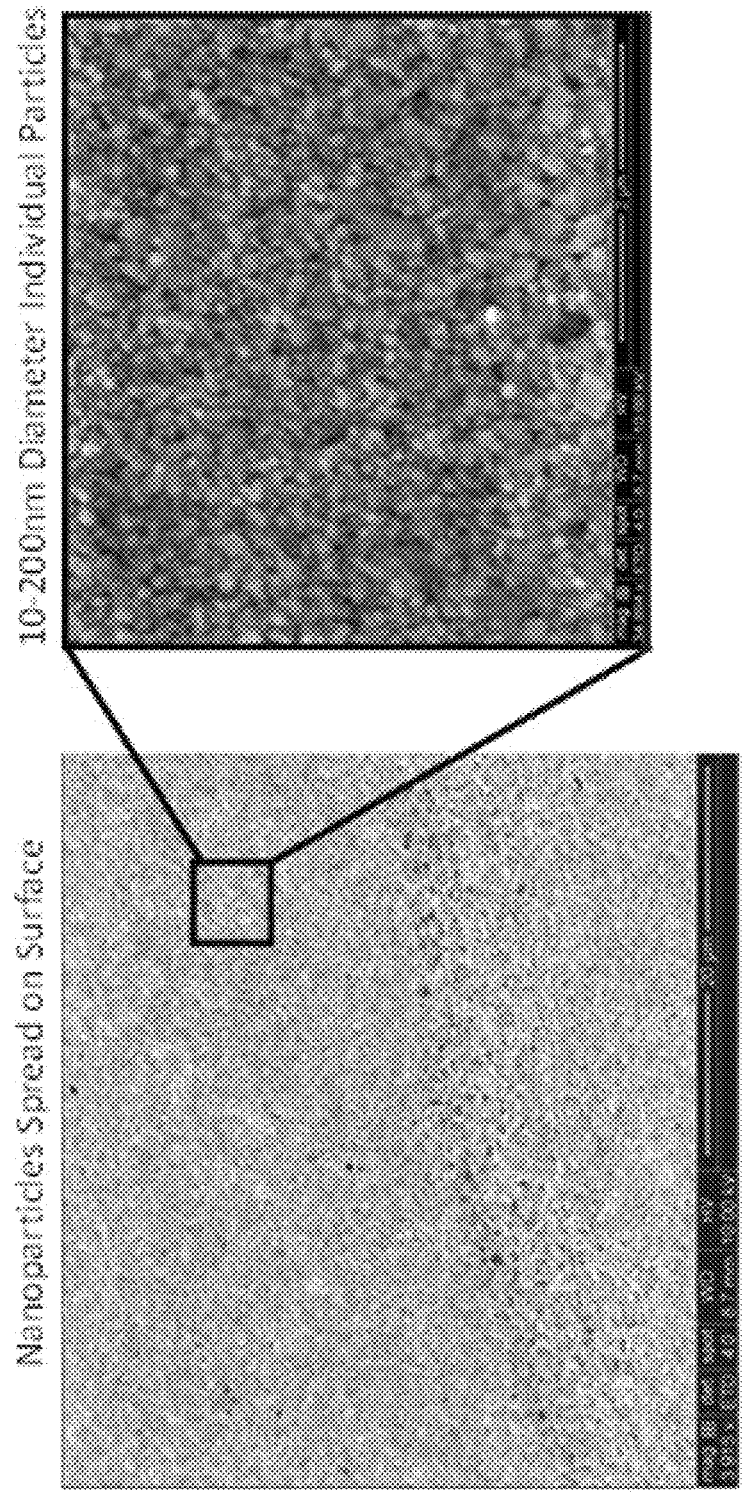
FIG. 11 illustrates nanopowder spreading from nanoparticle inks showing uniform distribution and good uniformity.

FIG. 11 illustrates Nanopowder spreading from nanoparticle inks showing uniform distribution and good uniformity. When a thin layer (<1 μm) of nano-ink is spread on the build platform in the vacuum chamber, the solvent in the ink evaporates in less than 10 seconds. This leaves a dry powder on the build surface that can be sintered to form a part. This drying time can be further reduced by adding a heating element to the build platform to drive off the organic solvents more quickly. This heating element has the additional benefit of reducing the temperature gradient between the sintered and the un-sintered areas, which helps to reduce warpage and thermal stresses in the part.

To validate Equation 1, several copper nanoparticle samples were sintered using a 25 fs (femtosecond) titanium-sapphire laser with an 800 nm wavelength. This equation (i.e., model) does a relatively good job estimating the power required to sinter a sample for a given spot size, layer thickness, and repetition rate. Based on this equation (i.e., model), a 20-W laser with a wavelength of 532 nm, a pulse width of 25 ns, and a repetition rate of 100 kHz is determined, as one embodiment, among others, for the μ-SLS system.

To scan the optical system over large areas, the heated sample holder is attached to an X-Y nanopositioning stage. This nanopositioning stage is capable, in some embodiments, of maintaining scan speeds of up to 120 mm/s over a large area while achieving a position accuracy of better than 100 nm. The current setup utilizes a step-and-flash system where an image is formed on the DMD and that image is transferred to the particle bed. The entire powder bed is then moved over by the width of the image and the process is repeated. The scan speed can be increased by implementing a scrolling scheme on the DMD so that the image on the DMD is coordinated with the position of the DMD relative to the powder bed. This type of scheme could help to increase the throughput of the system by more than an order-of-magnitude.

Sintering Results

Various experiments and simulations have been conducted, and observations are noted herein.

Differential Scanning Calorimeter Results

In order to determine the temperatures at which the copper nanoparticles in the μ-SLS system will sinter, the nanopowders were placed into a differential scanning calorimeter (DSC) and heated to their melting point.

Figure 12:
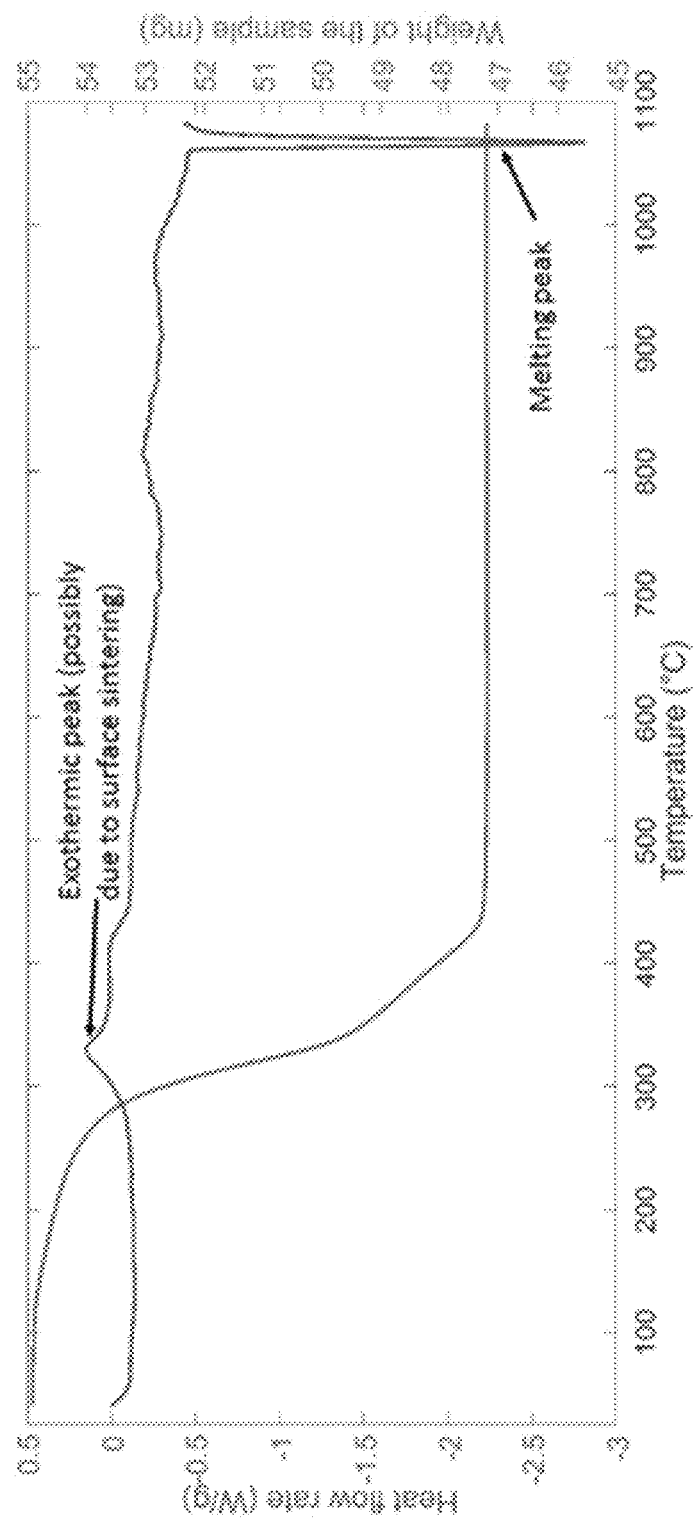
FIG. 12 depicts a diagram illustrating differential scanning calorimeter measurement of the sintering of copper nanoparticles.

FIG. 12 depicts a diagram illustrating differential scanning calorimeter measurement of the sintering of copper nanoparticles. As can be seen in FIG. 12, there is an exothermic peak at around 330° C., the peak indicating the onset of the sintering process. This hypothesis of onset of sintering was validated by the SEM images (shown in FIG. 14D) which were taken just before and after the exothermic peak at 330° C. FIG. 12 illustrates sintered spots on powder bed with exposure times from 5 ms to 500 ms. From the SEM images shown in FIGS. 14C and 14D, it was observed that the particles were no longer individually identifiable and necking between the particles had started creating dumbbell-shaped particles. This is very similar to the morphology of an initial stage in the typical sintering process. Sintering continues up to about 1080° C. where the melting of the copper nanoparticles is observed. This shows that the copper nanoparticles can be effectively sintered over a wide range of temperatures. Also, in the DSC experiment, a 10.4% mass loss is observed when the sample is heated from room temperature to 350° C. This mass loss is the result of the removal of organic contamination from the surface of the copper particles. These organic contaminants are left over from the organic solvents in the nanoparticle inks after the inks are dried. This indicates that all of the remnants of the organic solvents in the nanoparticle inks can be removed during the sintering process. Therefore, the presence of solvents in the inks should not affect part quality.

Validation of Sintering Model

Figure 13:
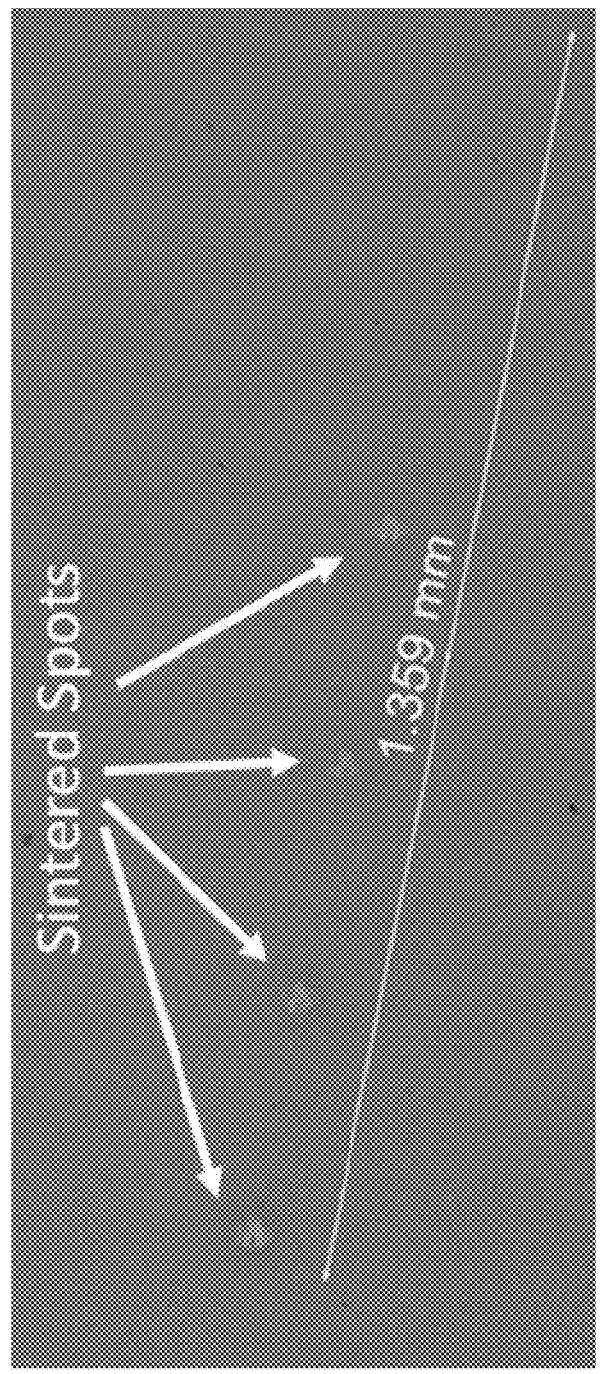
FIG. 13 illustrate experimental results of spots sintered with different powers and exposure times.

To test the process of nanoparticle sintering with ultrafast lasers and to validate our sintering model, sintering experiments were performed on an 800 nm thick layer of copper powder with different exposure powers and times. Some of the results of this experiment are shown in FIG. 13 where spots sintered with different powers and exposure times are clearly visible. Based on our sintering model, it was predicted that it would take 693 µW to sinter an 800 nm thick layer of copper nanoparticles with an exposure time of 5 ms and a spot size of 30 µm.

Figure 14B:
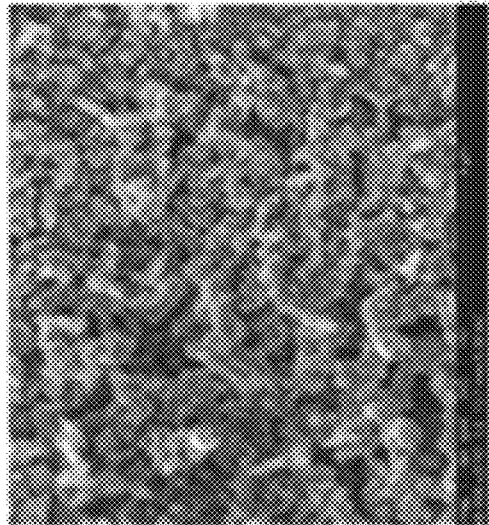
FIGS. 14A, 14B, 14C, and 14D illustrate a comparison of morphology of a copper sample before and after heating.
Figure 14D:
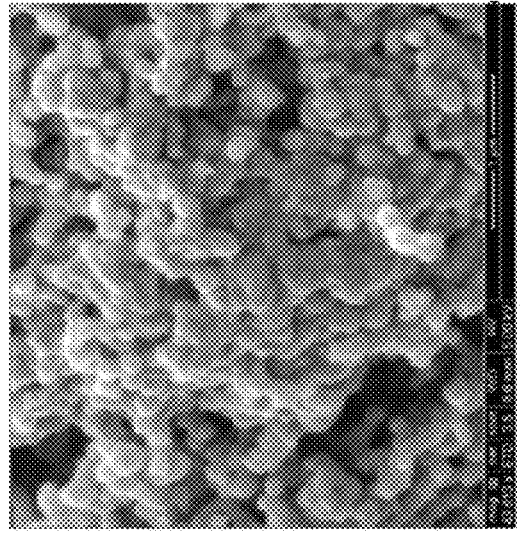
Figure 14A:
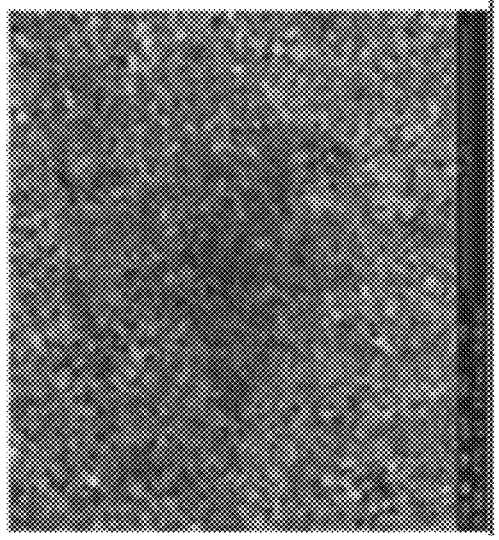
Figure 14C:
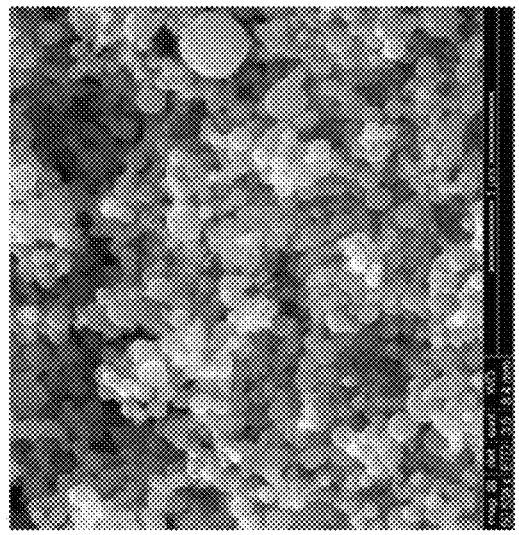

FIG. 14, comprising FIGS. 14A, 14B, 14C, and 14D, illustrates a comparison of morphology of a copper sample before and after heating. FIGS. 14A and 14B show the morphology of the nanoparticle surface before and after exposure to a 720 µW nanosecond laser with a 5 kHz repetition rate for 5 ms. In FIGS. 14C and 14D, the nanoparticles were heated to 350 degree C.

As shown in FIGS. 14C and 14D, necking and fusing of the copper nanoparticles is clearly visible in the exposed sample whereas none can be observed in the un-sintering sample. This is a clear indication that sintering is taking place at this power level and sintering time. When the laser power was lowered below 700 µW and the same exposure time was maintained, no sintering was observed in the sample. This indicates that the simple sintering model derived in the previous section does a good job estimating the power required to sinter a part and can be relied on for sizing the laser in the µ-SLS system.

Additional Validation Experiments

In another aspect, to gain a better understanding of the sources of variation in the µ-SLS process (or FS µ-SLS process), e.g., to implement statistical process control on the µ-SLS tool (and the FS µ-SLS tool), process modeling and control is applied. Implemented metrology tools discussed herein (and others) are used to measure variations in feature size, sintering temperature, layer thickness, and layer uniformity of the sintering and coating processes. This information, in some embodiments, is used to evaluate the reliability and repeatability of the µ-SLS process. In some embodiments, these experimental measurements are combined with the theory based process modeling tools, e.g., those developed and discussed, to set control limits for statistical process control. The theory based models look at the sintering problem at both the particle level in order to understand the basic science of the sintering operation and the part level to make predictions about the part shape and quality. At the particle level, light interacts with the nanoparticles is examined, heat transferred within the µ-SLS powder bed is also examined, and the sintering together of the nanoparticles to form a part is also examined. At the part level, sintering models are developed at the particle level and make continuum models that can be used to predict how parts form. In some embodiments, these modeling facilitates the estimation of the part quality based on the process inputs and measured processing parameters.

Figures 14E, 14F, 14G:
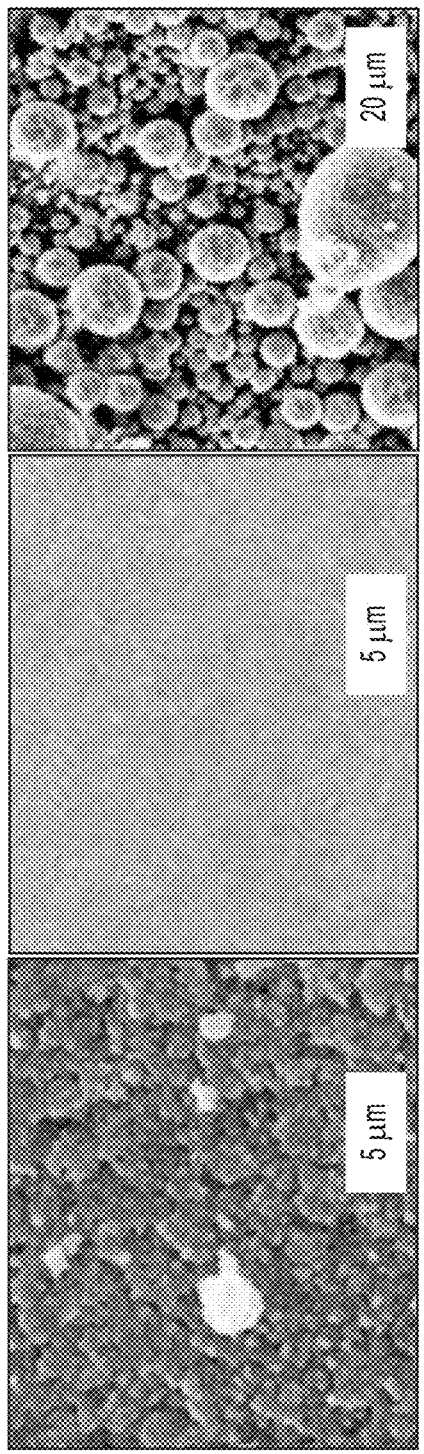
FIG. 14E shows an SEM image of a nanoparticle powder bed with unsintered particles after being heated to 400° C.
FIG. 14F shows an SEM image of a nanoparticle powder bed of FIG. 14E with a smooth sintered surface after heating to 450° C.
FIG. 14G shows an SEM image of a nanoparticle powder bed of FIG. 14F with the balling up of Cu particles after heating beyond melt point.
Figure 14H:
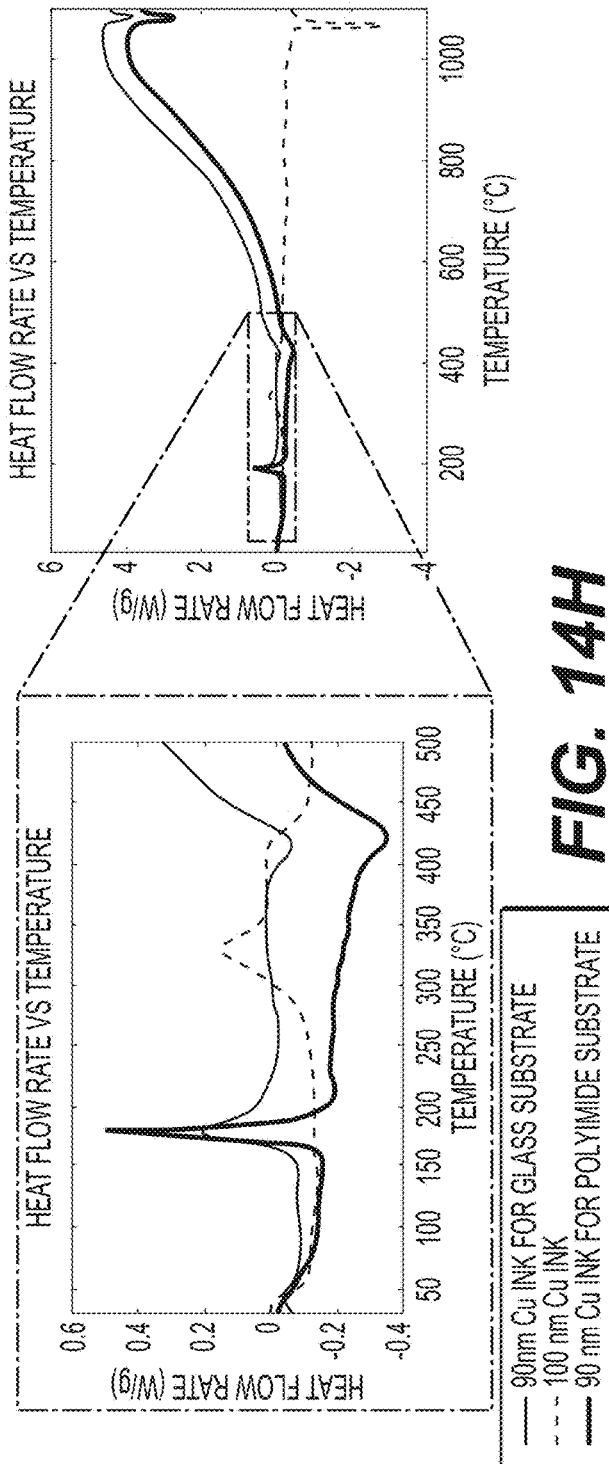
FIG. 14H shows DSC curves that shows the onset of sintering at between 300 and 500° C. for NP inks.

FIGS. 14E, 14F, 14G, and 14H illustrates nanoparticle sintering mechanisms, in accordance with an illustrative embodiment. Specifically, FIG. 14E shows unsintered particles after being heated to 400° C. FIG. 14F shows a smooth sintered surface after unsintered particles are heated to 450° C. FIG. 14G shows balling up effects of copper particles after being heated beyond its melt point. FIG. 14H shows a differential scanning calorimeter (DSC) curve showing onset of sintering at between 300° C. and 500° C. for nanoparticle inks.

In order to investigate the mechanism of nanoparticle sintering, various copper NP inks were placed in a differential scanning calorimeter (DSC) and were heated to different temperatures to observe their sintering properties. As shown in FIG. 14H, when the nanoparticle powder beds are heated to 400° C., individual nanoparticles are still observable, but when the temperature is increased to 450° C. the NPs begin to fuse together, indicating that sintering starts to take place at temperatures well below the melting point of copper (1080° C.). This finding is also supported by the heat flow rate measured in the DSC, which shows clear sintering peaks for the NP inks at temperatures between 300° C. and 500° C., depending on the exact type of copper NP ink used. The morphology of the nanoparticles sintered in the DSC is very similar to the morphology of the NPs sintered using a laser source. However, when the NP inks are heated to above their melting point, it is observed that the inks are balling up to form agglomerated NPs, which is not observed in the laser sintered samples. Without wishing to be bound to a particular theory, these preliminary results, therefore, suggest that the µ-SLS process is driven by a nanoscale diffusion mechanism as opposed to a melting mechanism.

Effects of Substrate on µ-SLS Process

Figure 14J:
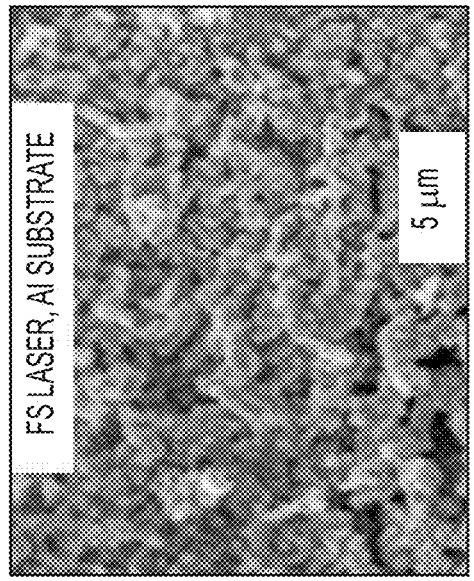
FIGS. 14I and 14J respectively show SEM images of sintered nanoparticle films created by femtosecond laser on a glass substrate and an aluminum substrate.
Figure 14I:
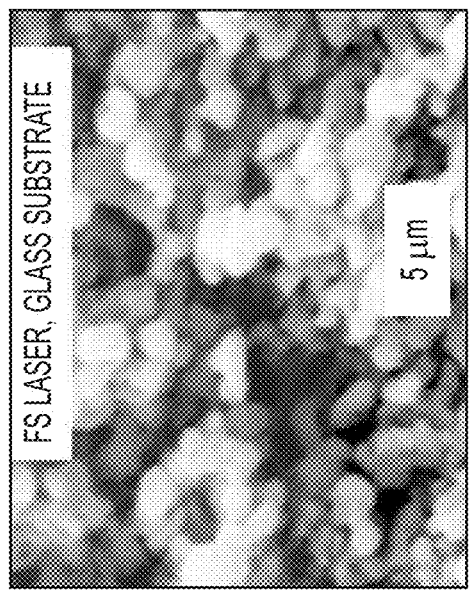
Figure 14L:
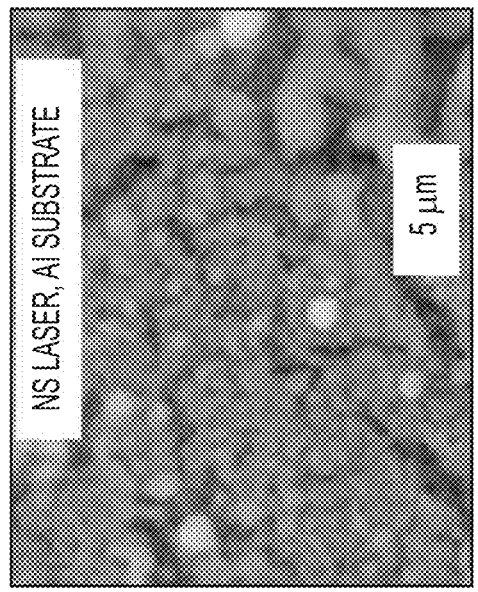
FIGS. 14K and 14L respectively show SEM images of sintered nanoparticle films created by nanosecond laser on a glass substrate and an aluminum substrate.
Figure 14K:
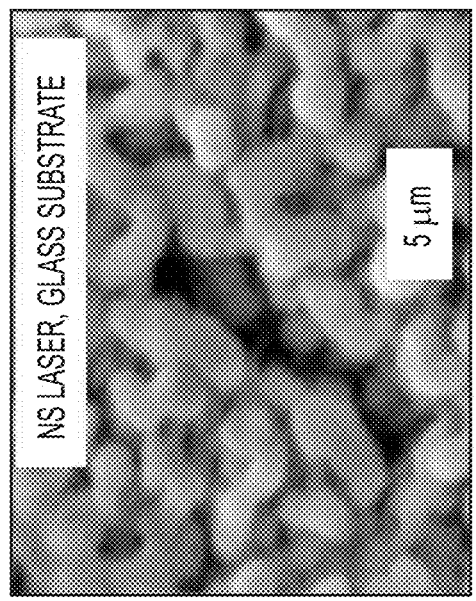

To determine the effect the substrate has on the µ-SLS process, laser sintering experiments were conducted on substrates with different thermal conductivities. FIGS. 14I and 14J respectively show SEM images of sintered nanoparticle films created by femtosecond laser on a glass substrate and an aluminum substrate. FIGS. 14K and 14L respectively show SEM images of sintered nanoparticle films created by nanosecond laser on a glass substrate and an aluminum substrate. It is observed that better sintered results are achieved with the low thermal conductivity glass substrates than with the high thermal conductivity Al substrates. Without wishing to be bound to a particular theory, this indicates that thermal boundary conditions have a significant effect on sintering. Sintering experiments have also been performed on polyimide substrates with similar results to the glass substrates. No damage of the any of the substrates was observed in the µ-SLS process.

Figures 14M, 14N:
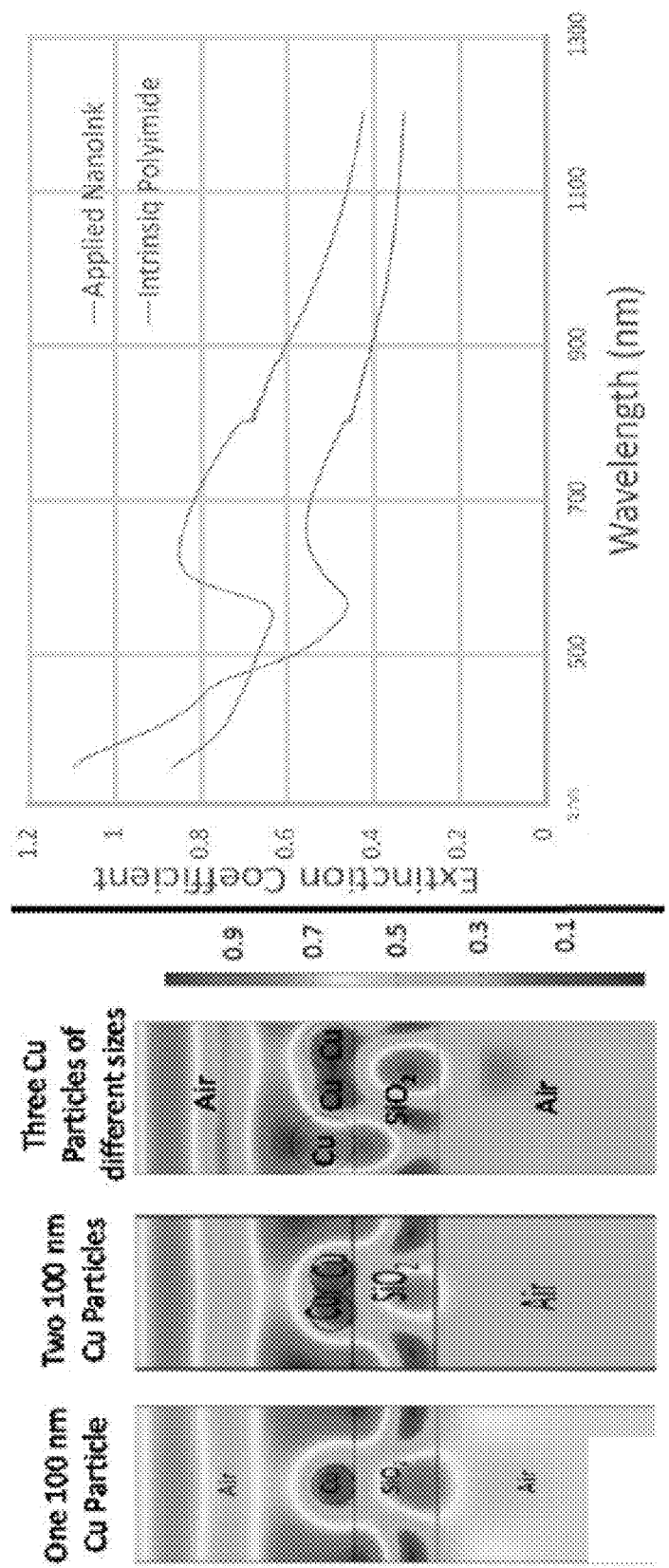
FIG. 14M shows simulation results of local field enhancement of near-field thermal emission for different nanoparticle configurations.
FIG. 14N shows plot of extinction coefficient vs. wavelength measured for two Cu—NP inks using a spectrophotometer.

Optical Properties of Nanoparticles: Nanoscale light scattering and plasmonic effects play significant roles in the penetration depth and the extinction/absorption coefficients of µ-SLS powder beds. In order to determine the magnitude of these effects in the µ-SLS process, a simulation was set up with one, two, or three nanoparticles on a glass substrate to see how the local electric field enhancement of the near-field thermal emission is affected by the size and location of the NPs. FIG. 14M shows simulation results of local field enhancement of near-field thermal emission for different nanoparticle configurations. As can be seen from FIG. 14M, the position, number, and size of the NPs all have a significant effect on the local field enhancement. Without wishing to be bound to a particular theory, therefore, when the μ-SLS process is modeled, the distribution of the nanoparticles in the powder bed should be considered as well as their size and shape.

In addition to simulations of the optoelectrical properties of NPs, experimental measurements have been performed to determine the absorption and extinction coefficients of the actual μ-SLS powder beds. First, very thin layers of NP inks were spin-coated onto glass substrates and then a spectrophotometer was then used to measure the transmission and absorption spectra of the samples, allowing the extinction and absorption coefficients to be calculated for each NP ink. FIG. 14N shows plot of extinction coefficient vs. wavelength measured for two Cu—NP inks using a spectrophotometer. As can be seen in FIG. 14N, the extinction coefficient reaches a local minimum near the 530 nm which allows the 532 nm laser used in the μ-SLS system to penetrate deeply into the copper NP powder bed. Without wishing to be bound to particular theory, this is important because it help to ensure that the copper parts get sintered all the way through and ensures good connection between sintered layers.

Figure 14Q:
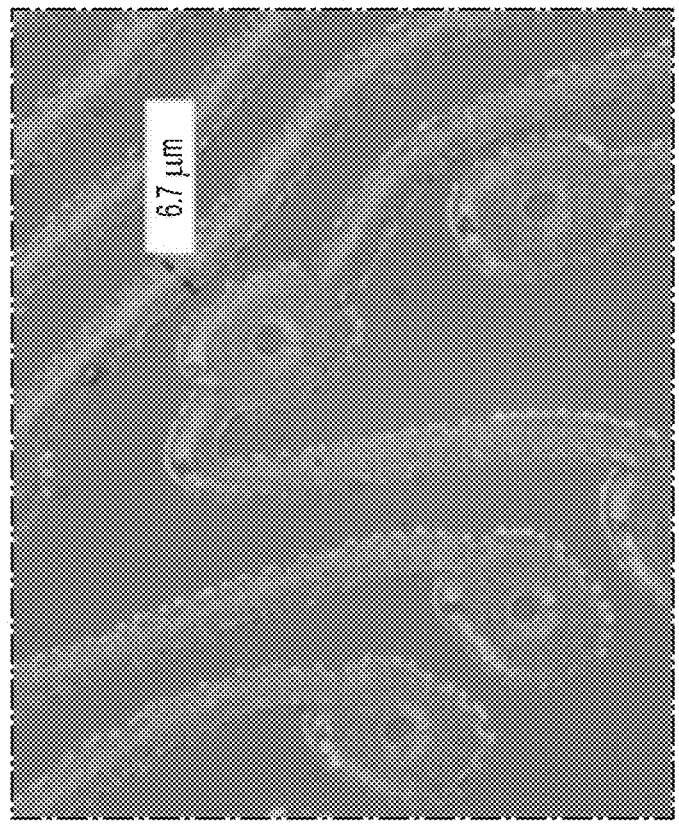
FIGS. 14O, 14P, and 14Q shows image of Cu NP inks before (14O) and after (14P and 14Q) washing away unsintered nanoparticles as described in Zenou et al., "Laser sintering of copper nanoparticles," J. Phys. D Appl. Phys, 27, p. 025501 (2014).
Figure 14O:
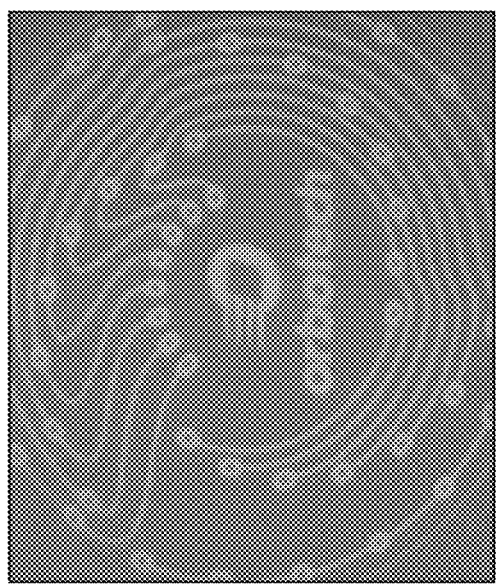
Figure 14P:
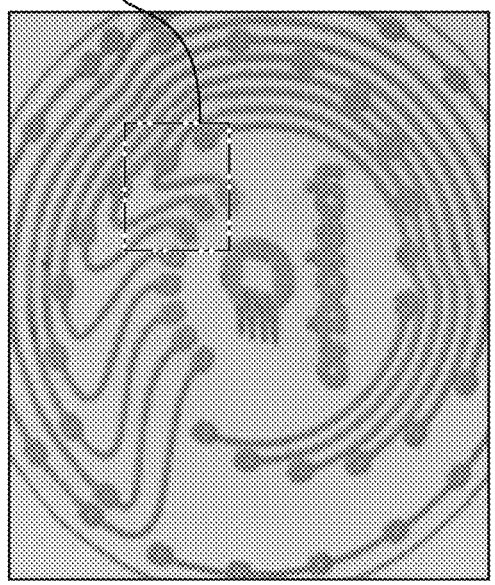

Nanoparticle Washing: Studies with Cu nanoparticle inks (described in Zenou et al., "Laser sintering of copper nanoparticles," J. Phys. D Appl. Phys, 27, p. 025501 (2014)) have shown that, through a combination of solvent selection and spray pressure, it is possible to remove the un-sintered nanoparticles and only leave the sintered structures on the substrate surface. FIGS. 14O, 14P, and 14Q shows image of Cu nanoparticle inks before (14O) and after (14P and 14Q) washing away unsintered nanoparticles as described in Zenou et al., "Laser sintering of copper nanoparticles". In FIGS. 14O, 14P, and 14Q, a copper nanoparticle layer is selectively sintered and then washed to remove the un-sintered nanoparticles from the surface. The detailed cutout shows that even small traces remain intact during this spray washing process. Overall, no damage to the electrical traces was observed during the spray wash procedure. These results demonstrate the feasibility of incorporating a spray wash system directly into the μ-SLS tool.

Figures 14R, 14S:
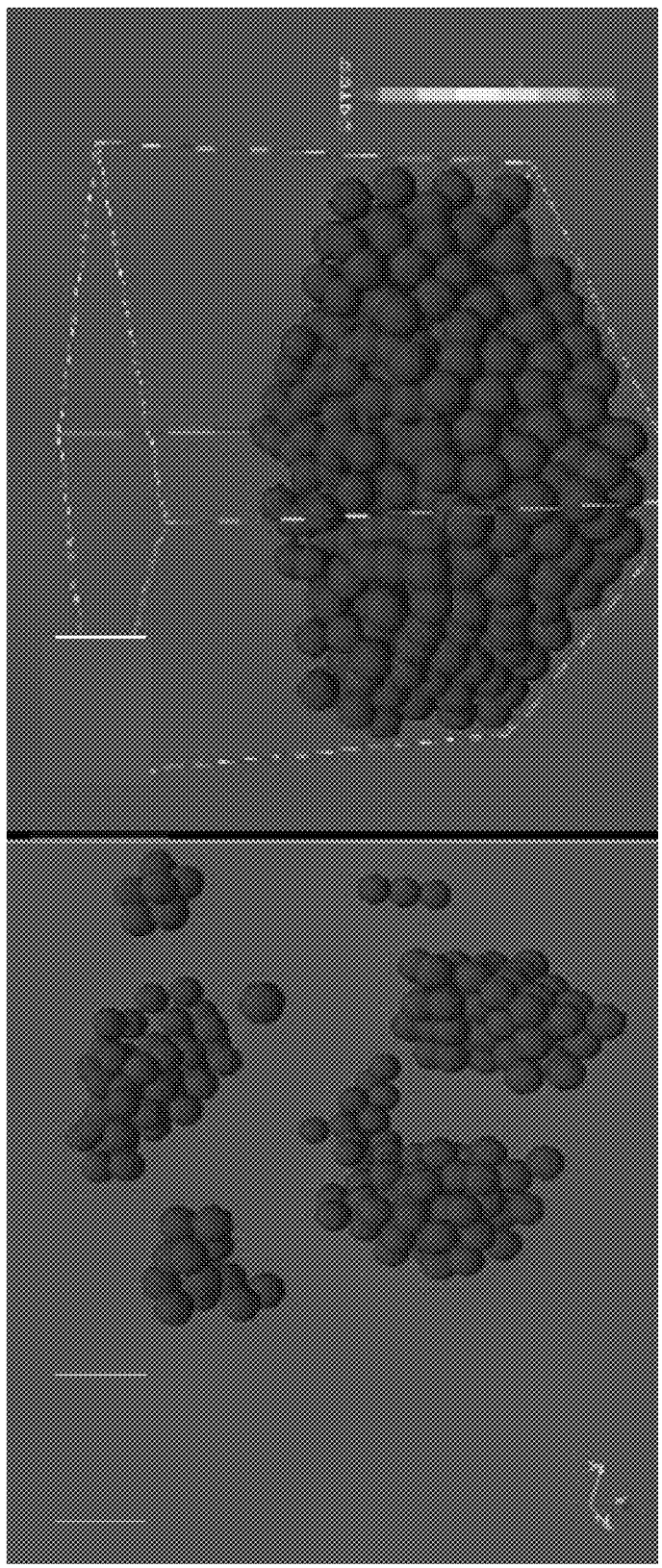
FIG. 14R shows simulation results of dry powder bed when van der Waals forces are dominant.
FIG. 14S shows simulations results of same powder bed of FIG. 14O when inks are used to reduce van der Waals effects.

Process Modeling:

The first step in being able to model the μ-SLS process is to accurately model the formation of the NP powder bed. In a study, powder bed formation was simulated using the Multiphase Flow with Interphase eXchanges (MFIX) software. In a simulation, nanoparticles are placed within a box at random locations and with random initial velocity vectors. Each particle in the box is assigned a diameter using a probability function based on the measured particle size distribution of the NPs. The particles are then released and allowed interact with each other in order to dissipate their initial energy and settle into a steady state formation. Once the steady state particle bed has been achieved, the results from the MFIX simulations can be imported into a finite element solver. Agglomeration of particles within the MFIX framework is simulated by adjusting the strength of the van der Waals interactions between the particles. With strong van der Waals interactions, agglomerates form as seen in FIG. 14R. This is analogous to the case where dry powders are used and NPs are free to agglomerate (FIG. 14G). Without wishing to be bound to particular theory, by adjusting the strength of these van der Waals interactions, it is possible to tune the size of the agglomerates formed. Additional description of process modeling is described in U.S. Provisional Appl. No. 62/316,666, which is incorporated by reference herein in its entirety.

When the NPs are dispersed in an ink, the van der Waals interactions are significantly reduced by the presence of surfactants. Therefore, to simulate powder bed formation when NP inks are used, very low van der Waals forces are used. The result is low agglomeration within the simulated powder bed, as shown in FIG. 14S. This matches well with the experimental results for the slot die coating deposition system in FIGS. 11 and 14F.

Overall, this data demonstrates the ability to accurately model the formation of μ-SLS powder beds using discrete element simulations which is a key first step in being able to make part processing predictions.

Figures 14T, 14U, 14V, 14W:
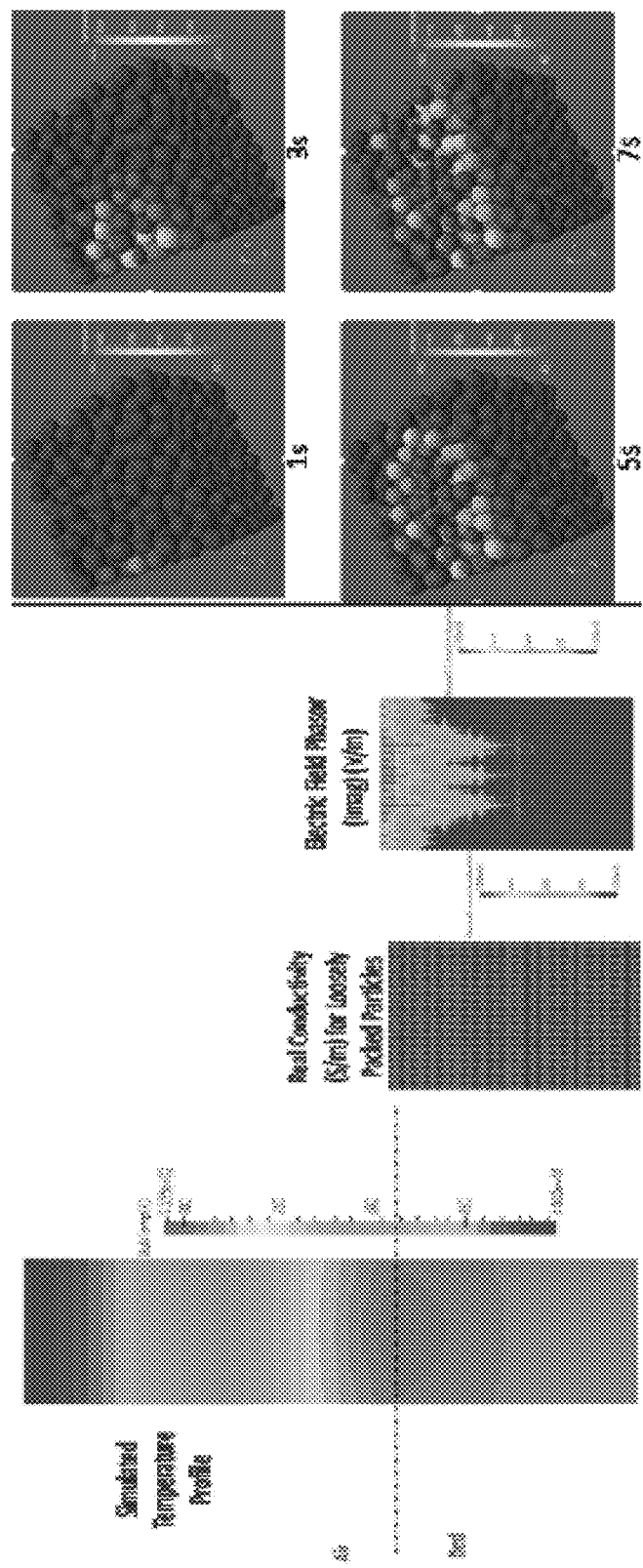
FIGS. 14T, 14U, 14V, 14W show a plot of simulated electric field phasor (FIG. 14V) and temperature profile (FIG. 14T) for loosely packed particle bed with uniform particle distribution showing good heat transfer into the bulk of the powder bed (FIG. 14W). Temperature distribution in a disordered powder bed as a laser is scanned over its surface, showing very little heat transfer into the bulk of the powder bed when near-field effects not considered.

Another process in determining how nanoparticles sinter in the μ-SLS bed is determining how heat is transferred within the bed. In order to determine the mechanisms for heat transfer within the bed, several particle-level simulations of the sintering process were set up with both well-ordered and disordered nanoparticle distributions (FIGS. 14T, 14U, 14V, and 14W). FIGS. 14T, 14U, 14V, 14W show a plot of simulated electric field phasor (FIG. 14V) and temperature profile (FIG. 14T) for loosely packed particle bed with uniform particle distribution showing good heat transfer into the bulk of the powder bed (FIG. 14W). Temperature distribution in a disordered powder bed as a laser is scanned over its surface, showing very little heat transfer into the bulk of the powder bed when near-field effects not considered.

In the ordered NP simulation of the laser heating of the NP powder bed where the effects of convection, conduction, and both far-field and near-field radiation are considered in modeling heat transfer within the NP bed, a temperature drop of only ~100° C. was observed over the first 10 layers (~1 μm) of the NP bed. A similar simulation of a disordered system that did not consider the effects of near-field radiation found that heat did not penetrate more than two NP layers into the bed. This data strongly suggests that near-field radiation plays a key role in nanoparticle sintering and that if near-field radiation effects are not included in the simulation it is more difficult for heat to penetrate into the NP bed.

Figure 14X:
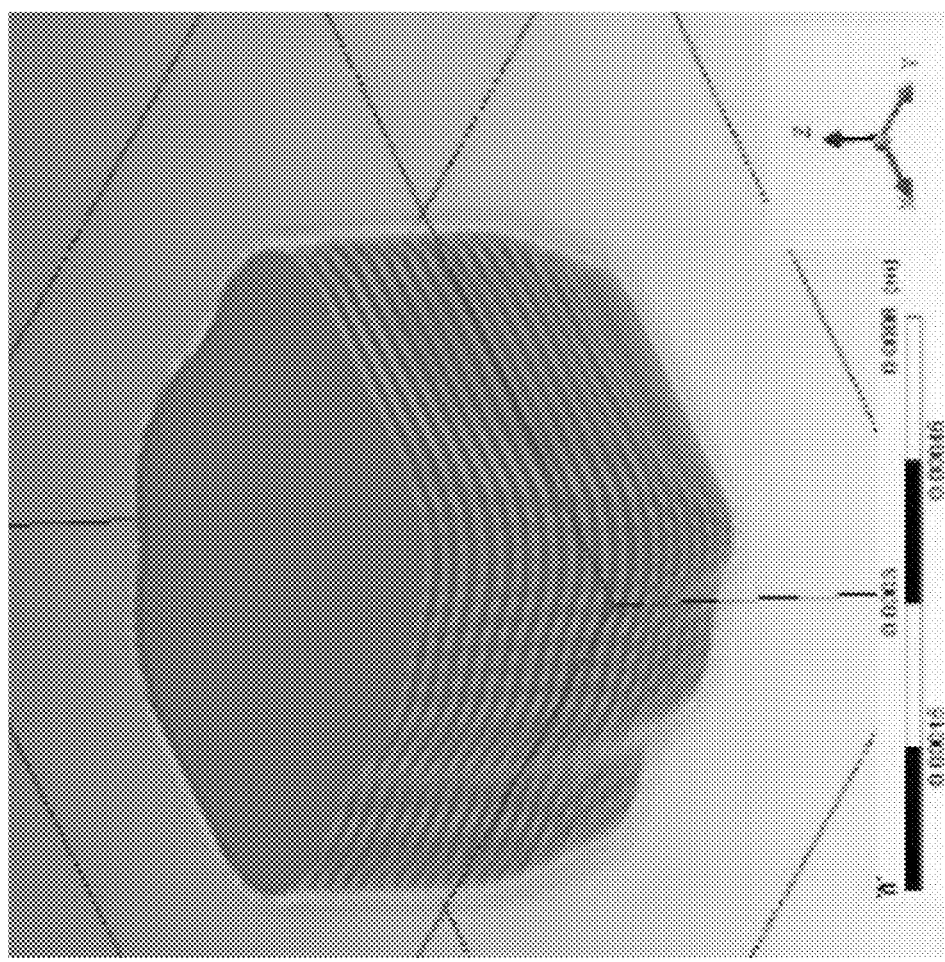
FIG. 14X is a diagram showing continuum simulation of a SLS part.

The final step in being able to model the μ-SLS process is being able to model full part formation. This is done by taking the optical, thermal, and sintering properties generated for the powder bed from the particle level simulations and experimental results and importing them into a continuum level simulation of the part fabrication process. Continuum models use volume-averaged bulk material properties to represent the behavior of the powder within each finite volume of the simulation, thus avoiding the need to resolve every powder particle individually. Without wishing to be bound to particular theory, this is advantageous since powder particles are several orders of magnitude smaller than the part being produced, which makes resolving individual particles computationally infeasible when simulating a full-part build. FIG. 14X shows a part that has been built using this continuum modeling approach. This part was formed by scanning the laser in a square pattern for each build layer. The model shows that a square part is not produced by the square pattern because the longer laser dwell times near the corners of the part over exposes those portions of the part. This is a well-known experimental result. These results support the feasibility of combining particle-level simulations and measurements with continuum models in order to be able to generate accurate part geometry and part property predictions.

Figure 15:
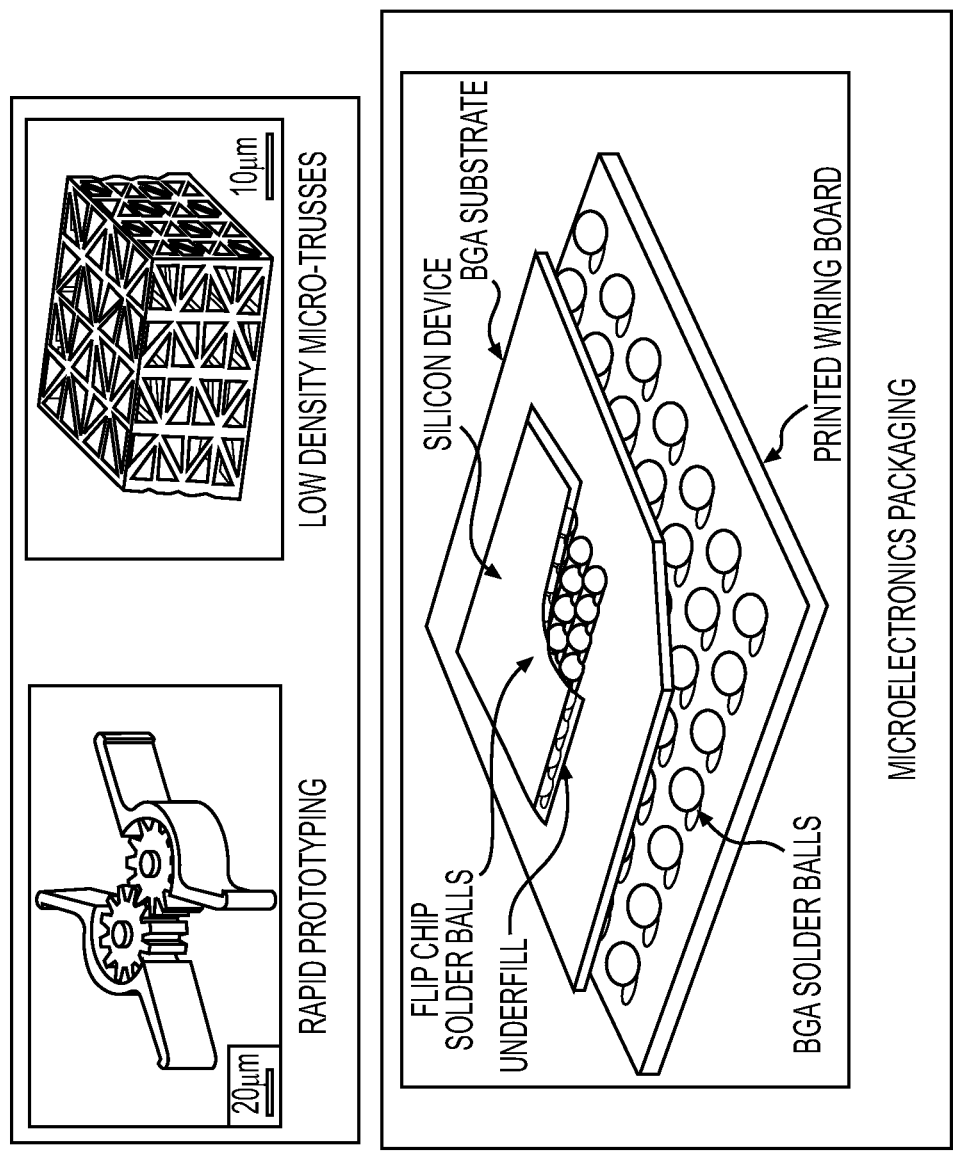
FIG. 15 depicts exemplary three-dimensional parts that may be fabricated with the exemplified micro-SLS systems and the methods.

FIG. 15 depicts exemplary three-dimensional parts that may be fabricated with the exemplified micro-SLS systems and the methods.

Example Computing Device

Figure 16:
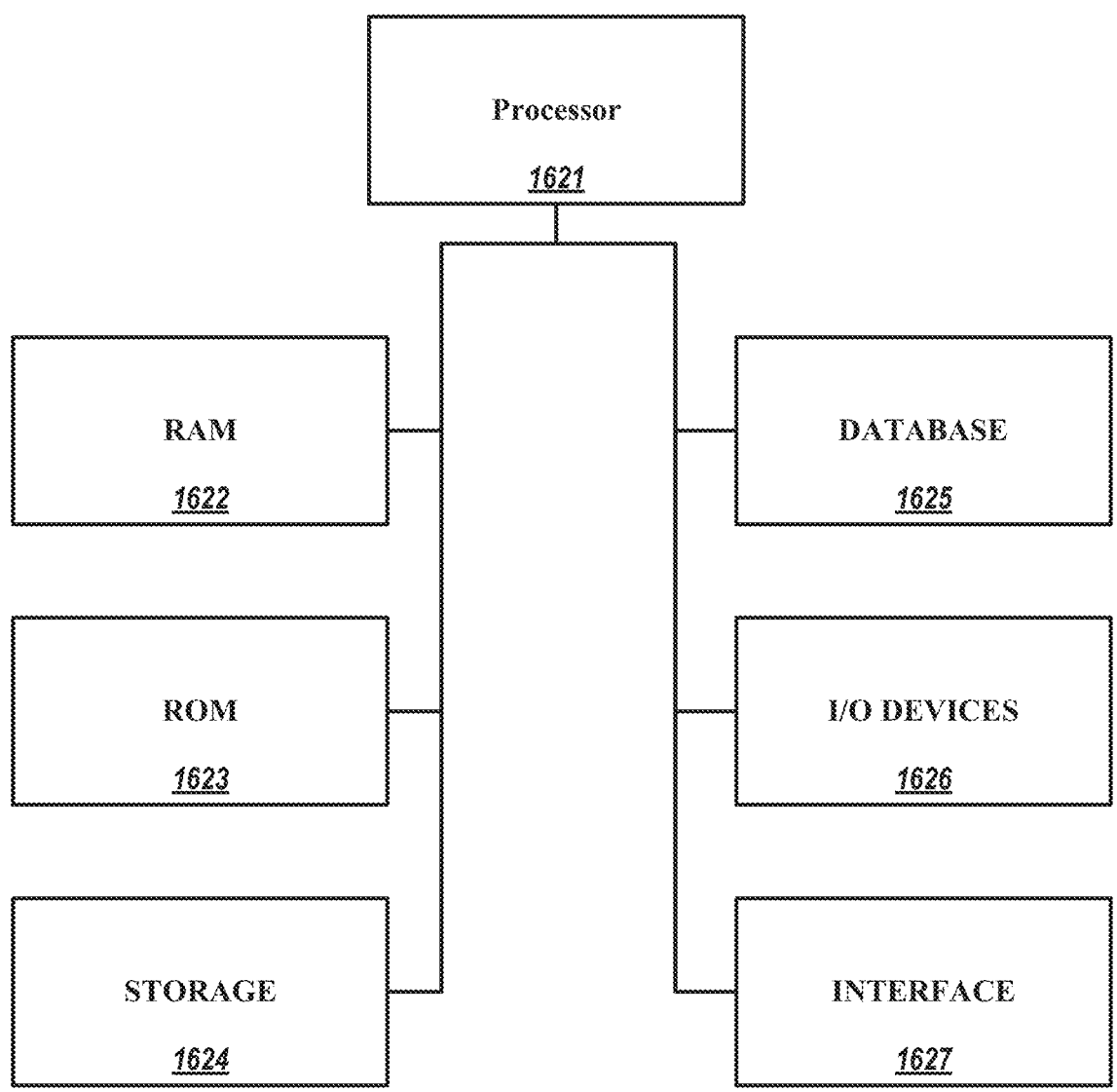
FIG. 16 illustrates an exemplary computer that can be used for configuring hardware devices in an industrial automation system.

FIG. 16 illustrates an exemplary computer that can be used for configuring hardware devices in an industrial automation system. As used herein, "computer" may include a plurality of computers. The computers may include one or more hardware components such as, for example, a processor 1621, a random access memory (RAM) module 1622, a read-only memory (ROM) module 1623, a storage 1624, a database 1625, one or more input/output (I/O) devices 1626, and an interface 1627. Alternatively and/or additionally, controller 1620 may include one or more software components such as, for example, a computer-readable medium including computer executable instructions for performing a method associated with the exemplary embodiments. It is contemplated that one or more of the hardware components listed above may be implemented using software. For example, storage 1624 may include a software partition associated with one or more other hardware components. It is understood that the components listed above are exemplary only and not intended to be limiting.

Processor 1621 may include one or more processors, each configured to execute instructions and process data to perform one or more functions associated with a computer for indexing images. Processor 1621 may be communicatively coupled to RAM 1622, ROM 1623, storage 1624, database 1625, I/O devices 1626, and interface 1627. Processor 1621 may be configured to execute sequences of computer program instructions to perform various processes. The computer program instructions may be loaded into RAM 1622 for execution by processor 1621. As used herein, processor refers to a physical hardware device that executes encoded instructions for performing functions on inputs and creating outputs.

RAM 1622 and ROM 1623 may each include one or more devices for storing information associated with operation of processor 1621. For example, ROM 1623 may include a memory device configured to access and store information associated with controller 1620, including information for identifying, initializing, and monitoring the operation of one or more components and subsystems. RAM 1622 may include a memory device for storing data associated with one or more operations of processor 1621. For example, ROM 1623 may load instructions into RAM 1622 for execution by processor 1621.

Storage 1624 may include any type of mass storage device configured to store information that processor 1621 may need to perform processes consistent with the disclosed embodiments. For example, storage 1624 may include one or more magnetic and/or optical disk devices, such as hard drives, CD-ROMs, DVD-ROMs, or any other type of mass media device.

Database 1625 may include one or more software and/or hardware components that cooperate to store, organize, sort, filter, and/or arrange data used by controller 1620 and/or processor 1621. For example, database 1625 may store hardware and/or software configuration data associated with input-output hardware devices and controllers, as described herein. It is contemplated that database 1625 may store additional and/or different information than that listed above.

I/O devices 1626 may include one or more components configured to communicate information with a user associated with controller 1620. For example, I/O devices may include a console with an integrated keyboard and mouse to allow a user to maintain a database of images, update associations, and access digital content. I/O devices 1626 may also include a display including a graphical user interface (GUI) for outputting information on a monitor. I/O devices 1626 may also include peripheral devices such as, for example, a printer for printing information associated with controller 1620, a user-accessible disk drive (e.g., a USB port, a floppy, CD-ROM, or DVD-ROM drive, etc.) to allow a user to input data stored on a portable media device, a microphone, a speaker system, or any other suitable type of interface device.

Interface 1627 may include one or more components configured to transmit and receive data via a communication network, such as the Internet, a local area network, a workstation peer-to-peer network, a direct link network, a wireless network, or any other suitable communication platform. For example, interface 1627 may include one or more modulators, demodulators, multiplexers, demultiplexers, network communication devices, wireless devices, antennas, modems, and any other type of device configured to enable data communication via a communication network.

Flexible Substrate Micro-Selective Laser Sintering Technology

In another aspect, a direct write, microscale selective laser sintering (μ-SLS) system 1800 is disclosed that is capable of writing 3D metal structures, in some embodiments, with feature sizes of approximately 1-μm on a variety of substrates (polymers, dielectrics, semiconductors, and metals) for fabricating a 3D interconnect for the packaging of high I/O count, IC silicon die on flexible substrates—and, thus, compatible with back end of line (BEOL) wafer fabrication processes. The flexible-substrate μ-SLS incorporates, to the exemplified μ-SLS as described in relation to FIGS. 1, 2A, and 2B, material deposition/removal functionalities.

In some embodiments, the exemplified μ-SLS system facilitates the low-cost and mask-less fabrication of multilayer redistribution layers (RDL) with design features comparable to the electroplating process for wafer level chip scale device packaging (WL-CSP) on flexible substrates. The exemplified μ-SLS process technology is a feasible approach for low-cost and high-volume manufacturing of IC interconnect structures on flexible substrates for the emerging low-cost packaging needs of internet of things (IoT) and wearables markets. The μ-SLS fabrication technology, in some embodiments, is used in the rapid prototyping of flexible electronic devices and for the eventual integration of the μ-SLS process into roll-to-roll printed electronics.

Figure 18:
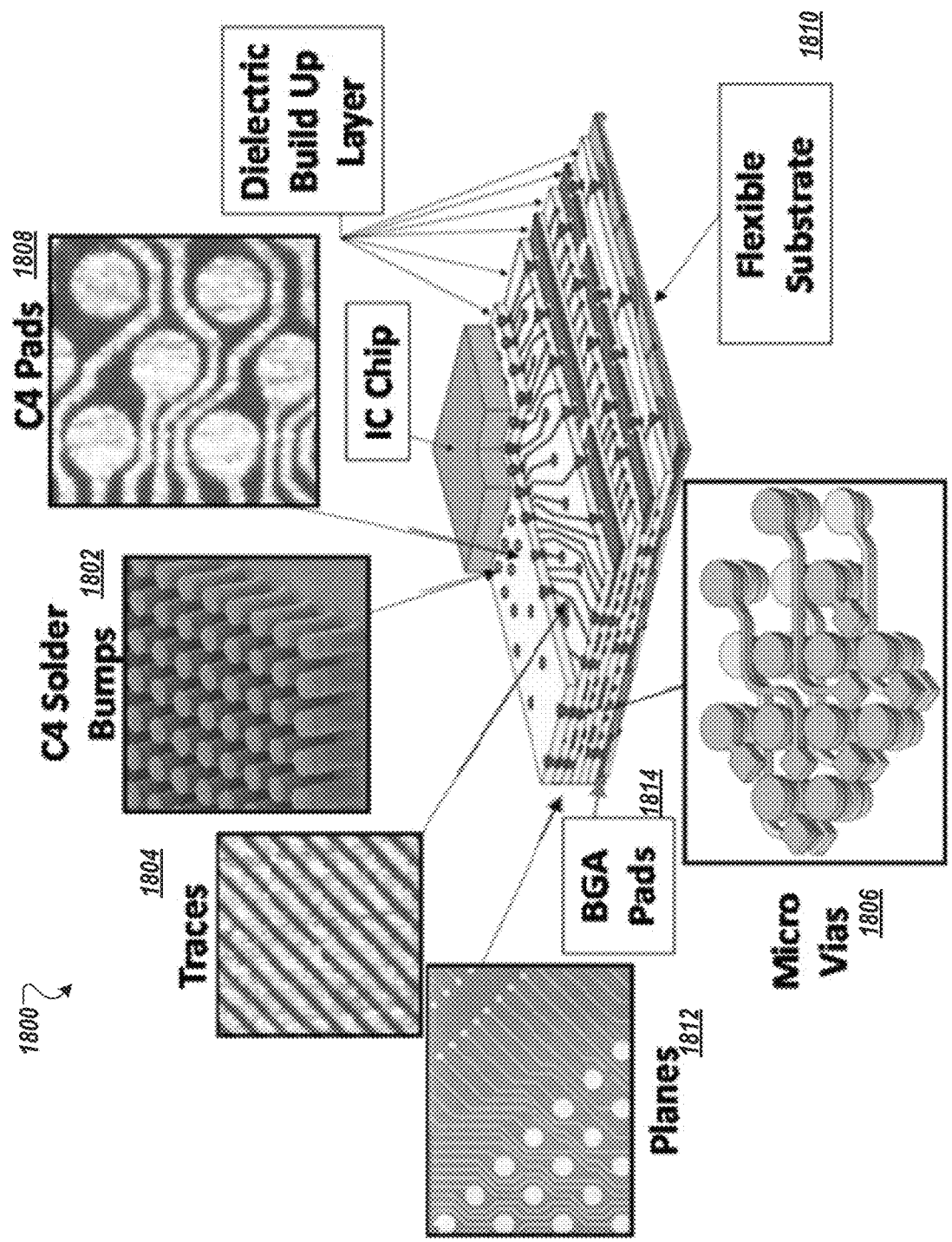
FIG. 18 is a diagram of an exemplary flexible-substrate micro-selective laser sintering system in accordance with an illustrative embodiment.

FIG. 18 is a diagram of a 3D, multilayer structure 1800 associated with high-quality flexible hybrid electronics (FHEs) that can be fabricated using μ-SLS 100 in accordance with an illustrative embodiment. The 3D, multilayer structure 1800 may include copper pillar bumps 1802 for use with flip chip assembly. These copper pillar bumps 1802, in some embodiments, have high aspect ratios (>2:1), small diameters (<5 μm), pillar pitches (<20 μm), near net-shape, and can be placed at any locations on a flexible substrate. As further shown in FIG. 18, the 3D, multilayer structure 1800, in some embodiments, includes printing of IC packaging building blocks such as (1) conducting traces/wires (1804), (2) inter-layer vias (1806), (3) wire bond finger pads, (4) controlled collapse chip connection (C4) bump pads (1808), (5) ball grid array (BGA) pads (1814), (6) power and ground planes (1812), (7) flip chip C4 pillar bumps (1802), (8) antennas, and (9) passive components directly on flexible substrates, among other things. These process capabilities of μ-SLS can be used to replace, or augment, semi-additive copper plating/chemical mechanical polishing (CMP) process typically employed to build up IC package substrate redistribution layers. This is important because these plating and CMP steps are difficult to perform on flexible substrates. In addition to building the network of conductive interconnecting layers, μ-SLS can also be used to form electrical connections between the sintered terminals of the conductive traces and the interconnection pads on IC chips. The μ-SLS process, therefore, has the potential to revolutionize the entire backend assembly process for flexible hybrid electronics.

Because most microscale additive manufacturing processes currently available either have difficulty producing true 3D structures (e.g., electro-hydrodynamic jet printing, direct ink writing), work only in polymers (e.g., 2-photon lithography, interference lithography), or are to slow to be used in high volume manufacturing processes (e.g., electrochemical deposition) they are incompatible with the flexible hybrid electronics packaging application.

Flexible-Substrate Micro-Selective Laser Sintering (FS μ-SLS) System

Figure 19A:
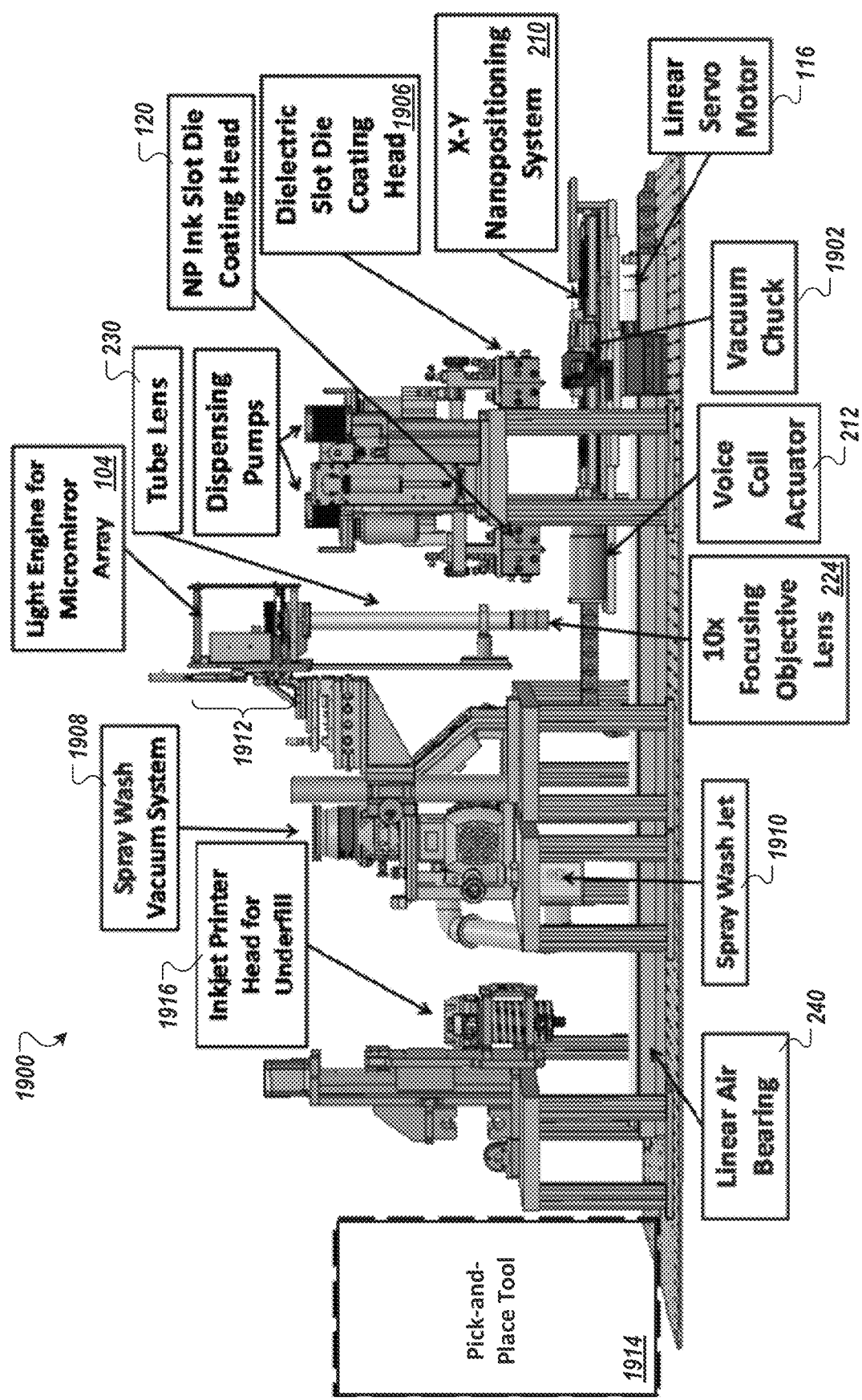
FIGS. 19A and 19B are diagrams of an exemplary flexible-substrate micro-selective laser sintering (FS μ-SLS) system in accordance with an illustrative embodiment.
Figure 19B:
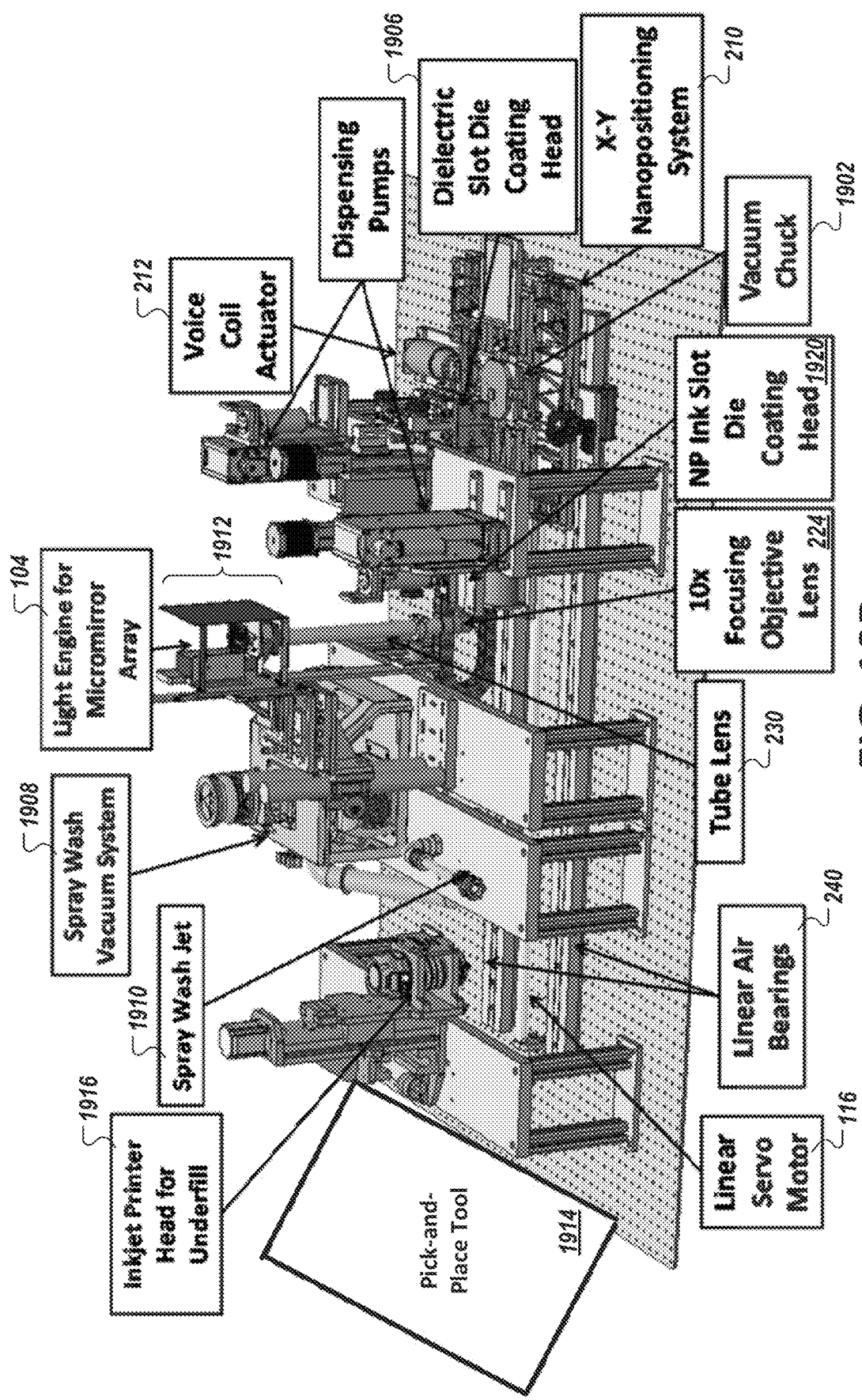

FIGS. 19A and 19B are diagrams of an exemplary flexible-substrate micro-selective laser sintering (FS μ-SLS) system 1900 in accordance with an illustrative embodiment. Specifically, FIG. 19A shows a view of the flexible-substrate micro-selective laser sintering (FS μ-SLS) system 1900 from the side view, and FIG. 19B shows a view of the same from a perspective view. As shown in FIGS. 19A and 19B, the FS μ-SLS system 1900 includes components, as described in relation to FIGS. 1, 2A, and 2B, including:

the spreader mechanism 102 configured to generate the powder bed (shown as "NP Ink Slot Die Coating Head" 120);

the optical system 104 configured to write features into the powder bed (the system shown having a "Light Engine for Micromirror Array" 104, "Tube Lens" 230, and "10x Focusing Objective Lens" 224);

the ultrafast laser system 106 configured to sinter the particles (not shown—see FIGS. 1, 2a, and 2b);

the positioning system 108 configured to move (shown as the linear positioning system with the "Linear Air Bearing" 240 that is coupled to the "Linear Servo Motor" 116) and position (shown as the "X-Y Nano-positioning System" 210 that is coupled to the "Voice-Coil Actuator" 212) a build stage 112 between the optical system 104 and the spreader mechanism 102; and the vacuum and vibration isolation systems 110 (not shown—see FIG. 1) configured to reduce outside influences that could damage the part quality.

Porous Vacuum Chuck

Referring still to FIGS. 19A and 19B, the FS μ-SLS system 1900 further includes a porous vacuum chuck 1902. The porous vacuum chuck 1902 is configured to rigidly fixture a flexible substrate 1810 (not shown—see FIG. 18) onto which a plurality of sintered layers are successively producible, in a layer-by-layer manner, to form the three-dimensional workpiece. In some embodiments, the porous vacuum chuck 1902 includes, or is coupled to, a heating element configured to heat the porous vacuum chuck 1902. To this end, the vacuum chuck 1902 can rigidly attach the flexible substrate 1810 to the nanopositioning system 210 while drying the nanoparticle inks dispensed, or coated, thereon to produce a powder bed for sintering.

FIGS. 20A and 20B are diagrams of a heated vacuum chuck 1902 in accordance with an illustrative embodiment. As shown in FIGS. 20A and 20B, the vacuum chuck 1902 includes a vacuum channel to hold the silicon wafer in place and uses Kapton film heaters to heat the substrate up to the desired temperature. Four ball plungers, in some embodiments, are used to hold the heated plate of the chuck in order to minimize heat transfer to the rest of the μ-SLS system and to minimize the chuck warpage due to heating. Overall, the total chuck warpage due to heating, in some embodiments, has been measured to be less than 1 μm which is well within tolerance for both the optical and slot die coating subsystems in the flexible hybrid electronics application.

In some embodiments, the electromagnetic linear actuator system of the positioning system 108 is used to move the vacuum chuck 1902 to a position proximal to (e.g., under) the slot die coater head (e.g., 120) and air bearings 240 are used to guide the motion and ensure that a smooth, uniform coating layer is produced. The linear actuator 116 is then used to position the stage 112 under the optical system 104 for sintering. The flexure based nano-positioning system is used to precisely step the powder bed between each sintering operation. In other embodiments, the linear guide system could be used with, or substituted by, a roll-to-roll system with multiple deposition/write heads (e.g., to further increase throughput).

In some embodiments, the porous chuck is made of sintered stainless steel. As shown in FIGS. 20A and 20B, in some embodiments, vacuum chuck 1902 is configured to handle 300 mm by 300 mm substrates to provide print area to sheets of about 900 cm$^2$ for large scale flexible electronics applications. In order to accommodate this print area, the slot die coating heads is made 320 mm wide. The outcome of this design can provide a total potential print area to sheets of about 900 cm$^2$ for flexible electronics applications. Other sizes may be used.

Figure 21:
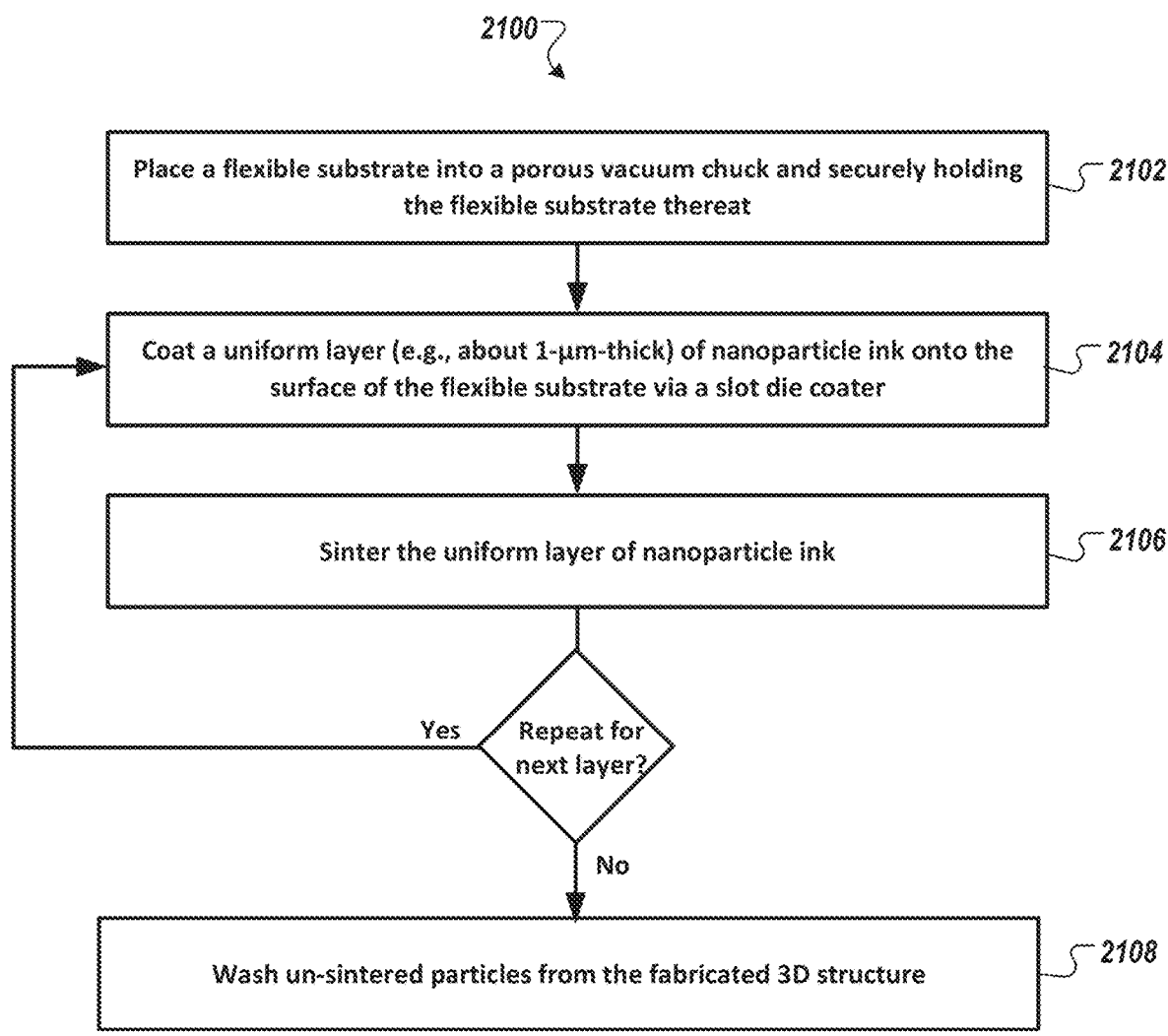
FIG. 21 is a diagram of an example method to additively fabricate a three-dimensional part on, or with, a flexible substrate 1810, in accordance with an illustrative embodiment.

FIG. 21 is a diagram of an example method to additively fabricate a three-dimensional part on, or with, a flexible substrate 1810, in accordance with an illustrative embodiment. FIG. 19 is now discussed in conjunction with FIG. 21. The method 2100 includes placing (2102) a flexible substrate 1810 into the porous vacuum chuck 1902 of the system 1900 and securely holding the flexible substrate 1810 therewith. The slot die coater 120 then coats (2104) a uniform layer (e.g., about 1-μm-thick) of nanoparticle ink onto the surface of the flexible substrate 1810. The substrate 1810 is then moved under the optical system 224 where the nanosecond laser 106 sinters (2106) the dispensed nanoparticle ink in a desired pattern. The pattern is created using the digital micro-mirror device (DMD) array 228 which is focused, in some embodiments, through a tube lens 230 and a 10x-objective 224 that focuses each mirror in the DMD array down (e.g., 7.6 μm by 7.6 μm mirror) to its diffraction limit (~950 nm). The use of a nanosecond laser, in some embodiments, facilitates fine localized control of heat within the sintering system that confines the sintering area to be approximately the same size as the laser spot size while also facilitating fabrication of patterns on a wide verity of substrates including, for example, polymers, dielectrics, ceramics, metals, etc., without damaging the underlying substrate. To facilitate large area patterning, in some embodiments, two or more DMD patterns are stitched together by moving the vacuum chuck 1902 under the objective lens 224 using a two-axis nano-positioning system 210. Once the nanoparticle layer is patterned, the vacuum chuck 1902, in some embodiments, is moved back under the slot die coating system 102 and a new layer of nanoparticle ink is deposited on top of the existing nanoparticle layer. The sintering process can then be repeated to pattern this new layer of nanoparticles and to electrically and/or mechanically connect the new layer to the existing sintered patterns on the previous layer. The process can be repeated layer-by-layer to build up a 3D metal interconnect structure where the un-sintered nanoparticles act as supports for the 3D structures. Finally, after the 3D structure is complete, the un-sintered nanoparticles can be washed away (2108), leaving only the final sintered 3D structures (e.g., 1800) on the flexible substrate 1810.

Referring back to FIGS. 19A and 19B, the system 1900 includes a dielectric material processing system 1906 that includes a second slot die coating head and a flash lamp (shown as "Dielectric Slot Die Coating Head" 1906) that facilitates deposition/curing of large areas of dielectrics for the processing of multilayer structures having dielectric layers therein. In some embodiments, the dielectric material processing system facilitates the addition of a uniform layer of dielectric material between the patterned metal layers on a flexible substrate 1810. In some embodiments, dielectric material is selected from the group consisting of polyimide, silicon nitride, silicon carbide, silicon dioxide (silica), a combination thereof, and etc.

Referring still to FIGS. 19A and 19B, the FS μ-SLS system 1900 includes a spray wash station 1908 (shown as ""Spray Wash Vacuum System" 1908 and "Spray Wash Jet" 1910) configured to remove and recycle un-sintered inks from the substrate once the fabrication of each 3D metal structure is complete. Example details of the spray wash station is described, for example, in Zenou, M., et al., "Laser sintering of copper nanoparticles," J. Phys. D Appl. Phys, 27, p. 025501 (2014), which is incorporated by reference herein in its entirety. Nanoparticle recovery facilitates the reduction in the overall operating cost of the system, making this technology cost competitive with packaging technologies used for flip chip assembly on rigid substrates.

Referring still to FIGS. 19A and 19B, the FS μ-SLS system 1900 includes a metrology systems to facilitate for real-time monitoring and control of the μ-SLS process. A beam splitter is inserted into an optical column 1912 of the μ-SLS system 1900 to deflect magnified light from the sintering surface onto a charged coupled device (CCD) and a thermal camera, which monitors both the spatial resolution and temperature profile of the sintered surface for real-time process control. In the slot die coating system (e.g., 120 and 1906), the system 1900 includes one or more laser height gauges configured to measure the thickness and uniformity of the deposited nanoparticle/dielectric layer during the deposition process. The system 1900 includes flow sensors/controllers in the fluid handling system of the slot die coater (e.g., 120 and 1906) that controls the nanoparticle ink and dielectric layer deposition thickness and uniformity. In some embodiments, the system 1900 includes a pick-and-place system 1914 for the flip chip assembly of silicon-based electrical components onto flexible substrates 1810. In some embodiments, registration between the patterned features on the substrate and the pick-and-place tool 1914 includes patterning alignment marks on the flexible substrate 1810 when fabricating the 3D part. By being able to print alignment marks with micron level resolution on the flexible substrates 1810 (which are rigidly attached to the vacuum chuck), the pick-and-place system 1914 can achieve, in some embodiments, ±5 μm resolution using commercially available pick-and-place vision systems. The system 1900, in some embodiments, includes an interferometry-based feedback control system for the voice coils and flexures in the nanopositioner as well as for the linear servo motor and air bearings in the long travel linear guide system. This feedback can provide, within the patterned features on the substrate, sub-5 nm alignment within a given layer and a layer-to-layer alignment that is better than 10 nm.

Referring still to FIGS. 19A and 19B, the system 1900 includes an underfill inkjet printing head system (shown as "Inkjet Printer Head for Underfill" 1916). In some embodiments, once the silicon die are assembled on the flexible substrate 1810, the system 1900 underfills the flexible substrate 1810 by depositing underfill material using the inkjet printing head 1916. This underfill is then cured and the μ-SLS printed solder bumps is reflowed to establish good electrical connections between the assembled die and the substrate. Finally, a UV-curable encapsulation epoxy is coated onto the flexible substrate 1810 using the dielectric slot die coating head 1906 and is selectively cured using the DMD array 104 to encapsulate the assembled silicon die. Excess encapsulation material, in some embodiments, is removed using the spray wash system (e.g., 1908 and 1910). In their combination, this multi-process integration tool based on μ-SLS facilitates flexible hybrid electronics (FHE) manufacturing by enabling the direct write of multi-layer, 3D interconnect structures with feature sizes down to ~1 μm that is compatible with flip chip assembly and encapsulation of high I/O pin count silicon dies onto flexible substrates 1810.

Multi-Material Process Integration

Figure 22:
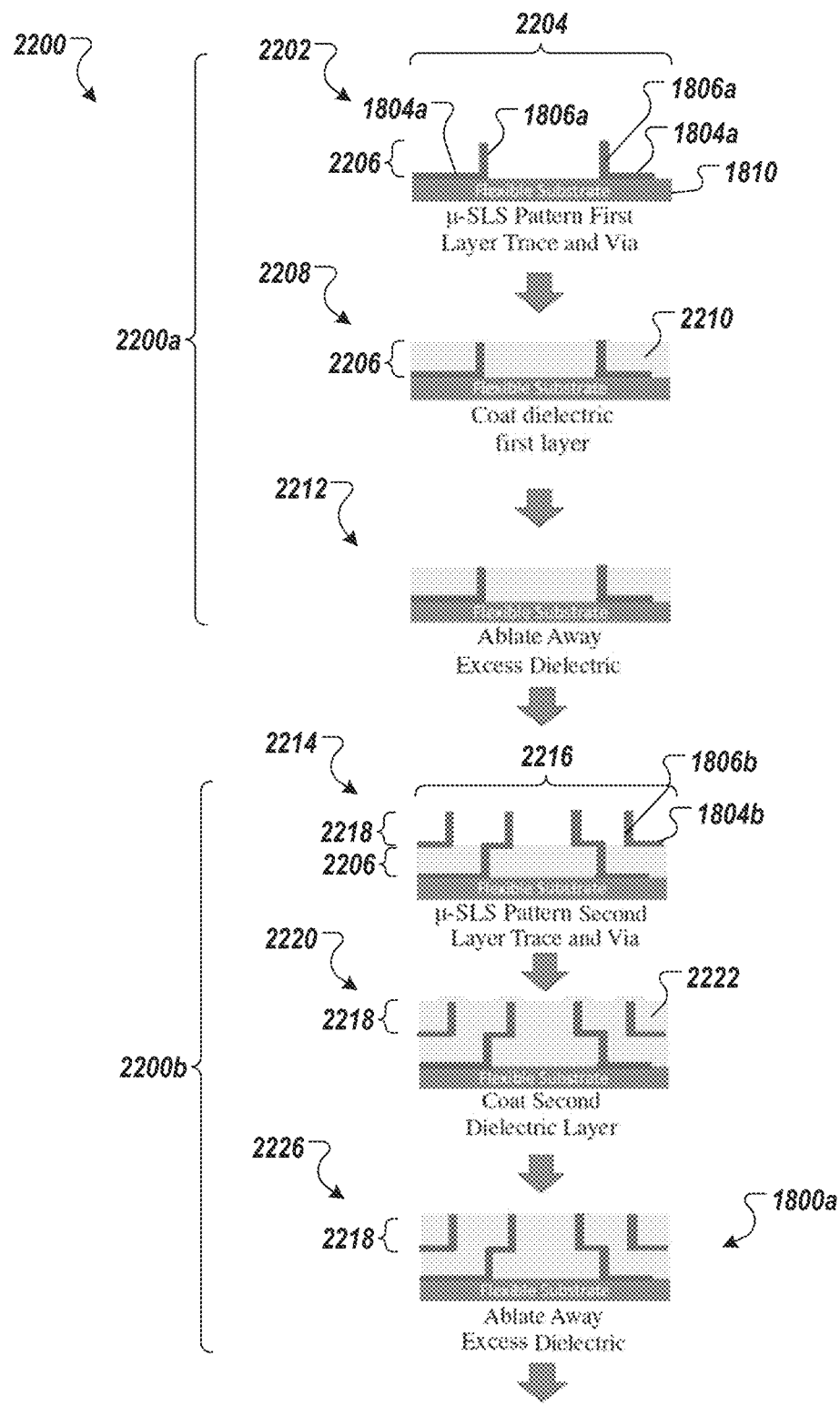
FIG. 22 shows an example multi-material deposition and flip chip assembly process, in accordance with an illustrative embodiment.
Figure 22:
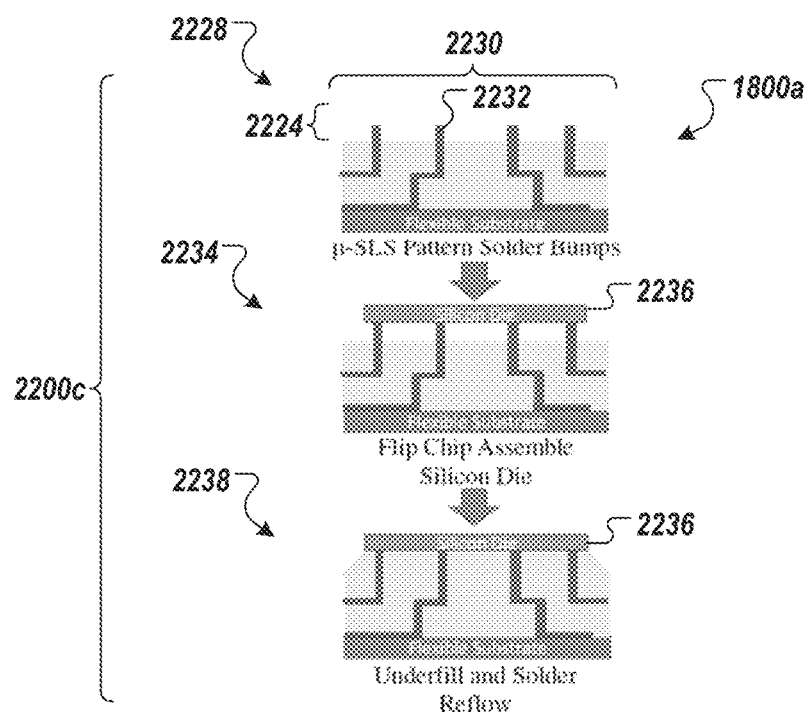

FIG. 22 shows an example multi-material deposition and flip chip assembly process, in accordance with an illustrative embodiment. A second slot die coating head 1906, for example, as described in relation to FIGS. 19A and 19B, facilitates deposition of dielectric materials as well as the nanoparticle inks.

To form multilayer interconnects (e.g., 1800), the lateral traces (e.g. 1804) as well as the interconnect vias (e.g., 1806) between the first layer and the second layer are fabricated, in some embodiments, using the exemplified μ-SLS process disclosed herein. Directly printing the vias eliminates the need to fill deep through-hole vias later in the fabrication process. Without wishing to be bound to a particular theory, this is important because it is very difficult to completely fill and sinter for sub-10 μm holes. After the trace/via formation, the unsintered NP inks can be washed away and a UV-curable dielectric layer can be coated over the traces. In FIG. 22, the process 2200 includes forming (shown as process 2200*a*) a first layer 2206 of the interconnect structure (e.g., 1800). Specifically, the process 2200*a* includes, in some embodiments, patterning (step 2202) a pattern 2204 on a first layer 2206 comprising one or more traces 1804 (shown as 1804*a*) and one or more vias 1806 (shown as 1806*a*) on a flexible substrate 1810. The process 2200*a* then includes, in some embodiments, coating (step 2208) dielectric material to form a dielectric layer 2210 in the first layer 2206. The thickness of the dielectric layer, in some embodiments, is set to match the height of the via by changing the coating parameters in the slot die coating system (e.g., the coating parameters may include, but not limited, parameters such as the coating pressure and the speed at which the substrate moves under the slot die coating head). The dielectric layer 2210 is then cured, in some embodiments, using a flood exposure from a UV flash lamp. Other type of curing techniques may be used. The process 2200*a* then includes, in some embodiments, ablation (2212) of excess dielectric material of the formed dielectric layer 2210. The nanosecond pulsed laser (or femtosecond pulsed laser) and the DMD array (e.g., 104) may be used to selectively ablate any dielectric covering the vias (e.g., 1806*a*) to ensure that the tops of those vias (e.g., 1806*a*) are exposed to the next trace layer (e.g., 1804*b*).

The process 2200 then includes forming (shown as process 2200b) a second layer 2018 over the first layer 2206. Specifically, the process 2200b includes, in some embodiments, patterning (step 2214) a second pattern 2216 on a second layer 2018 comprising one or more traces 1804 (shown as 1804b) and one or more vias 1806 (shown as 1806b) on the first layer 2206, for example, as describe in relation to process 2200a. The process 2200b then includes, in some embodiments, coating (step 2220) dielectric material to form a dielectric layer 2222 in the second layer 2218, for example, as described in relation to process 2200a. The process 2200b then includes, in some embodiments, ablation (2226) of excess dielectric material of the formed dielectric layer 2224, for example, as described in relation to processor 2200a. This process may be repeated to build up any number of layers in the interconnect package. Both the stepper system and the long distance travel system use feedback from interferometric sensors to achieve sub-nanometer resolutions and sub-5 nm repeatabilities.

This allows the exemplified FS μ-SLS system to achieve sub-10 nm overlay accuracies between layers which is better than is required for multilayer interconnect structures. The multilayer fabrication process can be finished with either the formation of bond pads for chips that have already been solder bumped or with the creation of custom solder bump patterns on the flexible package for future die assembly.

Referring still to FIG. 22, the process 2200 includes forming (shown as process 2200c) a solder bump layer 2232 over a top layer (herein, shown as the second layer 2218). Specifically, the process 2200c includes, in some embodiments, patterning (step 2228) a solder bump pattern 2230 on the top layer (shown in FIG. 22 as the second layer 2218) comprising one or more solder bumps 2232 to the three-dimensional electronic interconnect (shown as 1800a). The process 2200c then includes, in some embodiments, placing (step 2234) one or more electric circuit dies 2236 (shown as "silicon die" 2236) over the formed solder bumps of the three-dimensional electronic interconnect (e.g., 1800a) to form a flip chip assembly. The solder bump pattern 2230 is coincident with the pads or pins of each individual electric circuit die 2236. The process 2200c then includes, in some embodiments, causing the solder bumps 2232 to flow (2238) (e.g., via heating) so as to connect the individual electric circuit die 2236 to the three-dimensional electronic interconnect (shown as 1800a).

In some embodiments, an inkjet printer head (e.g., 1916) is used to selectively deposit underfill material around the silicon chips. The inkjet printer (e.g., 1916), in some embodiments, is configured print dams around the silicon chips or dies to contain the flow of the underfill material. The underfill, in some embodiments, is cured using a combination of the heated substrate and an external IR heat lamp.

Die Encapsulation Using FS μ-SLS System

Figure 23:
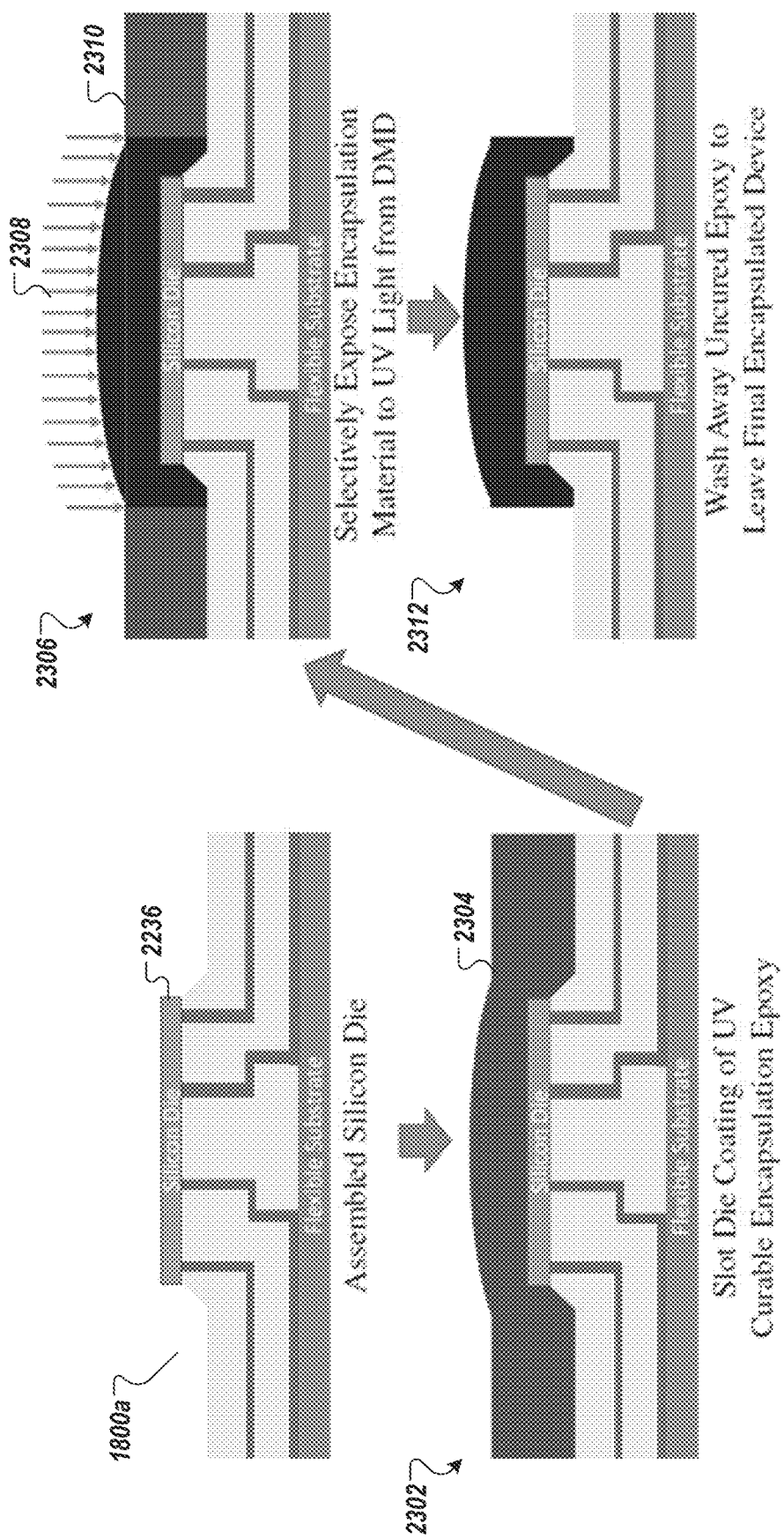
FIG. 23 shows an example die encapsulation process of an assembled die shown in FIG. 22 (e.g., the connected electric circuit die connected to the three-dimensional electronic interconnect), in accordance with an illustrative embodiment.

FIG. 23 shows an example die encapsulation process of an assembled die shown in FIG. 22 (e.g., the connected electric circuit die 2236 connected to the three-dimensional electronic interconnect (e.g., 1800a), in accordance with an illustrative embodiment.

After the silicon chips or dies have been assembled onto the flexible substrates, in some embodiments, they are encapsulated to protect the die from the outside environment. In the FS μ-SLS system, this is accomplished using a slot die system to coat (step 2302) the entire substrate with a UV curable encapsulation epoxy 2304 and then selectively exposing (step 2306) the epoxy to UV light (shown as 2308) using the DMD array.

In some embodiments, the slot die coating is performed using the same head (e.g., 1906) as the dielectric deposition (e.g., because the higher viscosity of the encapsulation material should allow much thicker layers of the encapsulation material to be deposited than were deposited for the dielectric using similar processing conditions). Between the dielectric and encapsulation material depositions, the slot die head, in some embodiments, is flushed with solvent to clean out the head. In some embodiments, typical layer thicknesses for the encapsulation layer is 100's of microns, e.g., sufficient to cover the thinned silicon die (5-75 μm thick). Exposing the encapsulation material to UV light using the DMD allow for very precise control over the exposure area. This helps ensure that the encapsulated area is as small as possible which is critical, in some embodiments, for keeping the final FHE devices as flexible as possible. To expose the encapsulation epoxy material to the UV light, an optical switch, in some embodiments, is used to switch the light going to the DMD between the nanosecond pulsed laser (or femtosecond laser) and a UV laser source.

Referring still to FIG. 23, after selective exposure (e.g., 2306) to the UV light 2308, the uncured epoxy 2310 is developed (2312) in the wash station (e.g., 1908) of the FS μ-SLS tool. In some embodiments, valves are used to direct the waste to a second waster container different than that is used to collect nanoparticles for the nanoparticle recycling.

It is contemplated that additional processing may be performed without departing from the spirit of the disclosure.

Metrology System Integration in the FS μ-SLS System

Figure 24:
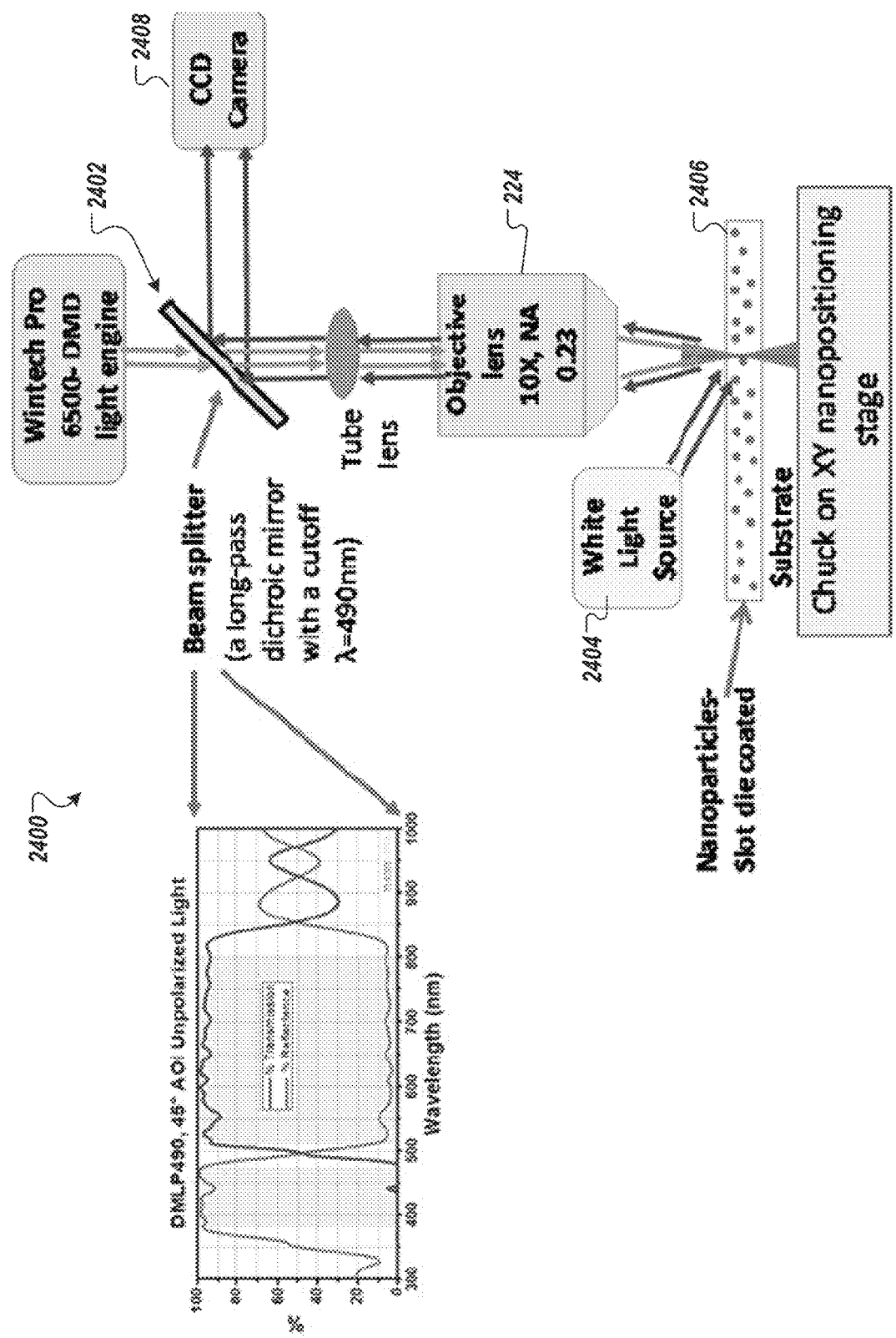
FIG. 24 is a schematic of a metrology system configured to monitor sintering process in real-time, in accordance with an illustrative embodiment.

In another aspect, the exemplified FS μ-SLS system facilitates real-time monitoring and control of the μ-SLS process. FIG. 24 is a schematic of a metrology system 2400 configured to monitor sintering process in real-time, in accordance with an illustrative embodiment. In some embodiments and as shown in FIG. 24, to watch the sintering of the powder bed in real-time, a beam splitter 2402 is placed into the optical column of the μ-SLS system to deflect magnified light 2404 from the sintering surface 2406 onto a charged coupled device (CCD) or a thermal camera (shown as "CCD Camera" 2408). The metrology system 2400 facilitates the monitoring of both the spatial resolution and temperature profile of the sintered surface for real-time process control.

In some embodiments, to measure the thickness and uniformity of the deposited nanoparticle/dielectric layer during the deposition process, laser height gauges are used in the slot die coating system.

In some embodiments, flow sensors/controllers are used in the fluid handling system of the slot die coater to control the nanoparticle ink and dielectric layer deposition thickness/uniformity.

The metrology systems implemented, in some embodiments, is used to measure the process inputs and correlate them to the measured output part quality in order to determine the sources of variance in the μ-SLS process under real manufacturing conditions.

Process Optimization

Process optimization may be performed for the slot die coating system, the dielectric curing system, and the laser sintering system, among others. In some embodiments, parameters such as coating pressure, viscosity, die clearance, and substrate velocity effect the coating thickness/uniformity are considered in the optimization of the slot die coating system. In some embodiments, the fluence and layer thickness effect curing time as well as the threshold power required for the nanosecond laser to ablate the excess dielectric away from the interlayer vias in the multilayer fabrication process are considered in the optimization of the dielectric curing system. In some embodiments, the pulse time, pulse energy, repetition rate, and number of pulses from the nanosecond laser effect the sintering extent and sintering depth in the NP powder bed are considered in the optimization of the laser sintering system.

Nanoparticle Recycling

In another aspect, the exemplified µ-SLS system facilitates and FS µ-SLS system facilitate the reused of unused nanoparticles by washing dispensed, unsintered nanoparticles off the substrate/workpiece and turn them back into useable inks in order to reduce the cost of the µ-SLS process. In some embodiments, to facilitate repeatable and inexpensive reuse of the nanoparticles, the wash-off process uses a solvent that leave the desired sintered tracks intact and undamaged while removing all of the un-sintered nanoparticles. in some embodiments, a spray nozzle is used to remove the nanoparticle from the substrate and a vacuum-based recovery system is used to retrieve the nanoparticle solutions off the substrate and into a reservoir. In some embodiments, the collected material is processed to produce new nanoparticle inks. In some embodiments, measurement of the physical and electrical properties of the retained sintered parts are performed to ensure that these parts were not damaged by the spray wash process. These measurements may be used to determine the maximum spray pressure that can be used for the nanoparticle removal.

Figure 25:
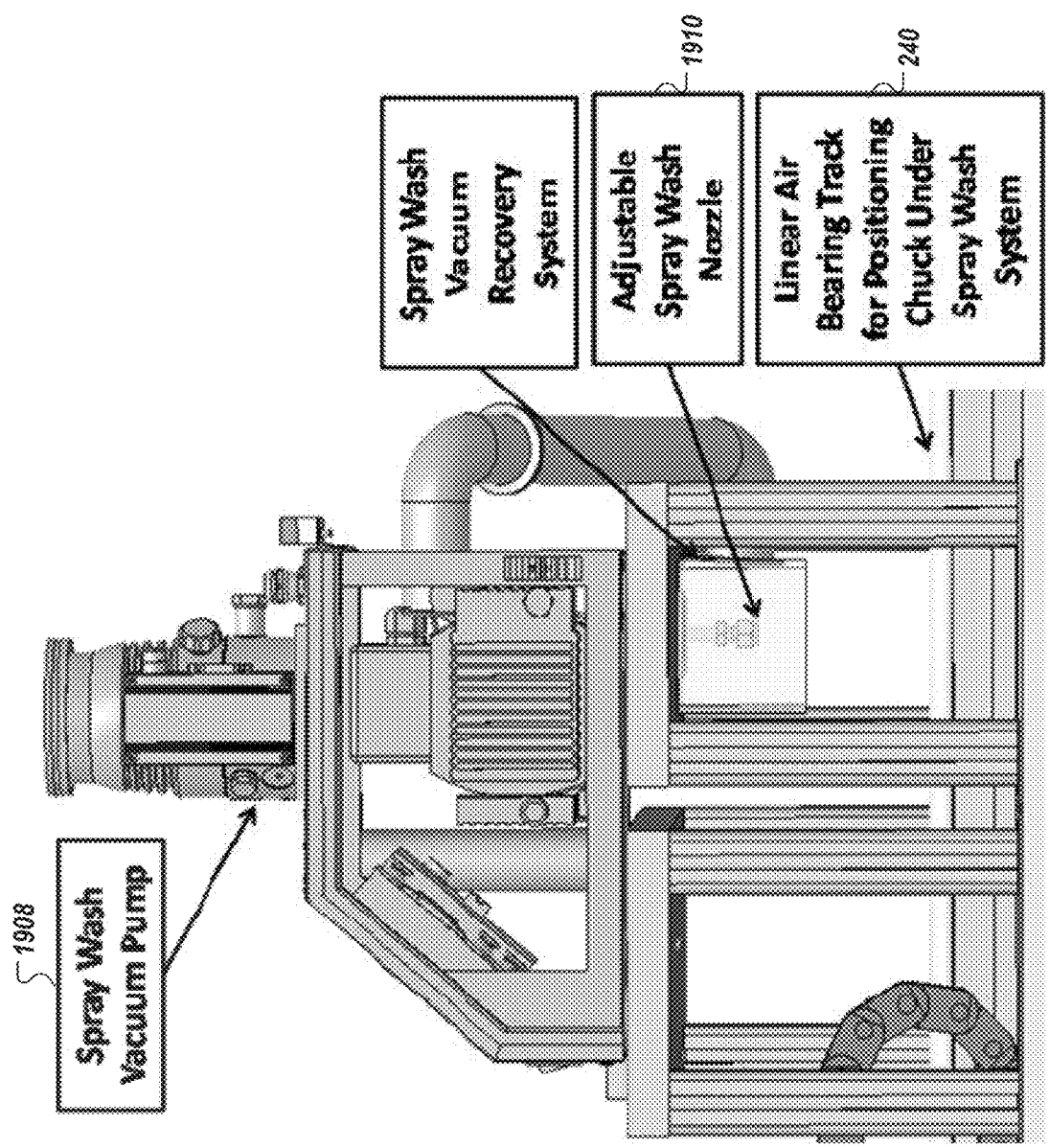
FIG. 25 is a schematic of a spray wash system, in accordance with an illustrative embodiment. Selection of a suitable wash solvent is also critical for the nanoparticle recycling process.

FIG. 25 is a schematic of a spray wash system, in accordance with an illustrative embodiment. Selection of a suitable wash solvent is also critical for the nanoparticle recycling process.

In some embodiments, the solvent is selected for the easy removal of the un-sintered ink and is separable from the un-sintered, polymer-coated Nano-particles to facilitate its recycling and reuse. In some embodiments, the solvent is isolated from the nanoparticles by evaporation. In some embodiments, the solvent is isolated from the nanoparticles by precipitation. In some embodiments, the solvent is isolated from the nanoparticles by combination of evaporation and precipitation.

In some embodiments, if the solvent is to be separated by evaporation, then it must be volatile enough to easily evaporate, but not so volatile that it is an inhalation hazard in the manufacturing environment. If the nanoparticles can be easily precipitated, then volatility is much less of an issue. In some embodiments, the selected solvent is selected to leave enough of the polymer coating on the nanoparticles intact to prevent oxidation. Once the particles are isolated, they are assayed, in some embodiments, to determine how much residual polymer and solvent is retained. In some embodiments, the isolated particles are examined for oxidation.

To reconstruct the NP ink, in some embodiments, the particles are treated to remove any oxidation and additional polymer dispersant/protectant are added back. In some embodiments, milling or height sheer mixing of the particles with the appropriate solvents is performed to disperse the particles. The reconstituted ink, in some embodiments, are tested to ensure its coating and sintering characteristics.

Integration of Pick-and-Place Technologies and Flip Chip Assembly

In another aspect, a flip chip assembly process implemented with the FS µ-SLS system. In the flip chip assembly process, the flexible substrate is held rigidly in place using a porous vacuum chuck which allows silicon chips or dies to be mounted to the flexible substrate using traditional pick-and-place methods. Alignment of the silicon chips or dies to the features printed on the flexible substrate is performed using the µ-SLS tool to directly print alignment marks onto the substrate. In some embodiments, by printing alignment marks with micron level resolution onto the flexible substrate, the alignment of pick-and-place system can achieve better than +/−5 µm using standard pick-and-place vision systems.

After the silicon chips or dies have been placed on the flexible substrate, an inkjet printer head, in some embodiments, is used to selectively deposit underfill material around the silicon chips. A benefit of the additive manufacturing process for developing interconnect structures (e.g., 1800) is the ability to print dams around the silicon chips or dies to contain the flow of the underfill material and ensure that the material only flows under the silicon chips and not out to the rest of the substrate. The underfill material removes, or helps to reduce, the minimum spacing between die. The underfill, in some embodiments, is cured using a combination of the heated substrate and an external IR heat lamp.

Discussion

Assembly of silicon die on flexible substrates is an important problem in flexible hybrid electronics (FHE) since it is the most direct way to incorporate the superior functionality of silicon-based electronics into a flexible package. However, integration of high-quality, functional silicon die with large numbers of inputs and outputs into flexible hybrid electronics requires the ability to fabricate multilayer interconnect structures with micron level accuracy and sub-100 nm level feature overlay which is not possible using current manufacturing techniques. In the semiconductor industry, these multilayer interconnect structures are fabricated using multiple rounds of lithography, electroplating, and chemical mechanical polishing (CMP). Both the electroplating and CMP steps are difficult to perform on flexible substrates and are generally not compatible with roll-to-roll (R2R) processing. Another option to form these multilayer interconnect structures is through the use of additive manufacturing. Unfortunately, current commercially available metal additive manufacturing tools either have feature-size resolutions of greater than 100 which is too large to precisely produce interconnect structures, or can only produce two dimensional structures for printed electronics applications. By improving the minimum feature-size resolution of metal additively manufactured parts by up to two orders of magnitude while still maintaining the part complexity and the throughput provided by traditional additive manufacturing processes, the exemplified microscale selective laser sintering (µ-SLS) process can be used for the semiconductor manufacturing industry and the flexible electronics industry.

Direct write of multilayer, microscale, 3D metal interconnect structures on flexible substrates is beneficial for the next generation of high quality FHEs where flip chip assembly of thinned silicon die will be required to meet the desired functionality demands of the FHEs. Currently there are several methods available for the direct write of microscale features the most popular of which are: (1) Vat photopolymerization processes such as stereolithography, (2) Material jetting processes such as inkjet printing, screen printing, or aerosol jetting, and (3) Material extrusion processes such as fused deposition modeling or robocasting. In vat photopolymerization, light is used to cure a polymer resin layer-by-layer. This allows very small microscale features to be fabricated in 3D structures but is generally limited to only polymeric materials so this process alone and is currently practiced is not well suited for microelectronics applications. In material jetting, a printer head is used to lay down a layer of material onto a surface. This material can be a polymer, dielectric, or metal nanoparticle ink—which are commonly used in the fabrication of 2D printed electronic structures. However, it is very difficult to build up high aspect ratio structures using material jetting due to the flowability and lack of support structures in material jetting. Therefore, material jetting alone and is currently practiced is not well suited for manufacturing the 3D multilayer electronic structures required for integration of high I/O pin count silicon dies into FHEs. In materials extrusion processes, a thermoplastic polymer or viscus ink is extruded through a nozzle onto a platform and the nozzle traces out the cross-section of the part layer-by-layer to build up a 3D part. However, it is very difficult to buildup microscale, 3D metal parts using this method alone and in its current practice due to materials and flowability issues. A differentiator of the exemplified FS μ-SLS process is the ability to write multilayer, 3D interconnect structures with microscale feature sizes at high speeds on flexible substrates. This enables the flip chips assembly of high I/O pin count microelectronic and MEMS chips into flexible electronic structures.

Similarly, the in-situ metrology, statistical process control, process optimization, and reliability testing, in some embodiments, are all necessary to ensure that the μ-SLS system is capable of producing high quality parts in a true manufacturing environment. The nanoparticle recycling tool is necessary, in some embodiments, to clean the surface between material deposition steps and to make the process cost effective in volume manufacturing. Finally, the integration of pick-and-place technology is necessary, in some embodiments, in order to be able to incorporate high I/O count silicon die into flexible hybrid electronic devices.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

Various embodiments of the disclosure may include one or more special purpose computers, systems, and/or particular machines that facilitate the receipt, processing, and/or output of analog and/or digital data. A special purpose computer or particular machine may include a wide variety of different software modules and/or computer-implemented or computer-executable instructions in various aspects. As explained in greater detail below, in certain aspects, these various software components may be utilized to facilitate the operation of an IO circuit and/or the processing of received analog or digital data.

REFERENCES

[1] Gibson, I., Rosen, D., and Stucker, B., 2015, Additive Manufacturing Technologies, Springer New York.
[2] Frazier, W. E., 2014, "Metal additive manufacturing: A review," J. Mater. Eng. Perform., 23(June), pp. 1917-1928.
[3] Wendy Gu, X., and Greer, J. R., 2015, "Ultra-strong architected Cu meso-lattices," Extrem. Mech. Lett., 2, pp. 7-14.
[4] Olakanmi, E. O., Cochrane, R. F., and Dalgarno, K. W., 2015, "A review on selective laser sintering/melting (SLS/SLM) of aluminium alloy powders: Processing, microstructure, and properties," Prog. Mater. Sci., 74, pp. 401-477.
[5] Yuan, M., Bourell, D., and Diller, T., 2011, "Thermal Conductivity Measurments of Polyamide 12," Lab. Free. Fabr., (1), pp. 427-437.
[6] Roy, N. K., Yuksel, A., and Cullinan, M. A., 2015, "μ-SLS of Metals: Physical and thermal characterization of Cu-nanopowders," Solid Freeform Fabrication Conference, pp. 772-788.
[7] Davé, R., Gupta, R., Pfeffer, R., Sundaresan, S., and Tomassone, M. S., 2006, "Deagglomeration and Mixing of Nanoparticles," NSF Nanoscale Science and Engineering Grantees Conference, pp. 4-6.
[8] Roy, N. K., and Cullinan, M. A., 2015, "μ-SLS of Metals: Design of the powder spreader, powder bed actuators and optics for the system," Solid Freeform Fabrication Conference, pp. 134-155.
[9] 2015, DLP5500 DLP 0.55 XGA Series 450 DMD, Texas Instruments.
[10] 2015, DLi CEL5500 Compact Embeddable Light Engine, Digital Light Inovations, Austin, Tex.
[11] 2015, Talon-532-20, Spectra Physics.
[12] 2015, PILine XY Stage System with Controller and Joystick Fields of Application, Physik Instrument.
[13] Moon, K.-S., Dong, H., Maric, R., Pothukuchi, S., Hunt, A., Li, Y., and Wong, C. P., 2005, "Thermal behavior of silver nanoparticles for low-temperature interconnect applications," J. Electron. Mater., 34(2), pp. 168-175.
[14] Kumar, V., 2011, "Simulations and Modeling of Unequal Sized Particles Sintering," University of Utah.
[15] Yuksel, A., and Cullinan, 2015., "Powder Bed Generation for Nanoparticle Thermal Analysis," Solid Freeform Fabrication Conference, Austin, Tex.

ADDITIONAL REFERENCES

[1] Roy, N., and Cullinan, M., 2015, "μ-SLS of Metals: Design of the powder spreader, powder bed actuators and optics for the system," Proceedings of the Solid Free Form Fabrication Symposiom, pp. 134-155.
[2] 2015, "DLP6500FLQ 0.65 1080p MVSP Type A DMD."

[3] Harzic, R. Le, Huot, N., Audouard, E., Jonin, C., Laporte, P., Valette, S., Fraczkiewicz, A., Fortunier, R., Harzic, R. Le, Huot, N., Audouard, E., Jonin, C., and Laporte, P., 2016, "Comparison of heat-affected zones due to nanosecond and femtosecond laser pulses using transmission electronic microscopy Comparison of heat-affected zones due to nanosecond and femtosecond laser pulses using transmission electronic microscopy," Appl. Phys. Lett., 80(21), pp. 3886-3888.

[4] Zenou, M., Ermak, O., Saar, A., and Kotler, Z., 2014, "Laser sintering of copper nanoparticles," J. Phys. D Appl. Phys., 27, p. 025501.

[5] Kähler, J., Heuck, N., Stranz, A., Waag, A., and Peiner, E., 2012, "Pick-and-Place Silver Sintering Die Attach of Small-Area Chips," IEEE Trans. Components, Packag. Manuf. Technol., 2(2), pp. 199-207.

[6] Zhang, Y., Chen, B. K., Liu, X., and Sun, Y., 2010, "Autonomous Robotic Pick-and-Place of Microobjects," IEEE Trans. Robot., 26(1), pp. 200-207.

[7] Angeles, J., 2002, Fundamentals of Robotic Mechanical Systems, Springer.

[8] Nanoscribe, 2015, "Next Generation of 3D Laser Lithography: Photonic Professional GT-Faster Than Ever!"

[9] Seo, J.-H., Park, J. H., Kim, Park, B. J., Ma, Z., Choi, J., and Ju, B.-K., 2014, "Nanopatterning by laser interference lithography: applications to optical devices.," J. Nanosci. Nanotechnol., 14(2), pp. 1521-32.

[10] Edström, K., Brandell, D., Gustafsson, T., and Nyholm, L., 2011, "Electrodeposition as a Tool for 3D Microbattery Fabrication," Interface, (Summer), pp. 41-46.

[11] Sundaram, M. M., Kamaraj, A. B., and Kumar, V. S., 2015, "Mask-Less Electrochemical Additive Manufacturing: A Feasibility Study," J. Manuf. Sci. Eng., 137, p. 021006.

[12] Besra, L., and Liu, M., 2007, "A review on fundamentals and applications of electrophoretic deposition (EPD)," Prog. Mater. Sci., 52(1), pp. 1-61.

[13] Spadaccini, C., Kuntz, J., Duoss, E., and Urbana-champaign, I., 2012, "Additive manufacturing techniques deliver three-dimensional microstructures with previously unobtainable material properties.," Lawrence Livermore Natl. Lab. Sci. Technol. Rev., (March), pp. 14-20.

[14] Lewis, J. a., 2006, "Direct Ink Writing of 3D Functional Materials," Adv. Funct. Mater., 16(17), pp. 2193-2204.

[15] Optomec, 2015, "Aerosol Jet 300 Series systems for Development of Printed Electronics and Biologics."

[16] Park, J.-U., Hardy, M., Kang, S. J., Barton, K., Adair, K., Mukhopadhyay, D. K., Lee, C. Y., Strano, M. S., Alleyne, A. G., Georgiadis, J. G., Ferreira, P. M., and Rogers, J. a, 2007, "High-resolution electrohydrodynamic jet printing.," Nat. Mater., 6(10), pp. 782-9.

[17] Allen, S. D., and Allen, S. D., 1981, "Laser chemical vapor deposition: A technique for selective area deposition Laser chemical vapor deposition: A technique for selective area deposition," J. Appl. Phys., 52, pp. 6501-g505.

[18] Ocola, L. E., Rue, C., and Maas, D., 2014, "High-resolution direct-write patterning using focused ion beams," MRS Bull., 39(April), pp. 336-341.

[19] Roy, N. K., and Cullinan, M. A., 2015, "μ-SLS of Metals: Design of the powder spreader, powder bed actuators and optics for the system," Solid Freeform Fabrication Conference, pp. 134-155.

[20] Roy, N., Yuksel, A., and Cullinan, M., 2016, "DESIGN AND MODELING OF A MICROSCALE SELECTIVE LASER SINTERING SYSTEM," Proceedings of the 11th Manufacturing Science and Engineering Conference MSEC16, Blacksburg, Va.

[21] Spectra Physics, 2016, "Disruptive cost-performance uv and green lasers," pp. 1-5.

[22] Hecht, E., and Zajac, A., 1974, Optics Addison-Wesley.

[23] 2015, DLP5500 DLP 0.55 XGA Series 450 DMD, Texas Instruments.

[24] 2015, DLi CEL5500 Compact Embeddable Light Engine, Digital Light Inovations, Austin, Tex.

[25] Roy, N., Yuksel, A., Higgins, L., Foong, C., and Cullinan, M., 2016, Effect of Size, Morphology, Surface Coating, and Synthesis Methods on the Thermal and Physical Properties of Copper Nanoparticles for Microscale Selective Laser Sintering.

[26] Grant, N. S. F. N., 2006, "Deagglomeration and Mixing of Nanoparticles," pp. 4-6.

[27] Krebs, F. C., and Krebs, F. C., 2016, "Fabrication and Processing of Polymer Solar Cells: A Review of Printing and Coating Techniques coating techniques," (December 2008).

[28] Xu, Q., 2013, "Design and Development of a Compact Flexure-Based XY Precision Positioning System with Centimeter Range," (c), pp. 1-11.

[29] New Way Air Bearings, 2006, "Air Bearing Application and Design Guide," (January).

[30] Attocube, "Attocube Product Catalog 2015 & 2016."

[31] Beaman, J. J., and Deckard, C. R., 1990, "Selective laser Sintering with Assisted Powder handling," p. 4938816.

[32] Cullinan, M., and Roy, N., 2016, "Micro-Selective Sintering Laser System and Method Thereof," p. Provisional Patent No. 62/316,644.

[33] Hurtado, S., Eagan, K., Figueroa, T., and Hughes, B. E., 2014, "Reversing Underrepresentation: The Impact of Undergraduate Research Programs on Enrollment in STEM Graduate Programs," American Educational Research Association.

[34] "Boyer commission on Educating Undergraduates in the Research University, Reinventing undergraduate education: A blueprint for America's research universities."

[35] Horsch, E., St. John, M., and Christensen, R. L., 2012, "A Case of Reform: The Undergraduate Research Collaboratives," J. Coll. Sci. Teach., 41(5).

[36] Cooper, M., 2012, "The case for reform in undergraduate general chemistry curriculum," Chem. Educ., 87, p. 231.

[37] Cullinan, M., Roy, N., and Yuksel, A., 2016, "MODELING OF NANOPARTICLE AGGLOMERATION AND POWDER BED FORMATION IN MICROSCALE SELECTIVE LASER SINTERING SYSTEMS," p. Provisional Patent No. 62/316,666.

[38] Cullinan, M., Roy, N., and Foong, C., 2016, "Microscale Selective Laser Sintering on Flexible Substrates and with Multi-material Capabilities."

[39] nTact, "Slot Die Coating (Extrusion Coating) Technology."

[40] Allied Dies, "Slot Die Coating."

[41] Yao, T.-F., Duenner, A., and Cullinan, M. A., 2015, "In-line, Wafer-Scale Inspection in Nano-Fabrication Systems," ASPE 2015 Annual Meeting, Austin.

[42] Banda, C., Johnson, R. W., Zhang, T., Hou, Z., and Charles, H. K., 2008, "Flip Chip Assembly of Thinned Silicon Die on Flex Substrates," IEEE Trans. Electron. Packag. Manuf, 31(1), pp. 1-8.

What is claimed is:

1. A system for additively producing a three-dimensional workpiece, the system comprising:
   an electromagnetic radiation source configured to coherently and intermittently emit an electromagnetic radiation beam;
   a lens assembly having a plurality of micro-mirrors, collectively, forming a matrixed mirror array, each micro-mirror being configured to selectively direct the emitted electromagnetic radiation beam to a focus point on a sintering plane comprising a layer of particles to form one or a plurality of sintered layers, wherein each sintered layer is successively produced, in a layer-by-layer manner, to form the three-dimensional workpiece;
   a multi-slot die coating assembly comprising two or more slot die coating head, including a first slot die coating head and a second slot die coating head, the first slot die coating head being configured to dispense a solvent having nanoparticles suspended therein onto a fabrication surface on a flexible substrate, and on other sintered layers thereon, such that the nanoparticles settle, upon drying of the solvent, to form a uniform thickness thereof; and
   a spray washing station comprising:
      one or more nozzles through which pressurized solvent is dispensed so as to remove un-sintered ink from the three-dimensional workpiece; and
      a nanoparticle recycling subsystem configured to provide vacuum suction for nanoparticle ink recovery.

2. The system of claim 1, wherein the plurality of micro-mirrors direct the plurality of emitted electromagnetic radiation beams onto an area spanning a maximum cross-sectional profile of the three-dimensional workpiece.

3. The system of claim 1, comprising:
   a build stage; and
   a positioning system configured to movably position the build stage i) to a first position proximal to the electromagnetic radiation beam generated by an optical sintering system comprising the electromagnetic radiation source and the lens assembly and ii) to a second position proximal to the multi-slot die coating assembly.

4. The system of claim 3, wherein the build stage comprises a heating element.

5. The system of claim 4, wherein the positioning system comprises:
   a nanopositioner coupled to the build stage and configured to moveably position the build stage within ±100 nm of the first position.

6. The system of claim 5, wherein the nanopositioner comprises an X-axis flexure nanopositioner and a Y-axis flexure nanopositioner, each flexure nanopositioner being coupled to a voice coil that, when energized, moves to elastically deform a flexure body of the flexure nanopositioner in a respective direction.

7. The system of claim 1, wherein, the electromagnetic radiation source is configured to emit the electromagnetic radiation beam at an energy level $E_n$, wherein $$E_n = \frac{\rho * \pi * \frac{D^2}{4} * h * [C_p * (T_i - T_f)]}{n * (1 - R)}$$

wherein $\rho$ is a powder density, CP is a specific heat of the nanoparticle, $T_i$ is an initial temperature of the powder bed, $T_f$ is a sintering temperature, R is a reflectivity of the powders, D is a spot size, h is a thickness of the layer of nanoparticles, and $\alpha$ is an effective power retention factor of the optical elements.

8. The system of claim 1, comprising:
   a second matrixed mirror array, the second matrixed mirror array comprising a second plurality of micro-mirrors, each configured to selectively direct the emitted electromagnetic radiation beam to the focus point on the sintering plane comprising the layer of particles.

9. The system of claim 1, wherein the lens assembly comprises a focusing objective, the focusing objective receiving the selectively directed electromagnetic radiation beam from the matrixed mirror array and focusing the plurality of selectively directed electromagnetic radiation beams to a plurality of respective focus points on the sintering plane.

10. The system of claim 9, wherein the focusing objective is configured to focus each of the plurality of selectively directed electromagnetic radiation beams to the respective focus points with a spot size of about 1 μm.

11. The system of claim 1, wherein the lens assembly comprises an ultra-wide-angle optics, the ultra-wide-angle optics receiving the electromagnetic radiation beam from the electromagnetic radiation source or an intermediary optic therewith, the ultra-wide-angle optics being configured to expand the electromagnetic radiation beam across each, or a substantial portion, of the plurality of micro-mirrors.

12. The system of claim 1, comprising:
   a low-pressure atmospheric chamber that encases the system; and
   a pump coupled to the low-pressure atmospheric chamber.

13. The system of claim 12, comprising:
   one or more metrology devices coupled to the chamber, the metrology device being selected from the group consisting of a high-speed infrared camera and a near-field scanning optical microscope.

14. The system of claim 1, comprising:
   a controller, the controller having a processor and a memory, the memory having instructions stored thereon, wherein, when executed by the processor, cause the processor to:
      receive a computer-aid-design (CAD) file, the CAD file having geometric description of a tangible object; and
      direct generation of the three-dimensional workpiece based on the geometric description of the CAD file.

15. The system of claim 3, comprising:
   a laser interferometry system, the laser interferometry system being configured to produce a control signal to substantially align the build stage to the sintering plane.

16. A system of claim 1, comprising:
   a porous vacuum chuck configured to rigidly fixture the flexible substrate onto which the plurality of sintered layers are successively producible, in a layer-by-layer manner, to form the three-dimensional workpiece.

17. The system of claim 1, wherein the multi-slot die coating assembly includes:
   an instrument configured to interrogate a fabricated layer and measure one or more thicknesses and one or more uniformity parameter associated with the fabricated layer.

18. The system of claim 1, wherein the multi-slot die coating assembly comprises a first set of one or more flow sensors associated with the first slot die coating head and a second set of one or more flow sensors associated with the second slot die coating header.

19. The system of claim 1, comprising:
an image capture apparatus configured to capture a first spectrum of an electromagnetic radiation observable at, or near, a region on a fabricated layer associated with the fabrication surface;
an infrared sensor configured to capture a second spectrum of the electromagnetic radiation observable at the region; and
a beam splitter located between i) the image capture apparatus and the infrared sensor and ii) a focusing lens of the system such that the image capture apparatus and the infrared sensor contemporaneously capture a spatial resolution and a temperature profile of the region.

20. The system of claim 1, comprising:
an actuated assembly configured to actuate a chip onto a surface of the three-dimensional workpiece or onto a region of the flexible substrate coupled to the three-dimensional workpiece and wherein the system comprises a linear guide system configured to move, at least, between a first position associated with the actuated assembly and a second position associated with the multi-slot die coating assembly.

21. A method of additively producing a three-dimensional workpiece in a layer-by-layer basis, the method comprising:
for each layer of a workpiece formed from a plurality of sintered layers:
producing a layer of nanoparticles powder on a top surface of a workpiece via a multi-slot die coating assembly a multi-slot die coating assembly comprising two or more slot die coating head, including a first slot die coating head configured to dispense a solvent having nanoparticles suspended therein onto a fabrication surface on a flexible substrate, and on other sintered layers thereon, such that the nanoparticles settle, upon drying of the solvent, to form a uniform thickness thereof;
positioning the workpiece having the layer of nanoparticle powder placed thereon such that the layer of nanoparticle powder is substantially aligned to a sintering plane;
selectively sintering the layer of nanoparticles powder by directing a plurality of intermittent electromagnetic radiation beams onto the layer of nanoparticles;
removing un-sintered ink from the three-dimensional workpiece via a spray washing station, the spray washing station comprising one or more nozzles through which pressurized solvent is dispensed so as to remove un-sintered ink from the three-dimensional workpiece; and
recovering the un-sintered ink via a nanoparticle recycling subsystem, wherein the nanoparticle recycling subsystem is configured to provide vacuum suction for nanoparticle ink recovery.

22. The method of claim 21, wherein each of the plurality of intermittent electromagnetic radiation beams has a spot size of about 1 μm at each respective focused point on the layer of nanoparticle powder.

23. The method of claim 22, wherein the layer of nanoparticle powder is produced by dispensing a layer of nanoparticles ink comprising the nanoparticle powder mixed or suspended in a solvent.

24. The method of claim 22, comprising:
heating a build stage having a surface in contact with the workpiece to a temperature maintained at less than a melting temperature of one or more of the nanoparticle powders.

25. The method of claim 22, wherein the directed plurality of intermittent electromagnetic radiation beams having an energy level $E_n$, wherein:

$$E_n = \frac{\rho * \pi * \frac{D^2}{4} * h * [C_p * (T_i - T_f)]}{n * (1 - R)}{\alpha}$$

wherein f is a repetition rate, ρ is a powder density, CP is a specific heat of the nanoparticle, $I_f$ is a heat of fusion, $T_i$ is an initial temperature of the powder bed, $T_f$ is a sintering temperature, R is a reflectivity of the powders, D is a spot size, h is a thickness of the layer of nanoparticles, and α is an effective power retention factor of the optical elements.

26. The method of claim 22, wherein the intermittent electromagnetic radiation beams for a given spot is directed to the given spot between about 1 millisecond and about 500 milliseconds, the intermittent electromagnetic radiation beams having a pulse rate of at least 1 KHz.

27. A method of additively fabricating a three-dimensional electronic interconnect on a substrate, the method comprising:
additively forming a plurality of layers on a substrate, including a first layer, wherein the first layer of the plurality of layers is formed by:
(a) selectively sintering a first material with a first pattern comprising traces and vias and removing unsintered first material to form a first patterned structure in a first layer;
(b) depositing a second material around the first patterned structure so as to coat the first layer, wherein the second material is deposited using a multi-slot die coating assembly comprising two or more slot die coating head, including a first slot die coating head configured to dispense a solvent having nanoparticles suspended therein onto a fabrication surface on a flexible substrate, and on other sintered layers thereon, such that the nanoparticles settle, upon drying of the solvent, to form a uniform thickness thereof; and
(c) removing excess deposited second material outside the first layer via a spray washing station, wherein the spray washing station comprises (i) one or more nozzles through which pressurized solvent is dispensed so as to remove un-sintered ink from the three-dimensional workpiece and (ii) a nanoparticle recycling subsystem configured to provide vacuum suction for nanoparticle ink recovery; and
additively forming a second layer, and subsequent layers, of the plurality of layers on the first layer, wherein the second layer, and the subsequent layers, are formed by the operation (a)-(c).

28. The method of claim 27, further comprising:
additively forming a solder bump layer on a portion of the three-dimensional electronic interconnect by selectively sintering a third material with a solder bump pattern and removing unsintered third material to form a solder bump patterned structure over the three-dimensional electronic interconnect.

29. The method of claim 27, further comprising:
placing an electric circuit die on a portion of the formed solder bump patterned structure; and
causing the formed solder bump patterned structure to reflow so as to underfill the electric circuit die thereby connecting the electric circuit die to the three-dimensional electronic interconnect.

30. The method of claim 29, further comprising:
encapsulating, in whole, or in part, the electric circuit die with a fourth material to form an encapsulated electric circuit die operatively coupled to the three-dimensional electronic interconnect.

31. The method of claim 27, wherein the encapsulation is performed by:
coating the electric circuit die with the fourth material so as to encapsulate the electric circuit die, wherein the fourth material comprises a curable epoxy;
selectively exposing the encapsulated electric circuit die; and
removing uncured epoxy to provide the encapsulated electric circuit die that is operatively coupled to the three-dimensional electronic interconnect.

* * * * *

UNITED STATES PATENT AND TRADEMARK OFFICE
CERTIFICATE OF CORRECTION

PATENT NO. : 10,722,947 B2  
APPLICATION NO. : 15/475794  
DATED : July 28, 2020  
INVENTOR(S) : Michael A. Cullinan et al.

It is certified that error appears in the above-identified patent and that said Letters Patent is hereby corrected as shown below:

In the Claims

Column 47, Lines 32-33 for Claim 21, "surface of a workpiece via a multi-slot die coating assembly a multi-slot die coating assembly comprising two or more slot die coating head ..." should read "surface of a workpiece via a multi-slot die coating assembly comprising two or more slot die coating head ..."

Signed and Sealed this  
Twentieth Day of October, 2020

Andrei Iancu  
*Director of the United States Patent and Trademark Office*